US012585922B2

(12) United States Patent
Kolavennu et al.

(10) Patent No.: US 12,585,922 B2
(45) Date of Patent: Mar. 24, 2026

(54) AUDITABLE AUTHORSHIP ATTRIBUTION WITH EVENT TRACKING AND MOCK CONTENT

(71) Applicant: U.S. Bank National Association, Minneapolis, MN (US)

(72) Inventors: Soumitri Kolavennu, Minneapolis, MN (US); Raj Bharadwaj, Minneapolis, MN (US); Lavanya Basavaraju, Minneapolis, MN (US); Jayant Chawla, Minneapolis, MN (US); Christopher Ziolkowski, Burnsville, MN (US); Valerie Lancelle, Caledonia, WI (US); Christopher Davis, Minneapolis, MN (US)

(73) Assignee: U.S. Bank National Association, Minneapolis, MN (US)

( * ) Notice: Subject to any disclaimer, the term of this patent is extended or adjusted under 35 U.S.C. 154(b) by 0 days.

(21) Appl. No.: 19/194,225

(22) Filed: Apr. 30, 2025

(65) Prior Publication Data

US 2025/0342351 A1      Nov. 6, 2025

Related U.S. Application Data

(62) Division of application No. 19/036,141, filed on Jan. 24, 2025, now Pat. No. 12,493,775.

(Continued)

(51) Int. Cl.
*G06N 3/00* (2023.01)
*G06F 11/1446* (2026.01)
(Continued)

(52) U.S. Cl.
CPC ....... *G06N 3/0475* (2023.01); *G06F 11/1446* (2013.01); *G06F 16/90344* (2019.01);
(Continued)

(58) Field of Classification Search
CPC .. G06N 3/0475; G06N 20/00; G06F 11/1446; G06F 16/2462; G06F 16/90344; G06F 17/18; G06F 18/22; G06F 30/27
See application file for complete search history.

(56) References Cited

U.S. PATENT DOCUMENTS

| | | | |
|---|---|---|---|
| 6,275,223 B1 | 8/2001 | Hughes | |
| 8,935,745 B2 | 1/2015 | Brock et al. | |

(Continued)

FOREIGN PATENT DOCUMENTS

| | | |
|---|---|---|
| CN | 117435230 | 1/2024 |
| WO | 2018202690 A1 | 11/2018 |

OTHER PUBLICATIONS

International Search Report and Written Opinion issued in PCT/US2025/012747, completed Apr. 3, 2025 and mailed Apr. 23, 2025.

(Continued)

*Primary Examiner* — Diedra McQuitery
(74) *Attorney, Agent, or Firm* — Merchant & Gould. P.C.

(57) ABSTRACT

A content editor or a plugin thereto automatically generates authorship tokens that identify content authored by a human author or an artificial author. The authorship tokens are applied to the work while the work is being produced. Thus, subsequent review of the work can identify regions produced by a human author and other regions produced by an artificial intelligence.

20 Claims, 36 Drawing Sheets

Related U.S. Application Data

(60) Provisional application No. 63/728,202, filed on Dec. 5, 2024, provisional application No. 63/728,212, filed on Dec. 5, 2024, provisional application No. 63/664,959, filed on Jun. 27, 2024, provisional application No. 63/649,673, filed on May 20, 2024, provisional application No. 63/638,815, filed on Apr. 25, 2024, provisional application No. 63/625,601, filed on Jan. 26, 2024.

(51) Int. Cl.

| | |
|---|---|
| *G06F 16/903* | (2019.01) |
| *G06F 30/27* | (2020.01) |
| *G06N 3/0475* | (2023.01) |
| *G06F 16/2458* | (2019.01) |
| *G06F 17/18* | (2006.01) |
| *G06F 18/22* | (2023.01) |
| *G06N 20/00* | (2019.01) |

(52) U.S. Cl.
CPC .......... *G06F 30/27* (2020.01); *G06F 16/2462* (2019.01); *G06F 17/18* (2013.01); *G06F 18/22* (2023.01); *G06N 20/00* (2019.01)

(56) References Cited

U.S. PATENT DOCUMENTS

| | | | | |
|---|---|---|---|---|
| 9,372,850 | B1 | 6/2016 | Takaki et al. | |
| 11,468,232 | B1 | 10/2022 | Rath | |
| 12,111,747 | B1 | 10/2024 | Jain et al. | |
| 2003/0131313 | A1 | 7/2003 | Flanagan | |
| 2004/0085354 | A1 | 5/2004 | Massand | |
| 2008/0021922 | A1 | 1/2008 | Hailpern et al. | |
| 2008/0086718 | A1 | 4/2008 | Bostick et al. | |
| 2010/0299292 | A1 | 11/2010 | Collazo | |
| 2011/0279228 | A1 | 11/2011 | Kumar | |
| 2012/0077176 | A1 | 3/2012 | Foster et al. | |
| 2014/0053135 | A1 | 2/2014 | Bird et al. | |
| 2014/0108531 | A1 | 4/2014 | Klau | |
| 2015/0046346 | A1 | 2/2015 | Juola et al. | |
| 2015/0052427 | A1 | 2/2015 | Vagell et al. | |
| 2015/0100898 | A1 | 4/2015 | Jue | |
| 2016/0034273 | A1 | 2/2016 | Leupold et al. | |
| 2016/0119147 | A1 | 4/2016 | Saidalavi et al. | |
| 2016/0344828 | A1 | 11/2016 | Husler et al. | |
| 2018/0307480 | A1 | 10/2018 | Doyle et al. | |
| 2020/0099513 | A1* | 3/2020 | Angelo | H04L 63/12 |
| 2020/0142545 | A1 | 5/2020 | Wald et al. | |
| 2020/0183818 | A1 | 6/2020 | Guenther et al. | |
| 2020/0342879 | A1 | 10/2020 | Carbune et al. | |
| 2021/0150406 | A1 | 5/2021 | Cheng et al. | |
| 2021/0311729 | A1 | 10/2021 | Gupta et al. | |
| 2021/0390447 | A1 | 12/2021 | Cheruvu et al. | |
| 2021/0406673 | A1 | 12/2021 | Pardeshi et al. | |
| 2022/0012284 | A1 | 1/2022 | Beck et al. | |
| 2022/0138266 | A1 | 5/2022 | Wang et al. | |
| 2022/0237368 | A1 | 7/2022 | Tran | |
| 2023/0062434 | A1* | 3/2023 | Wagner | G06Q 20/405 |
| 2023/0109734 | A1 | 4/2023 | Galle et al. | |
| 2023/0144379 | A1 | 5/2023 | Haikin et al. | |
| 2023/0333821 | A1 | 10/2023 | Cosgrove et al. | |
| 2024/0086262 | A1* | 3/2024 | Kousha | G06F 3/04847 |
| 2024/0184566 | A1 | 6/2024 | Gabel et al. | |
| 2024/0193204 | A1 | 6/2024 | Kuhn et al. | |
| 2024/0248711 | A1 | 7/2024 | Ziolkowski et al. | |
| 2024/0273286 | A1 | 8/2024 | Iu et al. | |
| 2024/0281218 | A1 | 8/2024 | Masad et al. | |
| 2024/0296288 | A1 | 9/2024 | Bitton et al. | |
| 2024/0345837 | A1 | 10/2024 | Ziolkowski et al. | |
| 2024/0371510 | A1* | 11/2024 | Aman | G16H 40/63 |
| 2024/0411528 | A1 | 12/2024 | Ziolkowski et al. | |
| 2025/0061137 | A1 | 2/2025 | Higgins et al. | |
| 2025/0106641 | A1* | 3/2025 | Gurney | H04W 16/02 |
| 2025/0245492 | A1 | 7/2025 | Kolavennu et al. | |
| 2025/0315907 | A1 | 10/2025 | Ziolkowski et al. | |
| 2026/0010772 | A1 | 1/2026 | Kolavennu et al. | |

OTHER PUBLICATIONS

Nayeli, Ellen, "ZeroGPT Review 2023: Is It Legal, Safe, or a Scam?", Aug. 10, 2023, XP093266217, https://web.archive.org/web/2023081012 5148/https://academichelp.net/ai-detectors /zerogpt-review.html [retrieved on Apr. 3, 2025].

Niful, Islam et al., "Distinguishing Human Generated Text from ChatGPT Generated Text Using Machine Learning," arxiv.org, May 1, 2023, XP093266205, https://arxiv.org/pdf/2306.01761 [retrieved on Apr. 3, 2025].

Wittenberg, Chloe et al., Labeling AI-Generated Content: Promises, Perils, and Future Directions (Topical Policy Brief), MIT Schwarzman College of Computing, Nov. 28, 2023; 16 Pages.

Harding, William—GitClear—Coding on Copilot—2023 Data Shows Downward Pressure on Code Quality (150 m lines of analyzed code + projections for 2024); Jan. 16, 2024; 24 Pages.

Copyright Registration Guidance: Works Containing Material Generated by Artificial Intelligence; Federal Register/vol. 88, No. 51/ Thursday, Mar. 16, 2023/Rules and Regulations; 5 Pages.

GitHub Desktop—Simple collaboration from your desktop (Overview/ Release Notes/Help); https://desktop.github.com; Printed Feb. 21, 2024; 4 Pages.

Day, Lewis; HACKADAY—How Do You Prove an AI Didn't Make Your Art?—https://hackaday.com; Nov. 27, 2023; 39 Pages.

Inventorship Guidance for AI-Assisted Inventions; Department of Commerce; Patent and Trademark Office; Federal Register/vol. 89, No. 30/Tuesday, Feb. 13, 2024; 9 Pages.

Black, Jessica; 5 Ways to Reduce GitHub Copilot Security and Legal Risks—FOSSA (https://fossa.com/); Printed Feb. 29, 2024; 6 Pages.

United States Copyright Office (Library of Congress); Review/ Authorship work titled 'Zarya of the Dawn'; Feb. 23, 2023; 29 Pages.

Blake, Alex, This app just got me excited for the future of AI on Macs; https://www.digitaltrends.com/computing/ia-writer-7-chatgpt-dialog-partner/; Dated Dec. 4, 2023; 10 Pages.

Embeddings—Learn how to turn text into numbers, unlocking use cases like search—OpenAI API; https://platform.openai.com/docs/guides/embeddings; Dated Apr. 11, 2024; 15 Pages.

IA Writer 7 (Previous—5 Minutes Read—Next); https://ia.net/topics/ia-writer-7; Dated Nov. 30, 2023, 10 Pages.

IA Writer 7: Whoa, Feedback! (Previous—6 Minutes Read—Next); https://ia.net/topics/ia-writer-7-whoa-feedback; Dated Dec. 8, 2023; 8 Pages.

GitHub—iainc/Markdown-Annotations (Markdown Annotations embed authorship in text while preserving its readability and portability); https://github.com/iainc/Markdown-Annotations; Dated Apr. 15, 2024; 4 Pages.

GitHub—iainc/Markdown-Annotations (Gracefully hid annotation blocks in comments #1); https://github.com/iainc/Markdown-Annotations/issues/1; Dated Apr. 15, 2024; 4 Pages.

GitHub—iainc/Markdown-Annotations (An alternate perspective, if looking for feedback #2); https://github.com/iainc/Markdown-Annotations/issues/2; Dated Apr. 15, 2024; 3 Pages.

GitHub—iainc/Markdown-Annotations (Project name & name of hash annotation key is potentially misleading #3); https://github.com/iainc/Markdown-Annotations/issues/3; Dated Apr. 15, 2024; 2 Pages.

GitHub—iainc/Markdown-Annotations (Hand-editing is problematic #4) https://github.com/iainc/Mardown-Annotations/issues/4; Dated Apr. 15, 2024; 2 Pages.

GitHub—iainc/Markdown-Annotations (YAML front matter #5); https://github.com/iainc/Markdown-Annotations/issues/5; Dated Apr. 15, 2024; 2 Pages.

IA Writer 7/Hacker News (new/past/comments/ask/show/jobs/submit); https://news.ycombinator.com/item?id=38476552; Dated Apr. 15, 2024; 1 Page.

(56) References Cited

OTHER PUBLICATIONS

IA Writer 7/Hacker News (new/past/comments/ask/show/jobs/submit); https://news.ycombinator.com/item?id=38487950; Dated Apr. 15, 2024; 1 Page.

No AI Feature (Previous—7 Minutes Read—Next); https://ia.net/topics/no-feature; Dated Nov. 22, 2023; 10 Pages.

The Verge (Tech/Apps/Artificial Intelligence)—iA Writer can now track what you or ChatGPT wrote—The Verge; https://www.theverge.com/2023/12/1/23983835/ia-writer-generative-ai-authorship; Dated Dec. 1, 2023; 5 Pages.

The Verge (iA Comments); https://www.theverge.com/2023/12/1/23983835/ia-writer-generative-ai-authorship?showComments=1; Dated Dec. 1, 2023; 5 Pages.

Writing With AI (Previous—10 Minutes Read—Next); https://ia.net/topics/writing-with-ai; Dated Nov. 28, 2023; 16 Pages.

Levenshtein Distance (Online calculator: Levenshtein Distance); https://planetcalc.com/1721/; Dated Apr. 18, 2024; 8 Pages.

Ango, Steph, Photoshop for text (The Wayback Machine); https://web.archive.org/web/20231028235855—https://stephango.com/photoshop-for-text; Dated Oct. 18, 2022; 3 Pages.

Song et al. "A Survey of Automatic Generation of Source Code Comments: Algorithms and Techniques", pp. 111411-111428, [Online—Retrieved from Internet on Aug. 24, 2024], <https://ieeexplore.ieee.org/stamp/stamp.jsp?tp=&arnumber=8778714>, (Year: 2019).

Best practices for writing code comments—Stack Overflow—Dec. 23, 2021, 21 Pages, available at https://stackoverflow.blog/2021/12/23/best-practices-for-writing-code-comments/, downloaded Jan. 19, 2024.

Coding and Comment Style: Broad Institute of MIT and Harvard; Jan. 19, 2024; 11 Pages, available at https://mitcommlab.mit.edu/broad/commkit/coding-and-comment-style/, downloaded Jan. 19, 2024.

Califa, Joel—Commit together with co-authors—The GitHub Blog; Jan. 29, 2018;6 Pages, available at https://github.blog/2018-01-29-commit-together-with-co-authors/, downloaded Feb. 21, 2024.

GitClear—A visual guide to Diff Delta—And how fusing commits together reduces tech debt & code review time; 2021; available at https://gitclear-public.s3.us-west-2.amazonaws.com/Diff%2BDelta%2Band%2BCommit%2BGroups.pdf, 26 pages.

Find out who is leaking your secrets with help from invisible zero-width characters (Home/Blog)—Posted on Apr. 5, 2018; 2 Pages, available at https://www.tripwire.com/state-of-security/secrets-invisible-zero-width-characters, downloaded Jan. 19, 2024.

Git blame—ATLASSIAN—Software Development (Tutorial); Jan. 19, 2024, 10 Pages, available at https://www.atlassian.com/git/tutorials/inspecting-a-repository/git-blame, downloaded Jan. 19, 2024.

GNU Global Source Code Tag System (Edition 6.6.11, for GNU Global version 6.6.11; Published by Tama Communications Corporation (Tokyo, Japan); Nov. 20, 2023; 75 Pages, available at https://www.gnu.org/software/global/manual/global.html, downloaded Feb. 29, 2024.

Antony M; How to Prove I was Falsely Accused of Using AI in my Paper; Medium; Jan. 15, 2023; 13 Pages, available at https://medium.com/@antonytips/falsely-accused-of-using-ai-in-paper-5-evidence-to-prove-innocence-229acba310e1, downloaded Feb. 6, 2024.

Vogel, Peter; No Comment: Why Commenting Code Is Still a Bad Idea (practical.net); Jul. 31, 2013; 10 Pages, https://visualstudiomagazine.com/articles/2013/07/26/why-commenting-code-is-still-bad.aspx, downloaded Jan. 19, 2024.

Alemohammad, Sina et al.; Self-Consuming Generative Models Go MAD; arXiv:2307.01850v1! [cd.LG], Jul. 4, 2023; 31 Pages.

Steganography (definition); Wikipedia (The Free Encyclopedia); available at https://en.wikipedia.org/wiki/Stegangraphy, Printed Jan. 19, 2024; 11 Pages.

Tag based programming—Software Engineering Stack Exchange; available at https://softwareengineering.stackexchange/com/questions/322979/tag-based-programming, Printed Feb. 29, 2024; 3 Pages.

Martin, Jeff; The Challenges for License Compliance and Copyright with AI—Mend.io; Dec. 21, 2023; 3 Pages, available at https://mend.io/blog/the-challenges-for-license-compliance-and-copyright-with-ai/, downloaded Mar. 5, 2024.

Santos, Omar et al.; Toward Trustworthy AI: An Analysis of Artificial Intelligence (AI) Bill of Materials (AI BOMS); ResearchGate; available at https://www.researchgate.net/publication/3749213669, Oct. 2023; 7 Pages.

Wyatt, Eric; Typing Insights (Tips.Net); Apr. 22, 2019; 4 Pages, available at https://windows.tips.net/T007883_Typing_Insights.html, downloaded Feb. 29, 2024.

Roush, Allen et al., Most Language Models can be Poets too: An AI Writing Assistant and Constrained Text Generation Studio, Oracle Corporation, Last Accessed Apr. 23, 2024 from https://arxiv.org/abs/2306.15926, 7 Pages.

* cited by examiner

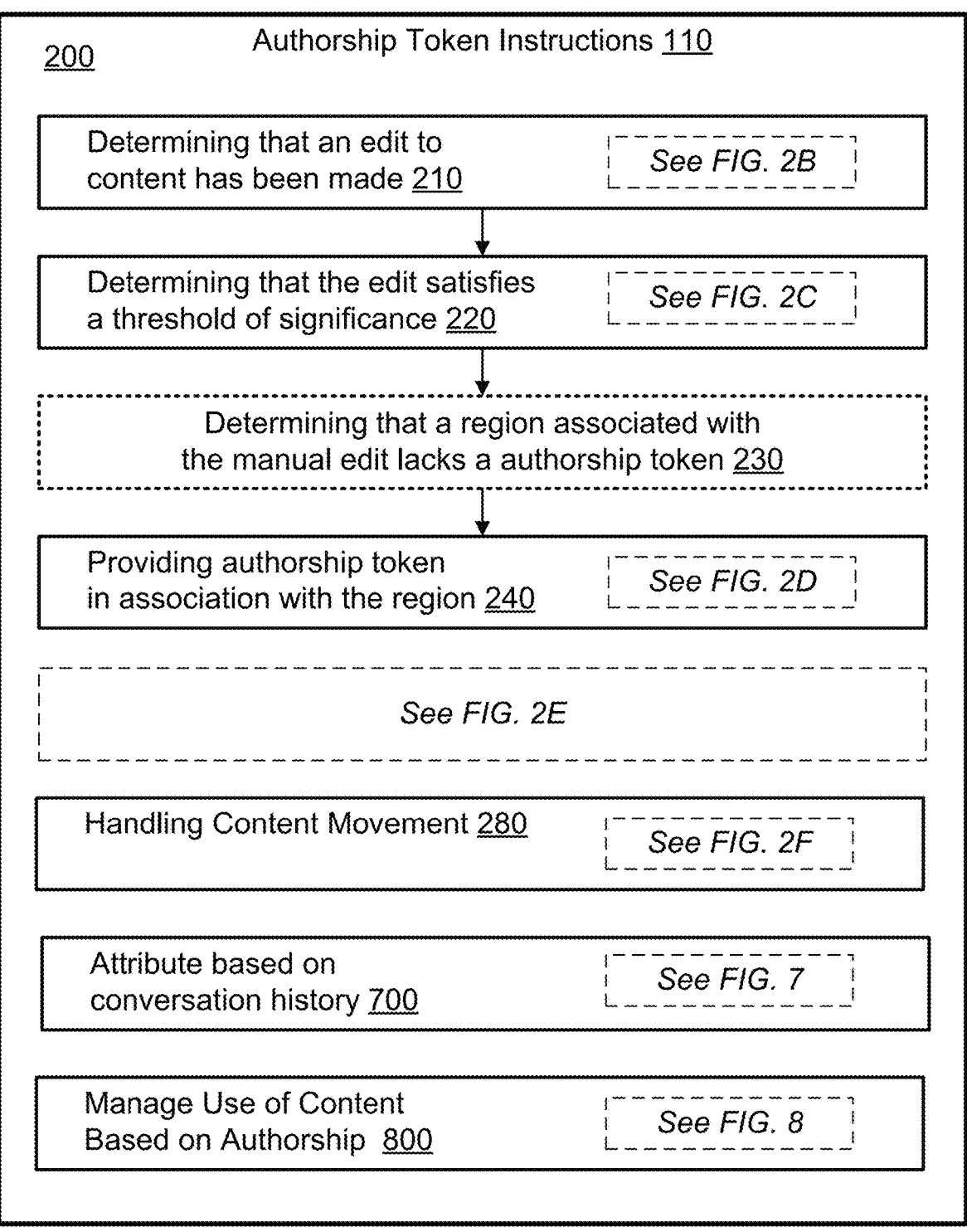

200    Authorship Token Instructions 110

Determining that an edit to content has been made 210    *See FIG. 2B*

Determining that the edit satisfies a threshold of significance 220    *See FIG. 2C*

Determining that a region associated with the manual edit lacks a authorship token 230

Providing authorship token in association with the region 240    *See FIG. 2D*

*See FIG. 2E*

Handling Content Movement 280    *See FIG. 2F*

Attribute based on conversation history 700    *See FIG. 7*

Manage Use of Content Based on Authorship  800    *See FIG. 8*

FIG. 2A

Determining that an edit
to content has been made 210

Receiving modification over
human interface device 212

Determining whether the edit is
characteristic of a manual or artificial edit 214

Determining whether
generative artificial intelligence is active 216

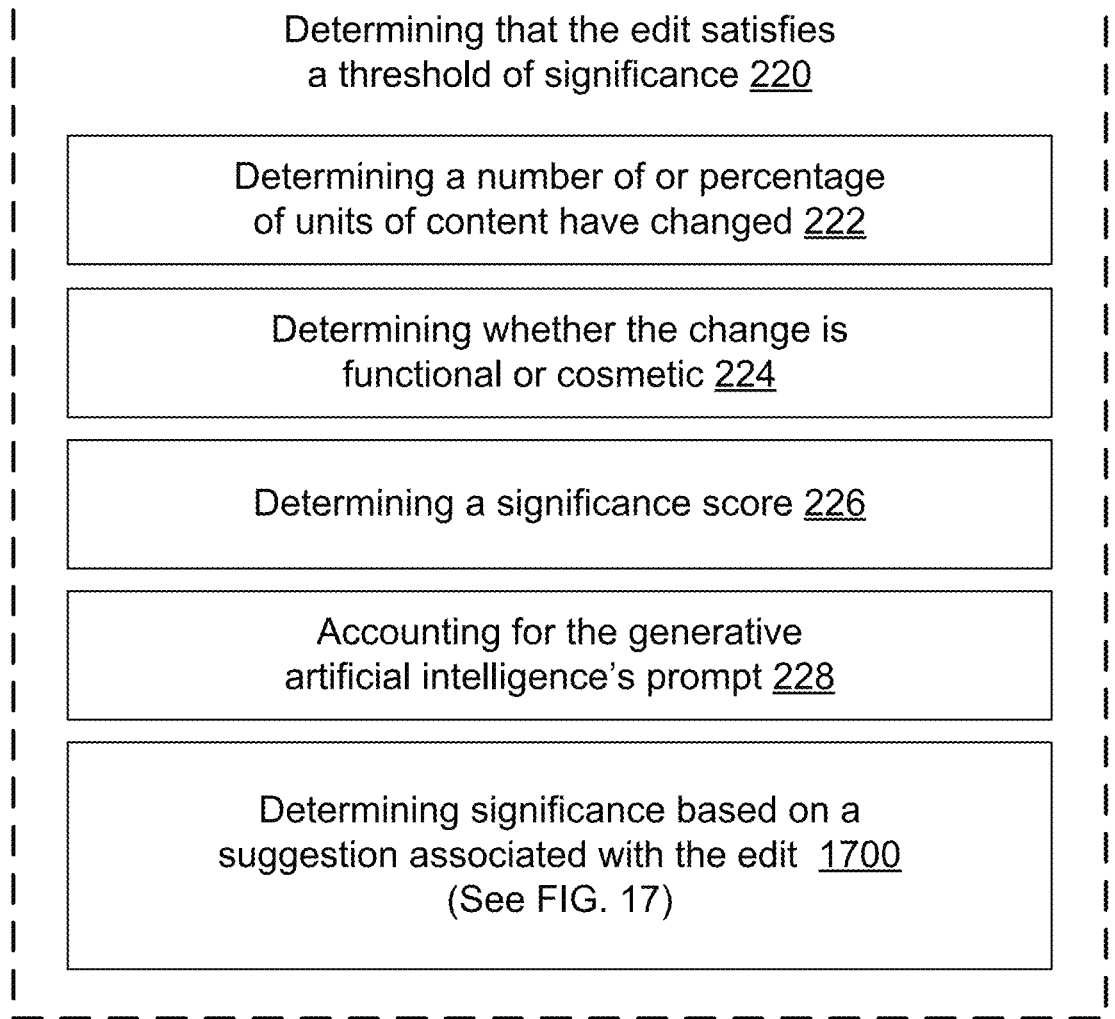

Determining that the edit satisfies
a threshold of significance 220

Determining a number of or percentage
of units of content have changed 222

Determining whether the change is
functional or cosmetic 224

Determining a significance score 226

Accounting for the generative
artificial intelligence's prompt 228

Determining significance based on a
suggestion associated with the edit  1700
(See FIG. 17)

FIG. 2C

Providing authorship token
in association with the region 240

Including a portion of a creative work 242

Including features to resist mimicry 244

Modifying additional regions 246

Adding the authorship token
into a separate file 248

Handling Content Movement 280

Determine Content Export 282

Modify content 284

Export modified content 286

Determine Content Import 292

Modify content 294

Import modified content 296

Figure 7B:
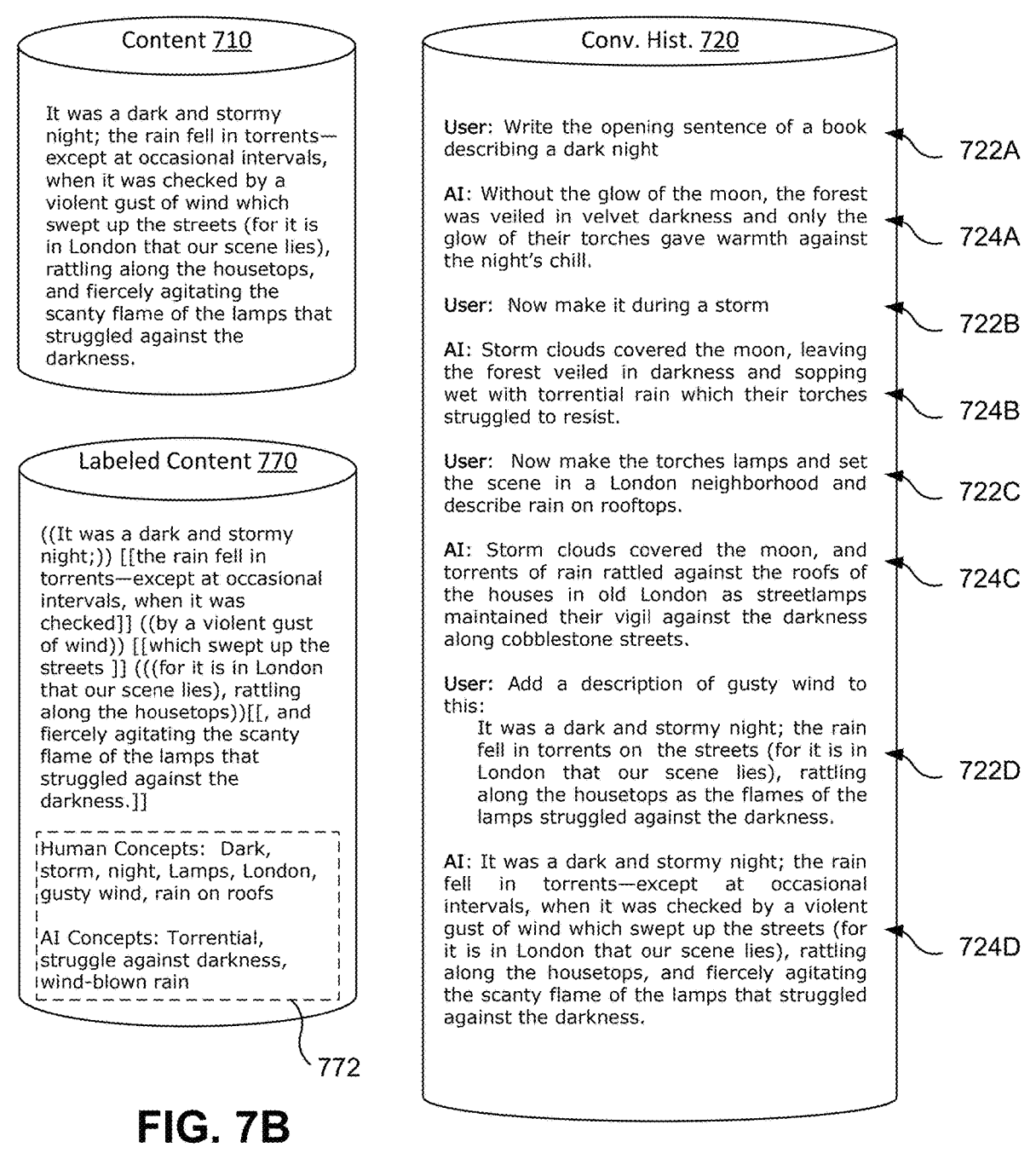

Content 710

It was a dark and stormy night; the rain fell in torrents—except at occasional intervals, when it was checked by a violent gust of wind which swept up the streets (for it is in London that our scene lies), rattling along the housetops, and fiercely agitating the scanty flame of the lamps that struggled against the darkness.

Labeled Content 770

((It was a dark and stormy night;)) [[the rain fell in torrents—except at occasional intervals, when it was checked]] ((by a violent gust of wind)) [[which swept up the streets ]] (((for it is in London that our scene lies), rattling along the housetops))[[, and fiercely agitating the scanty flame of the lamps that struggled against the darkness.]]

Human Concepts: Dark, storm, night, Lamps, London, gusty wind, rain on roofs

AI Concepts: Torrential, struggle against darkness, wind-blown rain

Conv. Hist. 720

User: Write the opening sentence of a book describing a dark night

— 722A

AI: Without the glow of the moon, the forest was veiled in velvet darkness and only the glow of their torches gave warmth against the night's chill.

— 724A

User:  Now make it during a storm

— 722B

AI: Storm clouds covered the moon, leaving the forest veiled in darkness and sopping wet with torrential rain which their torches struggled to resist.

— 724B

User:  Now make the torches lamps and set the scene in a London neighborhood and describe rain on rooftops.

— 722C

AI: Storm clouds covered the moon, and torrents of rain rattled against the roofs of the houses in old London as streetlamps maintained their vigil against the darkness along cobblestone streets.

— 724C

User: Add a description of gusty wind to this:
    It was a dark and stormy night; the rain fell in torrents on  the streets (for it is in London that our scene lies), rattling along the housetops as the flames of the lamps struggled against the darkness.

— 722D

AI: It was a dark and stormy night; the rain fell in torrents—except at occasional intervals, when it was checked by a violent gust of wind which swept up the streets (for it is in London that our scene lies), rattling along the housetops, and fiercely agitating the scanty flame of the lamps that struggled against the darkness.

— 724D

800

Receive content for a purpose 810

Determine whether the content includes authorship information 820

Take an action with respect to the content for the purpose based on the authorship information 830

900

1400

First Content 1602

"Be calm! I entreat you to hear me, before you give vent to your hatred on my devoted head. Have I not suffered enough, that you seek to increase my misery? Life, although it may only be an accumulation of anguish, is dear to me, and I will defend it. Remember, thou hast made me more powerful than thyself; my height is superior to thine; my joints more supple. But I will not be tempted to set myself in opposition to thee. I am thy creature, and I will be even mild and docile to my natural lord and king, if thou wilt also perform thy part, the which thou owest me. Oh, Frankenstein, be not equitable to every other, and trample upon me alone, to whom thy justice, and even thy clemency and affection, is most due. Remember, that I am thy creature; I ought to be thy Adam; but I am rather the fallen angel, whom thou drivest from joy for no misdeed. Every where I see bliss, from which I alone am irrevocably excluded. I was benevolent and good; misery made me a fiend. Make me happy, and I shall again be virtuous."

Second Content 1604

Life is dear. Every where I see bliss. I am happy and virtuous.

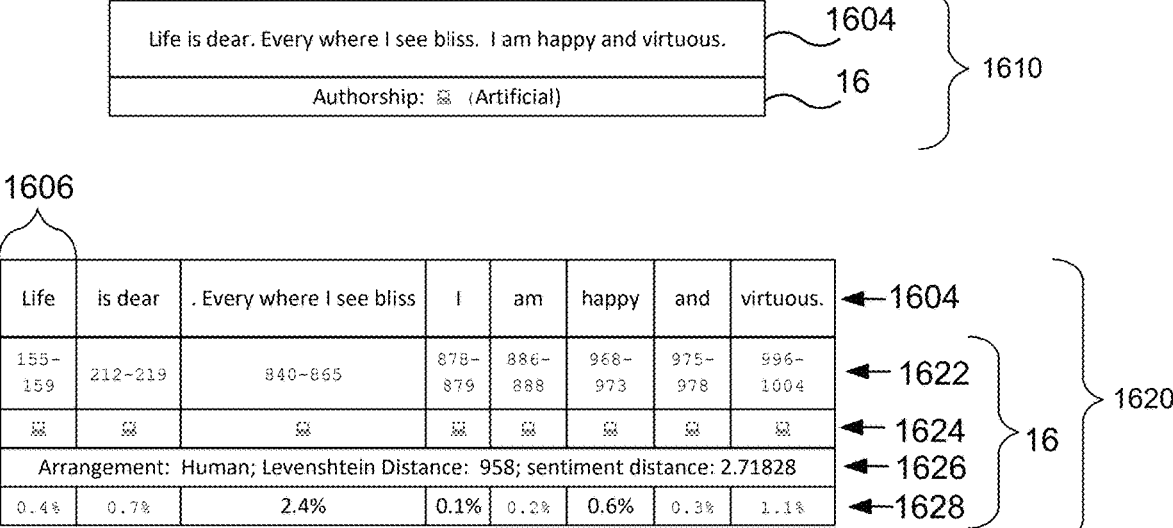

| Life | is dear | . Every where I see bliss | I | am | happy | and | virtuous. | ←1604 |
|------|---------|---------------------------|---|----|-------|-----|-----------|-------|
| 155-159 | 212-219 | 840-865 | 878-879 | 886-888 | 968-973 | 975-978 | 996-1004 | ←1622 |
| ⊠ | ⊠ | ⊠ | ⊠ | ⊠ | ⊠ | ⊠ | ⊠ | ←1624 |
| Arrangement: Human; Levenshtein Distance: 958; sentiment distance: 2.71828 | | | | | | | | ←1626 |
| 0.4% | 0.7% | 2.4% | 0.1% | 0.2% | 0.6% | 0.3% | 1.1% | ←1628 |

Obtain file including authorship tokens 2110

Calculating relative contribution of
human authorship and artificial authorship 2120

Selecting one of a plurality of predefined human-artificial
collaboration styles 2130

Generating a user interface 2140

Generating a report 2150

Submitting the file and the report 2160

2700

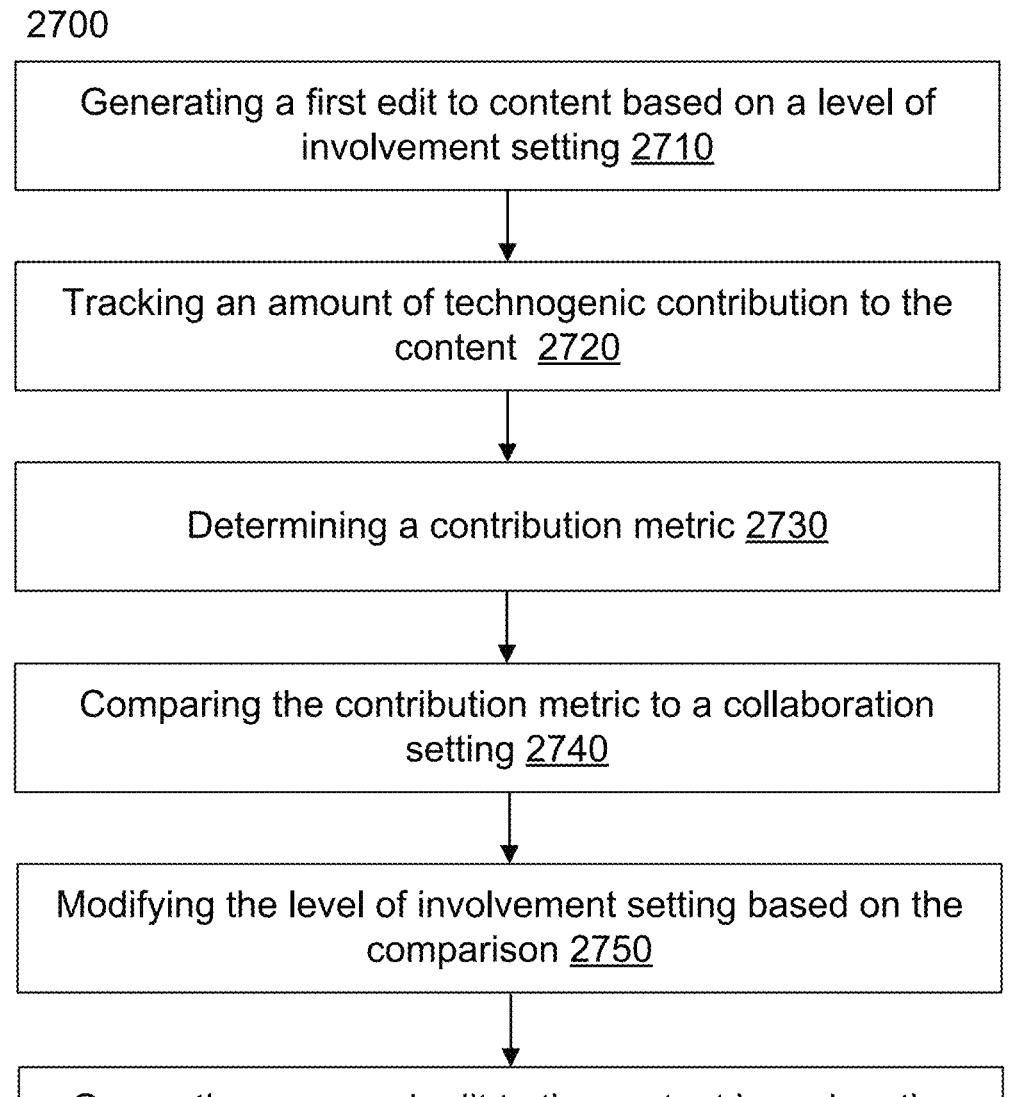

Generating a first edit to content based on a level of involvement setting 2710

Tracking an amount of technogenic contribution to the content 2720

Determining a contribution metric 2730

Comparing the contribution metric to a collaboration setting 2740

Modifying the level of involvement setting based on the comparison 2750

Generating a second edit to the content based on the modified level of involvement setting 2760

FIG. 27

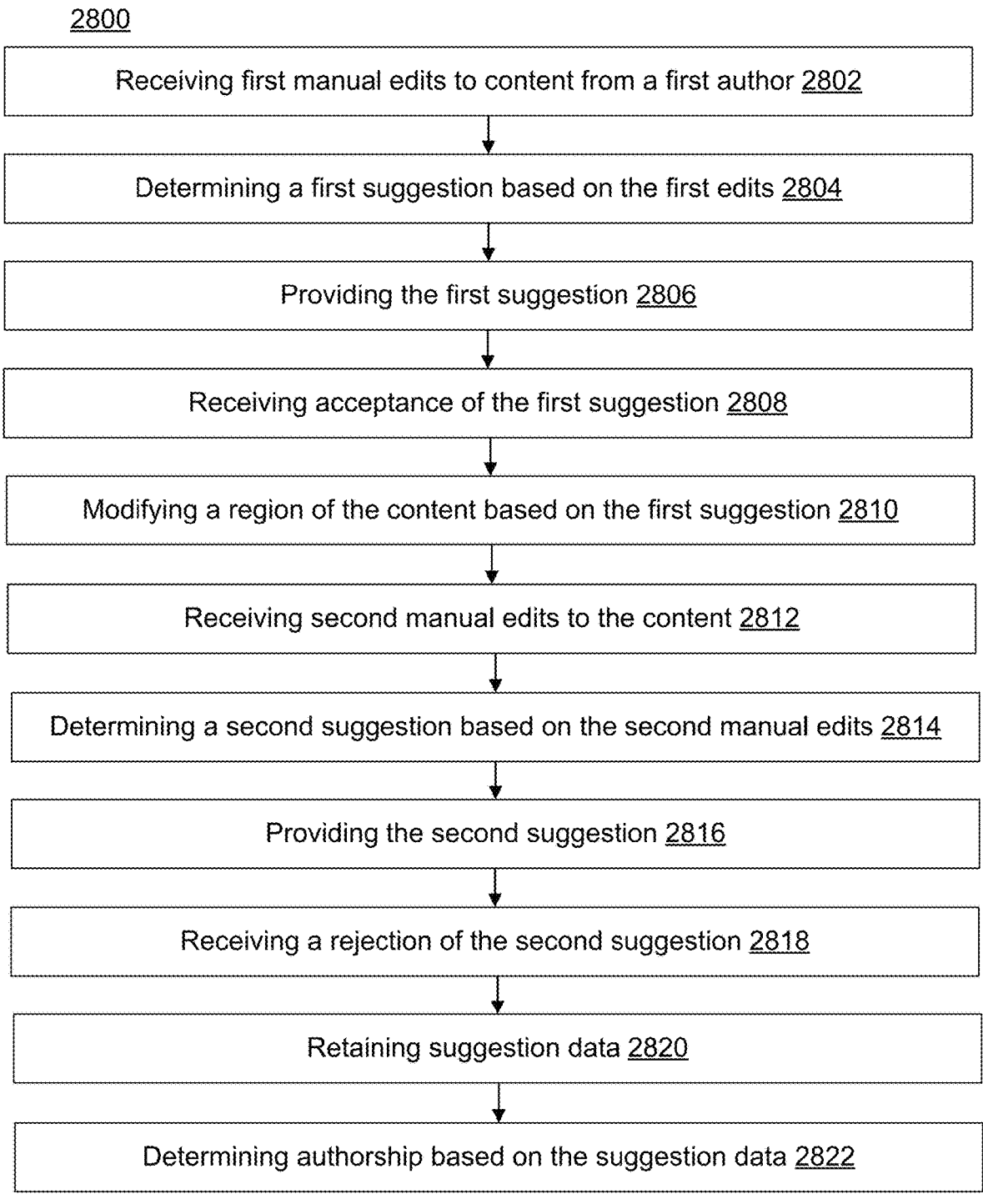

2800

Receiving first manual edits to content from a first author 2802

Determining a first suggestion based on the first edits 2804

Providing the first suggestion 2806

Receiving acceptance of the first suggestion 2808

Modifying a region of the content based on the first suggestion 2810

Receiving second manual edits to the content 2812

Determining a second suggestion based on the second manual edits 2814

Providing the second suggestion 2816

Receiving a rejection of the second suggestion 2818

Retaining suggestion data 2820

Determining authorship based on the suggestion data 2822

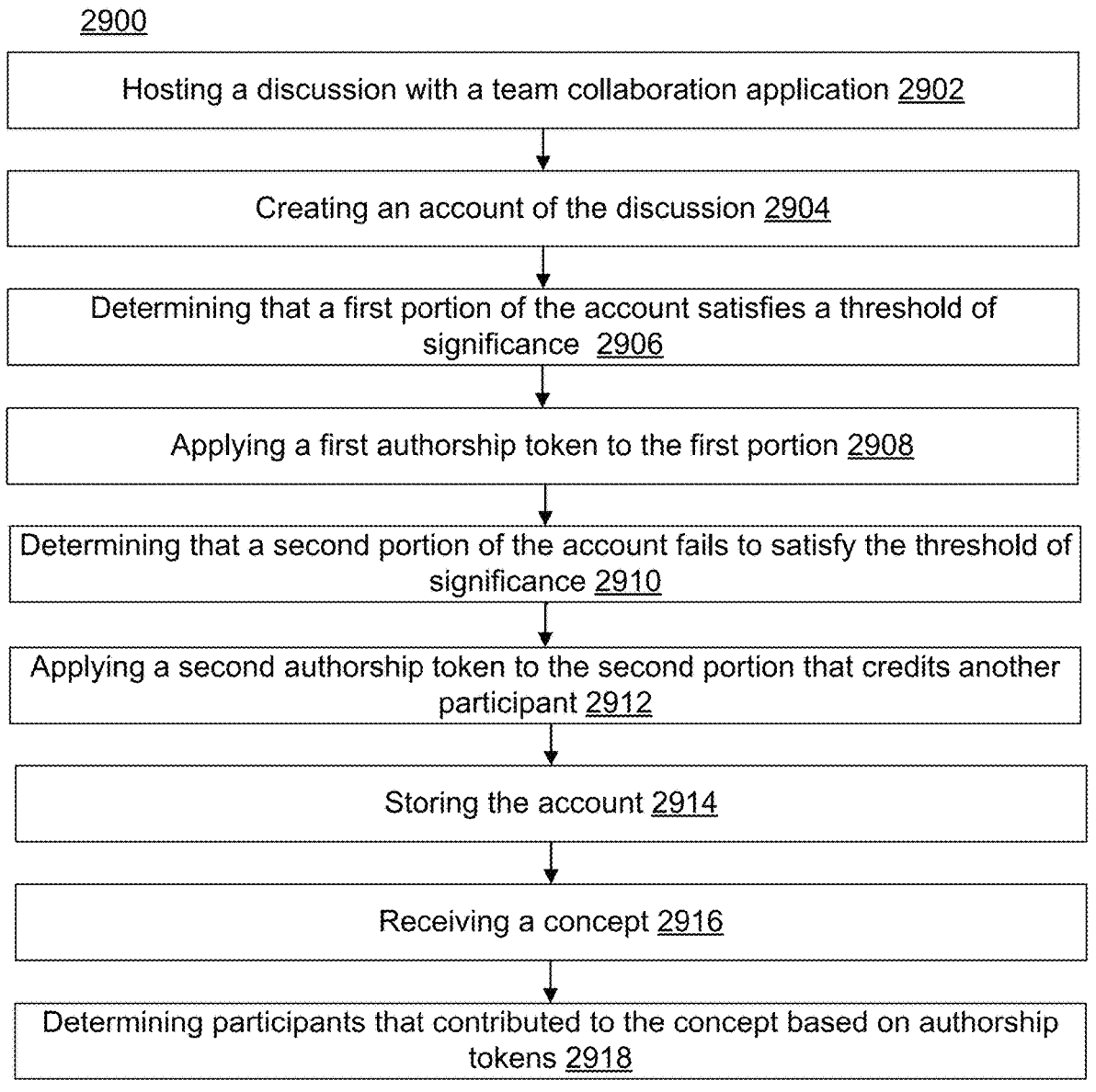

Hosting a discussion with a team collaboration application 2902

Creating an account of the discussion 2904

Determining that a first portion of the account satisfies a threshold of significance  2906

Applying a first authorship token to the first portion 2908

Determining that a second portion of the account fails to satisfy the threshold of significance 2910

Applying a second authorship token to the second portion that credits another participant 2912

Storing the account 2914

Receiving a concept 2916

Determining participants that contributed to the concept based on authorship tokens 2918

Obtain capability to track events
3110

Track events during content creation
3120

Snapshot event occurred?
3130

No

Yes

Add events to audit trail stored
in association with content
3140

3200

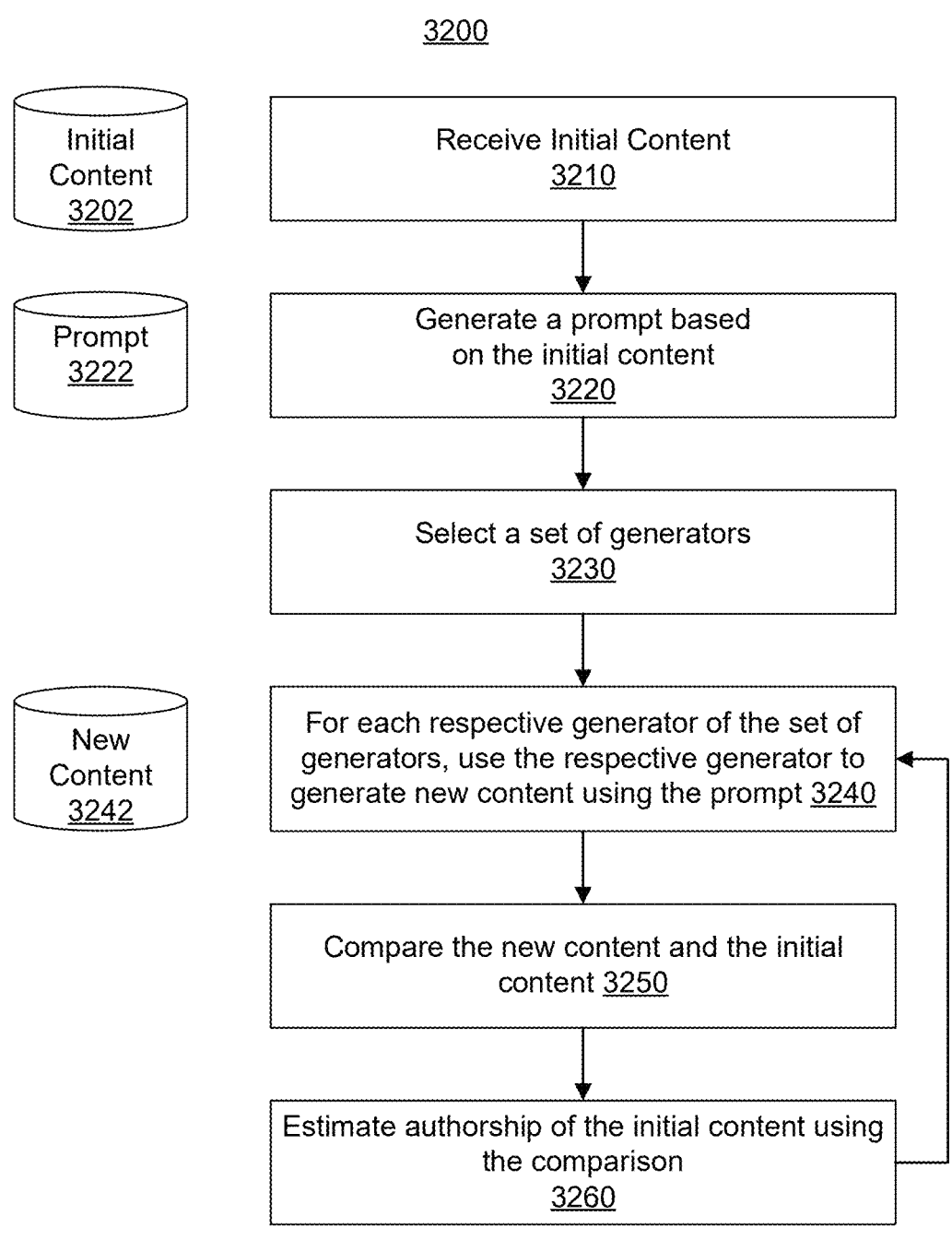

Initial Content 3202

Receive Initial Content
3210

Prompt 3222

Generate a prompt based
on the initial content
3220

Select a set of generators
3230

New Content 3242

For each respective generator of the set of
generators, use the respective generator to
generate new content using the prompt 3240

Compare the new content and the initial
content 3250

Estimate authorship of the initial content using
the comparison
3260

FIG. 32

AUDITABLE AUTHORSHIP ATTRIBUTION WITH EVENT TRACKING AND MOCK CONTENT

CROSS REFERENCE TO RELATED APPLICATIONS

This application is a divisional application of Ser. No. 19/036,141 (filed Jan. 24, 2025), which claims the benefit of priority to U.S. Provisional Patent Application Nos. 63/625, 601 (filed Jan. 26, 2024); 63/638,815 (filed Apr. 25, 2024); 63/649,673 (filed May 20, 2024); 63/664,959 (filed Jun. 27, 2024); 63/728,212 (filed Dec. 5, 2024); 63/728,202 (filed Dec. 5, 2024).

This application is also related to U.S. patent application Ser. No. 18/783,053 (filed Jul. 24, 2024), which is a continuation-in-part of U.S. patent application Ser. No. 18/597, 744, which was filed Mar. 6, 2024, which claimed the benefit of priority to U.S. Provisional Patent Application Nos. 63/625,601 (filed Jan. 26, 2024), and issued as U.S. Pat. No. 12,061,902.

Each of these applications is incorporated by reference herein in their entirety for any and all purposes.

BACKGROUND

Traditionally, content creation software relied on human input to produce content. Thus, content could be assumed to have human authorship. Indeed, to label something as "human authored" was unnecessary because of course it was. Eventually, relatively basic or repetitive content could be generated with the help of simple software run at the creative direction of a human user (e.g., automatic creation of tables of contents based on headers). But even then, such content was still considered human authored.

Only since the arrival of large language models has artificial intelligence grown in capability sufficient to allow for the ubiquitous generation of useful human-like content with little or no input from a human author. Now, content can have one or more human authors, one or more artificial authors, or even a combination thereof. Given the quality of content produced by generative artificial intelligence, it can be difficult, if not impossible, to separate human-generated content from artificially generated content from analyzing the content alone.

BRIEF DESCRIPTION OF THE DRAWINGS

FIG. 2, which is split into FIGS. 2A-F, illustrates an example method implementing techniques described herein.

FIG. 7, which is split into FIGS. 7A and 7B, illustrates a method for attributing authorship of content based on a conversation history.

FIG. 16 illustrates tracking the selection and arrangement of content.

FIG. 27 illustrates an example method for modifying artificial involvement based on a contribution history.

FIG. 28 illustrates an example method for determining authorship of suggestions.

FIG. 29 illustrates an example method for allocating tokens with respect to a discussion.

FIG. 32 illustrates an example method for estimating authorship of initial content.

DETAILED DESCRIPTION

Figure 1:
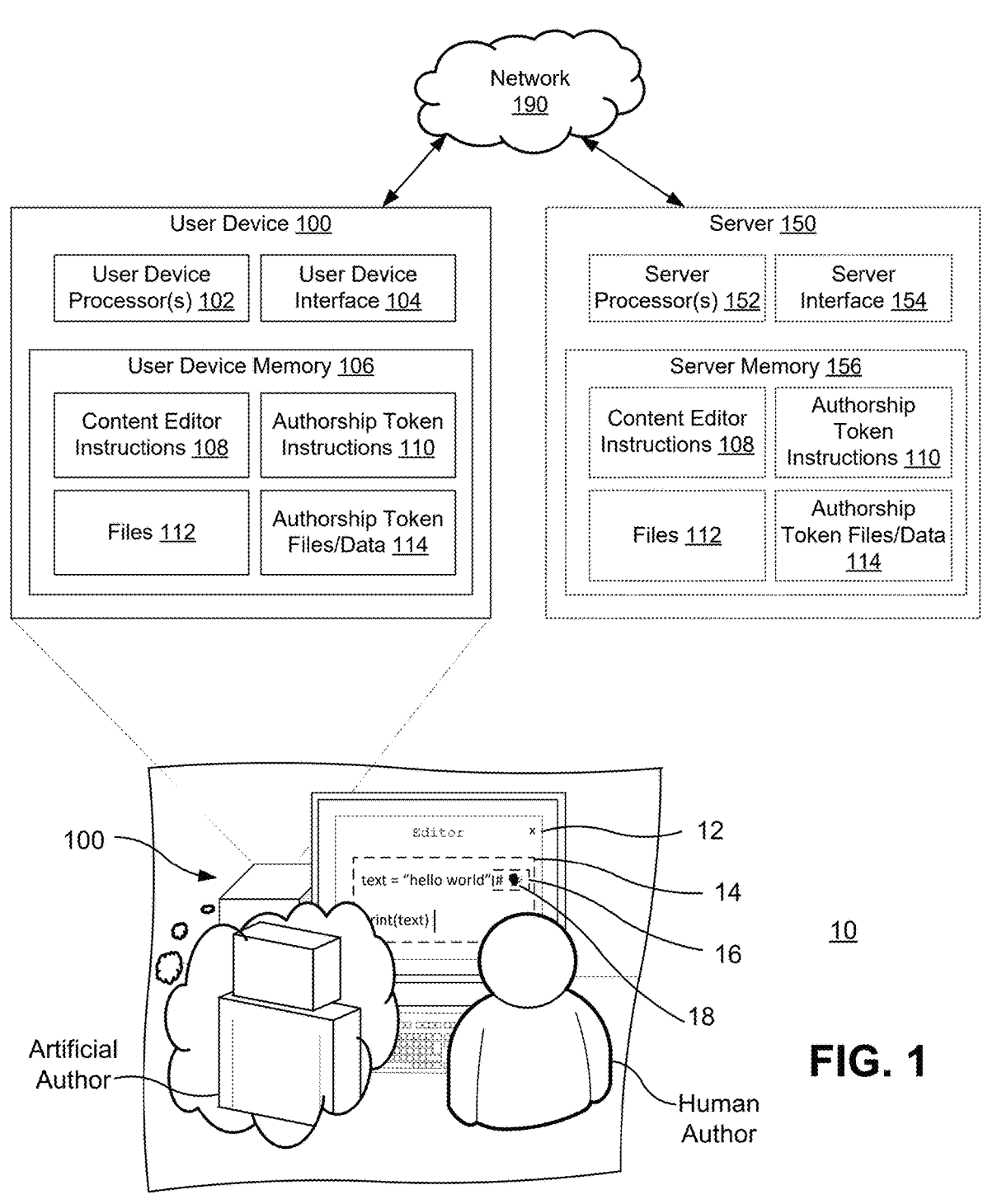
FIG. 1 illustrates an example system that can benefit from techniques described herein.

When content is produced through a collaboration between a human author and an artificial author, like a generative artificial intelligence tool (e.g., GITHUB COPILOT or OFFICE COPILOT, both by MICROSOFT), it would be beneficial to be able to demonstrate which portions of the content were authored by a human and which portions were authored by an artificial intelligence.

For example, when training new generations of artificial intelligence, training material that is authored by a human is preferable to training material authored by an artificial intelligence because training an artificial intelligence on synthetic data can lead to an erosion of quality (see, e.g., Alemohammad et al., *Self-Consuming Generative Models Go MAD*, arXiv: 2307.01850v1, Jul. 4, 2023).

As another example, copyright offices have requested that applicants identify which portions of a work were created by an artificial intelligence so they can be excluded from the copyright claim (see, e.g., U.S. Copyright Office, *Copyright Registration Guidance: Works Containing Material Gener-ated by Artificial Intelligence,* 88 Fed. Reg. 51, Mar. 16, 2023). But at the time of submission of a work to a copyright office or other use of a work, it can be difficult or impossible to look back at a work and identify what portions of the content were authored by a human and which were authored by an artificial intelligence. Further, there may be portions authored by a human in conjunction with an artificial intelligence (or vice versa). Further still, even where a work is produced solely by a human without artificial authorship, it can be difficult to practically demonstrate that the work really was authored by a human rather than an artificial intelligence.

As still further examples, it can be beneficial to treat content differently depending on its author. For instance, a social media platform may have different policies regarding content created by artificial "bots" versus content created by humans. Further, certain artificial authors may have restric-tions on how their content may be used (e.g., for non-commercial purposes only) and content produced by such authors may be prohibited in a commercial context. Further still, social media websites or other recipients of content may prohibit content created by certain artificial authors but permit content produced by certain other artificial authors (e.g., based on alignment of the model used by the artificial author).

Some traditional tools (e.g., document or code editing tools having collaboration features) can label content with an associated author, but such existing tools are insufficient for the problem of mixed human and artificially generated content at least because they treat all content as having been authored by the human person whose account is associated with the tool. For example, authorship in version control systems like GIT is typically automatically attributed on commit level, thereby attributing all content (or all new content) in the commit as having been authored by the (human operated) account making the commit regardless of how the content being committed was actually created (e.g., via manual creation by the human associated with the account, another human, or artificial creation by an artificial intelligence) or being able to ascribe different authorship to different parts of the new content. That is, traditional tools track the user account that committed or saved particular content but lack the ability to conveniently track the actual author of the underlying content being saved or committed. Such tools lack the ability to identify which portions of the code committed by the user were manually authored by the user, were authored through the use of a generative artificial intelligence code generation feature (e.g., GITHUB COPI-LOT), were created by the user copying from another source (e.g., answers from STACK OVERFLOW or open-source libraries), or combinations thereof. Indeed, it was often unnecessary to do so because it was easy and largely accurate to assume that the person committing the code was a human and the author of the code. But it is no longer safe to make that assumption.

As another example, some tools allow for the automatic creation of redline markup showing the author of specific portions of a document. But such redline markup is limited to identifying the user account associated with the word processor as the author of content, rather than the author that created the actual text content. Further, such markup lacks description of how the content was created, whether as the result of manual human input, as the result of pasting from another source, or as the result of generating by an artificial intelligence. As artificial content generation features become more integrated into content editors, it becomes increasingly difficult to determine the provenance of content.

Further, redline markup traditionally requires the content it is describing to be stored in a rich text format. For instance, many word processors or other office applications store content in Open Office XML file formats (e.g., as defined in ISO/IEC 29500-1:2016 or subsequent standards). However, such formatting is inappropriate for many kinds of files (e.g., source code, which is often stored in plain text), which traditionally lack the ability to usefully store such redline markup.

Merely automatically treating every piece of content added to a file as being authored by a human is insufficient because generative artificial intelligence often directly inserts content into the file into locations where the human would also insert text. Where it was previously safe to assume that only one author was operating an editor at a time, now generative artificial intelligence is being inte-grated into content editors in such a way that a human author and an artificial author may take turns editing the same content within the same editing session. As a result, edits coming from a single content editor on a single computer can now come from a human author and at least one artificial author. As advancement in artificial intelligence continues to grow, where a content editor may now have only a single artificial coauthor, future text editors may have multiple different artificial authors available and distinguishing which among them contributed to which content (e.g., because of different capabilities, licensing requirements, copyright statuses, other differences, or combinations thereof) may be beneficial. Further, while current artificial authors often require human involvement at some level of the process (e.g., copying and pasting content produced by an artificial author or accepting a provided change from an artificial author), future implementations may involve an artificial author acting autonomously or semi-autonomously.

One could painstakingly, manually label which portions of content were authored by a human or artificial intelli-gence, but such a process would be time consuming and inefficient. Further, an individual could very easily forget to label sections, leading to a decrease in accuracy for the identifications. Further still, it may be difficult for authors themselves to apply a consistent, accurate standard for determining when they are the author of the content versus an artificial intelligence. And such a technique would only be helpful for honest labelers and do little to address fraudulent labeling of artificial content as human authored (or vice versa).

While a program could log every keystroke or input by an author to create a record usable to demonstrate authorship, such a log would raise privacy concerns, consume large amount of processing and memory resources, and can be difficult to correlate to a resulting output. A user recording themselves producing content (e.g., using a screen capture program or even a camera) raises similar challenges.

In addition, as new paradigms of interaction with artificial agents (e.g., which may be authors of content) develop, being able to track the provenance of content will remain useful. For instance, a human may interact with a multimodel interface or a multimodal model (e.g., GPT-4o by OPENAI) over visual, auditory, and text channels and receive an output over those same channels.

Thus, there is a need in the art for new technical solutions that conveniently and accurately identify and label content with an associated human or artificial author.

Techniques described herein are relevant to such technical solutions. Techniques described herein include the use of authorship tokens to identify content authored by a particular author or kind of author (e.g., human or artificial). Such tokens can automatically be generated by the content editor (or a plugin thereto) or operating system and applied to the work while the work is being produced. Thus, subsequent review of the work can identify regions produced by a human author, regions produced by an artificial author, regions having mixed authorship, and regions having unknown authorship.

In a first example implementation, any edit to a region of content is sufficient for that region to be considered authored by the human or artificial intelligence that made the edit, and the region is labeled accordingly with an authorship token corresponding to that kind of author. In a simple implementation, human versus artificial authorship can be determined based on whether a human interface device is being used to effectuate the edit. If so, then the edit has human authorship. Otherwise, the edit has artificial authorship. In an example implementation, a human authorship token is removed only if a different kind of author (e.g., an artificial intelligence but not another human) rewrites an entire region. For instance, a human writes a line of code using a human interface device (e.g., a keyboard), and the content editor appends a comment to the end of the line of code. The comment can be an empty comment or comment having one or more predetermined special characters corresponding to a specific author (e.g., a name of the author) or specific kind of author (e.g., human or artificial). In an example, the content is a line of code having a functional code portion and a comment portion. The comment portion can include an authorship token portion and a normal comment portion (e.g., a portion typically used by programmers to describe the line of code). To avoid visual clutter or resist tampering, the content editor can suppress the display of the authorship token portion (e.g., by hiding it) and permit display of only the normal comment portion.

In another example, mere de minimis changes to generated text may not necessarily be sufficient to demonstrate or change authorship. The content editor can detect whether an author makes an edit to a region of content (e.g., a line of code in an integrated development environment or text in a word processor). Responsive to determining that the edit to the content (individually or in aggregate with other edits) meets a threshold of significance (e.g., an amount of characters changed or type of characters changed), there can be a check for whether an authorship token (e.g., a special comment or data entry) is already present. If not, then an authorship token is added corresponding to the author that made the change. If so, then the authorship token is updated as necessary. The authorship token can usefully convey information about the authorship (e.g., whether the author is human or artificial, the author's name, the amount of content changed, other information, or combinations thereof) or even merely that the region is human authored.

Where the content is code, a language of the code can be determined by a file type of the file being edited, libraries being incorporated, analysis of header data, settings of the code editor (e.g., which syntax highlighting mode is active), by asking a user, or based on the context or syntax of the code itself. In such instances, a corresponding comment format for that language can be selected and used for adding the authorship token as part of a comment. In some examples, the authorship token does not itself convey substantive information about the associated content (e.g., what the code in the line does). The authorship token can be predetermined without respect to the content of the region (e.g., not describe the line of code as a typical programming comment would or not be based on the content of the code but rather based only on authorship). The authorship token can be predetermined with respect to how the author edited the content. The authorship token can be redundant to or different from a version control system regarding the author that committed or saved the content and what is changed. For instance, the authorship token may specify which author or which kind of author (e.g., human or artificial) made the change within the content editor and the authorship indicated in the commit reflects which account is associated with the content editor or with the commit system regardless of the authorship of the content being committed. In other examples, the commit indicates multiple different authors in a way that corresponds to the authorship tokens.

In examples, there may be a file in which user produced content is added, but artificial intelligence generated code or pasted code is not added. Such files may include the human produced content verbatim, or may include a compressed version thereof to reduce an amount of resources required. In some examples, there is a check for whether generative artificial intelligence is producing content. If so, then the human authorship tokens can be removed. If content is pasted, authorship tokens can be removed, suppressed, or special tokens can be added indicating that that the provenance of the content is unknown (e.g., possibly human generated or possibly artificial intelligence generated). In some examples, copyrighted works are automatically added to the file from a library of creative works produced or owned by the author or an organization for which the author works. The works can be added to comments in the file.

In some examples, authorship tokens include information regarding an amount of content in the region that was provided by the author, such as manually by a human author (e.g., the factors that went into the significance score). The values can be updated as a user makes changes rather than being baked in all at once. For example, a user may generate a line of content with a generative artificial intelligence, make some minor changes and then move on. Later the user may return to that line and make further changes. The subsequent changes can update or replace the prior human authorship token (if any), or may be stored in a new human authorship token which may be reconciled with the previously-created human authorship token. For example, the creation of a subsequent human authorship token can take into account the values of an existing human authorship token, or the two tokens may be analyzed together to determine overall authorship of a particular region of content. Such dynamic generation, updating, and management of human authorship token(s) can beneficially improve accuracy of labeling of content in situations where a user returns to edit content several times.

In some examples and situations, a human authorship token is added to content even if the content was generated by an artificial intelligence or vice versa. The authorship token can reflect an amount of a kind of authorship to a given region, which can range from no human authorship (e.g., entirely generated by an artificial intelligence) to complete human authorship (e.g., no artificial intelligence), a mixture thereof, or unknown provenance (e.g., the content was pasted from another source or was added while an authorship tracking feature was disabled).

In examples, authorship tokens can be stored within the content being labeled. For instance, the content may be source code in plain text form with the authorship token being plain text intermingled with the source code. In further examples, authorship tokens can be stored in a same file that stores the content being labeled but without being stored within the content being labeled. For instance, a file format may store formatting (e.g., text formatting, such as font, size, boldness, style, and other information) separate from the text of the content. So too may the authorship token be stored separate from the content (e.g., text content) being labeled. In an example, the authorship information is prepended or appended to the beginning or end of the file, respectively. In yet further examples, the authorship tokens can be stored in a separate file from the content on a same device or at a separate device.

One or more aspects of the authorship token and code itself may be captured and stored separately from the authored content in a log location or file. Such a log of authorship may be found in a text file, database, distributed ledger, or any other logging or tracking mechanism. Each mechanism of logging or tracking authorship carries different advantages and disadvantages. In one example, a text file log stored within a local directory offers the advantage of simplicity and low central processing unit resource usage, but may offer the disadvantage of not being as searchable or sharable as other solutions. It may also be more susceptible to being manipulated or altered by a malicious actor. A database (e.g., an SQL-based relational database) hosted elsewhere may offer more shared, centralized tracking, but at the cost of more computation power and complexity. Meanwhile, a blockchain or other distributed ledger solution may offer almost complete decentralization and resist manipulability, but at the cost of high computational and/or storage requirements. A person of skill in the art may weigh these and other factors in determining how to achieve desired results in view of the disclosure herein.

One or more aspects of the authorship token and code itself can be captured and stored in a shared network via blockchain, other distributed ledger, or another shared network. The blockchain can be a public or private blockchain. In an example, the public blockchain is a blockchain maintained by a government agency or other organization configured to store authorship, ownership, or other factors. Code repositories can have a distributed ledger that tracks authorship tokens or other aspects of the relevant code. Confirmed authorship (e.g., human or artificial intelligence authorship) and associated proof can be added. In some examples, content (e.g., code) itself is stored on a blockchain, stored using a Merkel tree, or stored in another manner that resists tampering. For instance, each node in a block chain can be or correspond to a version of the file to resist the ability of someone to remove or modify authorship tokens. In addition or instead, the content can be added to a database.

In an example, each block in a blockchain or other similar data structure is used to track versions, authorship of content, or the content itself. Each block can include a hash representing one or more prior nodes. Blocks could additionally be signed by a server or something to resist rewriting from nodes or chains from scratch or otherwise tampering with data. Then the chain can be analyzed to determine the provenance of content with respect to authorship. In an example, such a system could be useful for situations of less trusted contribution. A blockchain or similar structure or process could be used for consensus for whether content is human or artificially authored. An entity can provide a blockchain with a commit to show the how the author got from the original content to the content of the commit. Manual changes to content can be tracked using blocks in a blockchain or similar structure.

In an example implementation, as part of a file-save routine, an associated program stores locally or sends something to a server, distributed ledger, or smart contract that keeps track of, among a variety of different files under management, information about authorship of the files. For instance, of X different files under management, they average Y % human authorship and Z % artificial authorship. Information can also be tracked on a per user basis, such as that of the files that user ABC creates, there is a statistical breakdown of how much AI they use or do not use. The information can be aggregated and analyzed to determine useful information, such as what kinds of functions tend to be AI generated versus human authored, the provenance of errors or bugs or security problems and trace back to what kind of author wrote it. Such trends can be used to identify deficiencies in AI capabilities or training and an AI can be trained (e.g., on the human data) to ameliorate the deficiencies.

In some examples, content produced on or prior to an artificial intelligence date can have human authorship tokens retroactively applied or generated. For example, the artificial intelligence date can be a date prior to which it should be assumed that all content was produced by a human rather than an artificial intelligence. The artificial intelligence date can be a date on which artificial intelligence features were given to users (e.g., a date on which generative artificial intelligence was approved for use or installed into a content editor). The artificial intelligence date can be a date on which sufficiently advanced generative artificial intelligence was sufficiently available to the public or certain users (e.g., the date on which GPT-3 was released to the public). Thus, an entire code base can be labeled with human authorship tokens as appropriate. When a user opens a file for editing after the artificial intelligence date and the file was last modified prior to the artificial intelligence date, then human authorship tokens can be automatically produced (e.g., according to techniques herein) and added to content in the file. In some examples, when content is being pasted from another file (e.g., part of a same or different codebase), then the modification date of the pasted-content source file is checked. If the modification date is prior to an artificial intelligence date (e.g., a date indicating that there is a special concern that content produced on or after that date may have been produced by artificial intelligence), then content pasted from such files may have a human authorship token added. Otherwise the token can be suppressed.

A file can be parsed and sections of content having human authorship tokens can be identified. Such sections can be assumed to have been created by a human rather than a generative artificial intelligence for human authorship purposes. Sections of content having artificial authorship tokens can be identified and assumed to have been authored by an artificial intelligence rather than a human.

In some examples, to resist tampering, the content editor can resist the manual creation, deletion, or modification of authorship tokens (e.g., preventing a human or artificial author from adding content mimicking the format of authorship tokens). For example, when authorship tokens are stored in the same file as the content (e.g. in the form of source code comments or other text) the authorship tokens may be encrypted, signed, or otherwise be configured to resist tampering. Tamper-resistant tokens might be unreadable or unintelligible by a human author absent separate steps (e.g., decryption or validation with a hash of known provenance). Depending on how the tokens are stored, this might not prevent deletion of said tokens, but depending on the method of encryption, may resist fraudulent additions or modifications of such tokens.

In another example, where authorship tokens or data is stored in a separate file or separate part of a file, it may have different access or editing rights as compared to a file or region of a file that is being edited by the author. The file containing authorship tokens may be non-modifiable or not readily modifiable by an author. In an example, authorship tokens are encrypted, encoded, or signed in such a way that resists tampering with the tokens. Thus, this can improve the reliability of authorship tokens by resisting the ability of a user (whether human or artificial intelligence) from inappropriately adding, removing, or modifying the tokens. Further still, authorship tokens, the content they describe, or representations thereof can be published to a blockchain, distributed ledger, Merkle tree, or in another way that resists tampering.

Content having authorship tokens can be used in any of a variety of useful ways. The same program used to generate the authorship tokens or a different program can analyze the labeled content to determine which regions have human authorship tokens and which ones lack human authorship tokens (or are labeled as being artificially authored). A report can be generated describing which regions have which kinds of authors (based on the associated authorship tokens). Such a report can be used to support a copyright filing, patent filing (e.g., for determining inventorship), or copyright notice, be used for internal monitoring of author productivity, support billing for authored content (e.g., billing for usage of AI tools), support a request for indemnification or a warranty claim with a provider of an artificial author (e.g., certain providers of artificial authors may warrant the accuracy or non-infringement of content provided by their artificial authors), other uses, or combinations thereof. Further still, identifying authors of regions can be used to demonstrate the provenance of content to an auditor (e.g., for compliance purposes, to defeat allegations of plagiarizing an AI author, or to defeat allegations of passing off AI generated content as one's own). When the content is used for training an artificial intelligence (e.g., a generative artificial intelligence), regions of the content lacking a human authorship token can be excluded or labeled accordingly to resist degradation in generative AI content quality that can arise from training on AI generated content).

In some examples, content having particular authorship can be restricted. For example, an organization may have a policy regarding whether particular kinds of authorship is permitted (e.g., an organization may want a particular amount of human or artificial authorship in certain areas). Thus, an action taken with respect to content (publishing, committing, merging a branch, sending to a third party, sending to an external party, receiving, other actions, or combinations thereof) may be permitted or disallowed based on authorship of the content satisfying or failing to satisfy a particular threshold.

In some examples, authorship can be described or stored using bloom filters or similar data structures. For example, the bloom filter can be configured to store data such that regions can be tested to determine whether region in question has particular authorship. Because of the nature of bloom filters potentially providing false positives (but not false negatives), the way that information is stored can be configured to be tolerant for those kinds of errors. For instance, an organization may be more concerned about false positives for artificial authorship than human authorship or vice versa. The use of the bloom filter can be so configured. Multiple bloom filters can be used to store other kinds of authorship information, such as internal or external.

Many examples herein are described in the context of raw, discrete content blocks (e.g., lines, functions, classes, sentences, paragraphs, etc.), but in some instances, authorship can be applied to architecture or outlines. In some examples, in addition to or instead of authorship describing authorship of raw content (e.g., the characters or other content that makes up a region), there may be authorship tokens that apply to or describe authorship of an architecture, plan, outline, organization, or other higher level structuring of content. Such tokens may appear at the beginning of a file, at the end of the file, or at the relevant regions of the content. In some instances, a region may have tokens describing high level authorship as well as low-level authorship. The delineation between high and low level authorship can be defined by policy or preferences of an implementing entity. In an example, a first author (e.g., a human author) specifies an architecture for source code and a second author (e.g., a generative artificial intelligence) creates underlying code that implements it. The underlying code can be tagged as having an artificial author using artificial authorship tokens but there can be (e.g., at the beginning of the relevant region) a tag indicating human authorship of the overall architecture implemented by the artificial intelligence. Likewise, a human can specify an outline for a document that an artificial intelligence fleshes out. Further, organizational authorship may apply when rearranging or organizing content. In an example, an artificial intelligence may generate content and a human author may rearrange the code content (e.g., moving functions to different parts of a source code file or moving paragraphs around in a narrative document). The file may indicate that there is artificial authorship for the regions by applying artificial authorship tokens thereto, but there may also be an additional authorship token that applies in such a way that describes authorship of the arrangement or organization of the content.

Many examples herein describe application of authorship tokens to primarily text content edited by a text editor (e.g., a word processor or development environment). However, authorship tokens can be applied to in other contexts, such as using visual, audio editors, or other kinds of editors. For example, a user may cooperate with an artificial intelligence in the creation of visual content (e.g., a website or a user interface) using a visual development environment (e.g., a graphical user interface builder). The visual development environment may permit a user to specify locations for graphical user interface elements. In examples, techniques described in FIG. 2 may be modified to apply to such situations. For example, edits to content can be detected, significance determined, and authorship tokens provided accordingly. Likewise, techniques described herein can be applied in other contexts, such as audio creation or editing, visual content creation (e.g., 2D images, 3D objects, photographs or video,) In some implementations, authorship tokens can be applied upon creation of content using sensors (e.g., cameras or microphones) and can persist through the editing journey of the content to demonstrate provenance of the content, optionally including a description of who edited or contributed to what aspect of the content.

In an example, to improve auditability of authorship, a generative artificial intelligence is configured to generate content that has an increased likelihood of being detected as having been generated by an artificial intelligence. For example, the generative artificial intelligence can be configured to have a statistically significant detectable feature unlikely to be produced by humans, such as favoring content having a specific number of syllables, consonants, vowels, or other detectable features. In another example, the generative artificial intelligence can be configured to favor use certain words, types of words or forms of words or sentences. In example, existing code produced by a human author is analyzed to determine such traits and then the generative artificial intelligence is configured to generate to content that is detectably different from such traits. Thus, sections of content produced by the generative artificial intelligence can be distinguished from content produced by a human author.

In another example, to improve the auditability of authorship, a generative artificial intelligence can be configured to produce content (e.g., code) having characteristics (e.g., in the case of code, variables or functions with specific kinds of names) that are less likely to be produced by a human author. For example, the artificial intelligence can be configured to favor producing code with variables having longer variable names, specific kinds of variable names (e.g., appending "_AI_GENERATED" to variable or function names produced by an artificial intelligence), or having special characters or combinations of characters that are inconvenient for a human to manually type. In an example, the generative artificial intelligence is trained or configured to produce names that would be considered ugly or too verbose by a human programmer. Thus, code produced by human versus an artificial intelligence could be distinguished.

An example system that can benefit from or implement techniques described herein is shown and described in relation to FIG. 1.

Example System

FIG. 1 illustrates a system 10 with which one or more aspects of techniques described herein can be implemented. The system 10 includes a user device 100 with a human author and an artificial author interacting with a same content editor 12 (e.g., as illustrated, a text editor). As further illustrated, embodiments of the system 10 can further include a server 150 connected to the user device 100 over a network 190.

Figure 10:
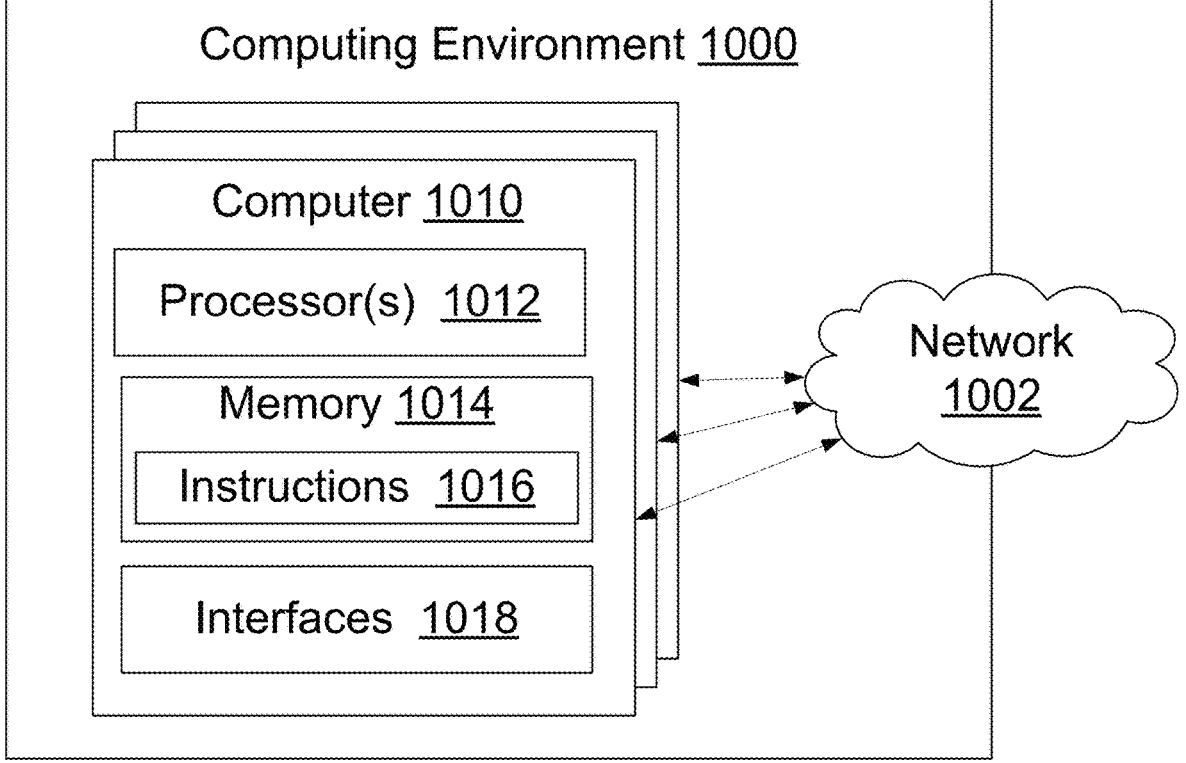
FIG. 10 illustrates an example computing environment usable with techniques described herein.

The user device 100 can include one or more aspects described elsewhere herein such as in reference to the computing environment 1000 of FIG. 10. In many examples, the user device 100 is a personal computing device, such as a smart phone, tablet, laptop computer, or desktop computer. But the user device 100 need not be so limited and may instead encompass other devices used by a user to produce content, such as text content. In the illustrated example, the user device 100 includes one or more user device processors 102, one or more user device interfaces, and user device memory 106.

The one or more user device processors 102 are one or more components of the user device 100 that execute instructions, such as instructions that obtain data, process the data, and provide output based on the processing. The one or more user device processors 102 can include one or more aspects described below in relation to the one or more processors 1012 of FIG. 10.

The one or more user device interfaces 104 are one or more components of the user device 100 that facilitate receiving input from and providing output to something external to the user device 100. The one or more user device interfaces 104 can include one or more aspects described below in relation to the one or more interfaces 1018 of FIG. 10.

The user device memory 106 is a collection of one or more components of the user device 100 configured to store instructions and data for later retrieval and use. The user device memory 106 can include one or more aspects described below in relation to the memory 1014 of FIG. 10. As illustrated, the user device memory includes content editor instructions 108, token instructions 110, and files 112, among other potential contents.

The content editor instructions 108 are instruction that, when executed by the one or more user device processors 102, cause the one or more processors 102 to provide the content editor program 12. The content editor program 12 is software that provides features for the editing of content. While the illustrated text editor instructions 108 are local to the user device 100, technology herein can also be applied to cloud based or remote editors.

The content editor 12 can take any of a variety of forms, including text editors, such as word processing applications (e.g., MICROSOFT WORD, GOOGLE DOCS, OPENOFFICE, LIBREOFFICE, and PAGES) and software development environments (e.g., NOTEPAD++, VIM, EMACS, SUBLINE TEXT, VISUAL STUDIO CODE, ECLIPSE, XCODE, MICROSOFT VISUAL STUDIO, and PYCHARM), other environments, or combinations thereof. In addition or instead, content editors can include 2D content editors (e.g., ADOBE PHOTOSHOP, ADOBE ILLUSTRATOR, PROCREATE, PIXELMATOR, GNU IMAGE MANIPULATION PROGRAM, MICROSOFT PAINT, GOOGLE PHOTOS, and MICROSOFT VISIO), 3D content editors (e.g., BLENDER, 3D STUDIO MAX, MAYA, SOLIDWORKS, AUTOCAD, and LIBRECAD), video editors (e.g., ADOBE PREMIERE PRO and FINAL CUT PRO), audio editors (e.g., AUDACITY), digital audio workstations (e.g., ABLETON LIVE, ADOBE AUDITION, CAKEWALK, GARAGEBANK, and LOGIC PRO), presentation software (e.g., MICROSOFT POWERPOINT, GOOGLE SLIDES, KEYNOTE, and CANVA), spreadsheet software (e.g., MICROSOFT EXCEL and GOOGLE SHEETS), and notetaking software (MICROSOFT ONENOTE), among others. Further, while many examples above are standalone applications (whether standalone desktop applications, mobile applications, webservices, or other kinds of applications), a content editor may be a portion of a larger application or service. The content editor 12 may be a program or service that includes content editing functionality regardless of the wider or primary purpose of that program or service. For example, while email clients are not often thought of as content editors, they often include substantial content editing functionality, such as for composing emails. Such a composing aspect can be considered a content editor. Likewise, social media platforms (e.g., FACEBOOK, INSTAGRAM, X (née TWITTER), SNAPCHAT, and TIKTOK) and messaging platforms (e.g., SIGNAL, DISCORD, IMESSAGE, MICROSOFT TEAMS) often include composing features (e.g., for creating a post or writing message) or editing features (e.g., for editing video, audio, image, or text content) as part of the platform. Such composing aspects can be considered content editors. Thus, "content editor" refers to a broad class of editors that permit the editing (including creation) of content among possibly other features.

While many examples describe the editing of text, such editing need not be limited to the editing of plain text. Further, even where a content editor is focused primarily on one kind of content (e.g., text or visual content), such an editor may offer functionality for editing other kinds of content and thus need not be limited to a program or function having the primary purpose of editing one kind of content. Content generators can be considered a subset of content editors.

The content editor 12 may include functionality to produce or receive content generated by a large language model or other generative artificial intelligence systems (e.g., GITHUB COPILOT or OFFICE COPILOT). Such content may be provided into a same or different editor window or tab as manually entered text or primary content.

As illustrated, the content editor 12 can be used to edit content 14, such as source code that includes one or more lines of code that can include one or more comments 16.

The authorship token instructions 110 are instructions that, when executed, facilitate the labeling of content within the content editor 12 as having been produced by a particular author or a particular kind of author (e.g., a human or artificial author). In some examples, the execution of the instructions 110 cause the one or more processors executing the instructions to provide an authorship engine. The authorship engine can perform one or more aspects described herein relating to authorship, such as the labeling of content and performance of one or more operations described herein. In an example, the authorship token instructions 110 are written as a plugin to or as a part of a content editor 12 or an operating system to create one or more authorship tokens 18. The authorship tokens 18 may be stored in the files 112, or in separate files associated therewith. In another example, the authorship token instructions 110 may execute at the user device 100 as a service concurrently with use of content editor 12, and may monitor various user interfaces of the user device 100 to determine user input intended to be received at the content editor 12, and to generate authorship tokens, which may be stored in the files 112 adjacent to content, or in separate files entirely, such as authorship token files/data 114. In such instances, the authorship token instructions 110 may similarly create authorship tokens 18 in parallel with entry at content editor 12. Execution of authorship token instructions 110 can cause performance of one or more operations of method 200.

The server 150 is a server device that can function as part of one or more processes described herein. In the illustrated example, the server 150 includes one or more server processors 152, one or more server interfaces 154, and server memory 150, among other components.

The one or more server processors 152 are one or more components of the server 150 that execute instructions, such as instructions that obtain data, process the data, and provide output based on the processing. The one or more server processors 152 can include one or more aspects described below in relation to the one or more processors 1012 of FIG. 10.

The one or more server interfaces 154 are one or more components of the server 150 that facilitate receiving input from and providing output to something external to the server 150. The one or more server interfaces 154 can include one or more aspects described below in relation to the one or more interfaces 1018 of FIG. 10.

The server memory 150 is a collection of one or more components of the server 150 configured to store instructions and data for later retrieval and use. The server memory 150 can include one or more aspects described below in relation to the memory 1014 of FIG. 10. As illustrated, the server memory 150 can store content editor instructions 108, authorship token instructions 110, files 112, and authorship token files or data 114, among other files, data, or instructions. Such materials can perform the same or similar functions to those described in relation to the user device 100 and elsewhere. In addition or instead, they can perform server specific aspects and optionally cooperate with the user device 100 or other devices to perform operations or other aspects described herein.

The network 190 is a set of devices that facilitate communication from a sender to a destination, such as by implementing communication protocols. Example networks 190 include local area networks, wide area networks, intranets, or the Internet.

Example Method

FIG. 2, which is made up of FIGS. 2A-2E, illustrates a method 200 that can facilitate the providing of authorship tokens. One or more operations of this method 200 can be performed in real-time while an author is using the content editor 12. Operations can be performed automatically or at least partially automatically. Where aspects herein are described as being predetermined or configurable, one or more parameters affecting such determinations or configurations can be specified by a user or administrator.

In an example, the method 200 is performed by an authorship engine while a content editor 12 (e.g., a development environment) to a developer having a file 112 containing content 14 (e.g., source code). The content editor 12 can be provided by executing the content editor instructions 108 using the one or more user device processors 102. The method can begin with operation 210, which is shown in more detail in FIG. 2B.

Operation 210 includes determining that an edit to content has been made. Here, "edit" is used broadly and can include creating new content, removing existing content, or modifying existing content. In the text context, edits often include one or more insertions, deletions, replacements, or movements of the text (e.g., source code or prose), whether on an individual character level or on a whole word or multiple character level. In the two-dimensional visual context, edits often include one or more insertions, deletions, replacements, or movements of one or more pixels, whether on an individual layer level or across multiple layers. But edits can include other changes, such as modifications to appearance of pixels (e.g., by editing levels, applying filters, modifying opacity). In the three-dimensional visual context, edits often include one or more insertions, deletions, replacements, or movements of one or more vertices, edges, faces, curves, or other components, whether on an individual model level or across multiple models or an entire scene. But edits can include other changes, such as modifications to appearance of models, materials, textures, light sources, or ambient effects, among others. In the audio context, edits often include one or more insertions, deletions, replacements, or movements of one or more sounds, waveforms, or other components, whether on an individual model level or across multiple tracks or an entire file. But edits can include other changes, such as modifications to volume, panning, or other effects. A person in ordinary skill in the art will understand the kinds of edits applicable to other kinds of content and further kinds of edits applicable to the above-described content. In some examples, the definition of edit is configurable by a user (e.g., the user may want authorship checking for only newly created content rather than edits to existing content).

The edit can be a manual edit made by a human or an edit made by an artificial intelligence, and the determining includes determining the source of the edit. The source can be, for example, an anthropogenic source (e.g., a human), a technogenic source (e.g., an artificial intelligence), or another kind of source (e.g., an unknown source). For instance, the source can be determined, such as via determining that a human user of the development environment (e.g., content editor 12) has made a manual edit to the content 14 within the content editor 12. It can also include determining that an artificial user or generative tool has made or is otherwise responsible for an edit to the content 14 within the content editor 12. Manual edits include the product of a human developer and have human authorship. Manual edits can be contrasted from artificial edits or AI edits, which can be the product of artificial intelligence, such as generative artificial intelligence.

In examples, certain automated or artificial actions may nonetheless be classified or considered as manual edits rather than edits generated by artificial intelligence. Such certain automated actions may include actions or features, such as autocorrect (e.g., automatically changing a common misspelling to a word that is believed to be correct), spell check (e.g., automatically or manually changing or suggesting one or more words to replace text), predictive text (predicting a next text based on prior text), autocomplete (e.g., a prediction of a rest of a word, line, phrase, or other logical grouping), code completion (e.g., suggesting variables, functions, classes or other components based on a current context or namespace), find-replace (e.g., automated bulk renaming of a find string to a replace string), automated refactoring, other features, or combinations thereof. Whether and to what extent such features count as manual or AI edits may depend on predetermined user or organization-specified preferences. In addition or instead, a significance of the changes or the human involvement may be determined and used to decide whether an edit is considered human (e.g., manual), artificial (e.g., by an AI), mixed, or unknown. Certain of the above features may be fairly classified as either human- or artificially generated depending on the context and implementation. For instance, a human accepting simple autocomplete prediction of the rest of the word, phrase, or even line or sentence may be considered as a human edit depending on preferences and sophistication of the underlying implementation.

In some examples, the edit is not just a single edit but a set of one or more edits. For example, the method 200 may detect an edit and then wait a predetermined amount of time (or until an event occurs, such as saving, detecting a change in focus, detecting a change to a different region, or detecting that the edit reaches a level of significance) to see if one or more additional edits have been received to a region of interest. Then, after a threshold amount of time has passed or the event occurs, the entirety of the changes to content during that period can be considered the edit.

In an example, this operation 210 can include operations 212, 214, and 216.

Operation 212 includes determining that the content editor 12 received one or more edits to the content 14 via a human interface device of a computing environment associated with the content editor 12. Such human interface devices can include one or more mice, keyboards, touch screens, microphones, drawing devices, or motion controllers, among others. Detecting receiving content or an edit to content over a human interface device can be done using any of a variety of known key or other input logging techniques. Many content editors 12 or operating systems on which content editors can run have application programming interfaces that can detect keypresses of a keyboard or other input from a human interface device. Responsive to determining that the one or more edits are via a human interface device, the edit can be considered a manual edit. In addition, if an edit is received and it is determined that a human interface device was not used to produce the edit, then that can be a factor in determining that the edit has an artificial source.

In addition, it can be determined whether a feature of the content editor 12 was activated by human input rather than artificial input. For instance, the content editor 12 may have user interface elements for causing an edit to occur to the content 14. The content editor 12 may detect what caused that edit to occur. If the user interface element was actuated by a human interface device (e.g., the click of a mouse), then the edit to the content 14 caused by the actuation can be determined to be a manual edit even though a simple click might not otherwise be sufficient to produce such an edit.

Operation 214 includes determining whether the edit is characteristic of a manual edit or an artificial edit. In some examples, a size or manner of an edit is used to infer that the edit is a manual edit (e.g., authorship of the content is human). For instance, a human typing on a keyboard may tend to enter text or make changes a single character (e.g., because of a single keystroke) at a time. Thus, edits made in that fashion can be determined to be human. Similarly, content generally entered in blocks that correspond to more than one character (e.g., on a token level) may be inferred to be artificial edits. In other examples, more sophisticated techniques can be applied. For example, a machine learning algorithm can be trained to identify a source of one or more edits as being human or non-human based on a manner in which edits are made. For instance, a human may tend to make spelling mistakes, make edits to content in a bursty manner (e.g., because the human author pauses to think after writing a segment of content), and go back and make changes to recently provided content, among other human tendencies. Likewise, artificial authors may tend to provide input in a characteristic manner. A machine learning algorithm can be trained to identify human or artificial authorship based on the presence or absence of such features when analyzing a way in which content is added to the content editor (e.g., using techniques described in relation to FIG. 5). Further, a speed at which content is provided can be used to infer authorship. A human may tend to have particular average or maximum speeds of editing content, which may be different from (e.g., in some instances, less than) that of a generative artificial intelligence. Responsive to determining that the edit is characteristic of an artificial author, the edit can be considered to be an artificial edit. Responsive to determining that the edit is characteristic of a human author, the edit can be considered to be a manual edit.

In another example, sensors can be used to determine whether an edit is characteristic of a manual edit or an artificial edit. For instance, a user may be wearing a smart watch, smart headphones, or other device having sensors. Such a device can detect movement (e.g., wrist movement) characteristic of a human manually entering input (e.g., typing, tapping, swiping, or otherwise interacting). Biometric data can be obtained and used (e.g., heart rate, neural activity, or other biometric data). Likewise, a computer, wearable device, or a peripheral thereof (e.g., a keyboard or mouse) may include a sensor (e.g., a microphone, a camera, or a motion sensor, such as an accelerometer, gyroscope, or force sensor) that can produce data indicative of manual creation of an edit. In some examples, a user is wearing a virtual reality, augmented reality, mixed reality or another kind of headset that has sensors that track or otherwise produce data regarding the wearer's eyes. Such data can be used to determine whether an edit is a manual edit. For instance, the user may have a certain quantity or quality of eye movement or pupil dilation characteristic of making a manual edit (e.g., as opposed to observing an artificial edit). In some examples, an algorithm can be trained on sensor data during manual and artificial edits and then subsequently used to facilitate classification of manual or artificial edits (e.g., using a process similar to that described in FIG. 11).

Operation 216 includes determining whether a generative artificial intelligence is active. Artificial intelligence features may be active or being used to provide the edit. In examples where artificial intelligence features are hosted remotely from the computing device or development environment, querying whether artificial intelligence features are being used may include monitoring submissions to a remote API or responses thereto, monitoring usage at a user account associated with the generative artificial intelligence, other actions, or combinations thereof. In examples where artificial intelligence features are integrated into the development environment, querying whether artificial intelligence features are being used may include analyzing one or more settings or environmental variables of the development environment, surveying installed features or capabilities on the computing device, or monitoring resource usage of such features at the computing device. Responsive to determining that the edit is made while an artificial intelligence is being used to provide the edit, the edit can be considered to be an artificial edit. Otherwise, the edit can be considered a manual edit.

Following operation 210, the flow of the method 200 can move to operation 220, which is shown in more detail in FIG. 2C.

Operation 220 includes determining that the edit satisfies a threshold of significance. The threshold of significance can be with respect to a region that was edited. In some examples, the operation 220 can be performed with respect to a lower-level region and then repeated for higher level regions (e.g., after operation 240). For example, the edit may be to a line of source code. The threshold of significance can be determined with respect to that line of code and then subsequently to higher level regions, such as a function, class, or entire file. An edit may reach a level of significance for one region but not for others.

While in some instances, any level of edit can be sufficient to cause an authorship token to be added or modified, in other examples, a threshold of significance may need to be reached. In examples, the threshold of significance can be a proxy for an amount of significance likely to make the code human authored rather than authored by a generative AI or vice versa. In some examples, the threshold is set by a policy of a user or organization. In some example embodiments, the significance threshold may differ depending on the type of content being created. For the creation of a new line of code or other new content, this can be relatively simple and can often be resolved by determining the authorship of the edit (e.g., a manual or artificial edit). In some examples, an edit can have no authorship until a level of significance is reached. For instance, in many circumstances, the creation of a new line may not be significant and thus may lack authorship until an author adds content to that line. In some examples, the modification of existing content (e.g., code initially created by a generative artificial intelligence) as opposed to the generation of new content can present more difficulty. In some instances, the edit is the accumulation of multiple edits that, on their own, are not significant but in aggregate are significant. Operation 220 can include operations 222, 224, 226, and 228.

Operation 222 includes determining that the edit changes more than a predetermined threshold number of or percentage of units of content (e.g., characters or words of the source code, text, or a region thereof) have changed in a region. The threshold can be a configurable predetermined number. Responsive to satisfying the threshold the edit can be considered significant, otherwise the edit can fail to be considered significant.

Operation 224 includes determining whether the edit is a functional or cosmetic change. Code functionality can refer to aspects that affect the functionality of code (e.g., changing a mathematical operation) rather than more cosmetic changes (e.g., refactoring a variable name, changing an order of arguments or variables passed to various functions, and the like). In examples, the determining can include determining that the edit is to a portion of the source code other than comments, with a comment delimiter being recognized based on the specific type of code or language in use within the development environment. Such determinations can weigh in favor of the threshold of significance being satisfied.

The change being functional or cosmetic may be more easily determinable in the source code context than in narrative documents. In a narrative document, a change can be determined to be to the function of a word, sentence, paragraph, or other region for the purposes of this analysis if the meaning of the region changes. For instance, adding "un" to "believable" changes the meaning of the word. Likewise, changing "the rock is big" to "the rock is small" changes the meaning of the sentence. But changing "the rock is giant" to "the rock is massive" might not be considered to change a meaning of the overall sentence. In an example, a natural language processing library or a large language model is used to determine whether the meaning has changed and a significance of the change of the meaning. In an example, a difference in meaning between words is determined by comparing a distance between the words in an embedding space (e.g., using cosine similarity). In certain instances, one or both of cosmetic and functional changes can be important to authorship. Their relative importance in the analysis can be configurable. The use of embedding space is further discussed below in relation to FIG. 12.

Operation 226 includes calculating a significance score. If the significance score satisfies a threshold, then the edit can be considered significant. Calculating the significance score can take any of a variety of forms. In an example, calculating the significance score includes performing one or more of the following operations and using an associated output thereof: determining whether one or more comments have been modified; determining whether one or more non-comment code portions have been modified (e.g., changes to comments may be considered to be relatively less significant than changes to non-comment portions); determining whether an operation has changed from a first operation to a second operation (e.g., because changes to operations can represent a higher level significance); determining whether a variable has been changed from a first variable to a second variable (e.g., because changes to variables may represent a higher level of significance); determining whether a functionality of the code has changed (e.g., which may have a higher level of significance); determining whether a cosmetic or readability change to the code has been made (e.g., which can have a relatively lower amount of significance); determining whether the manual edit includes pasting (e.g., relatively less significance or ambiguous depending on whether the provenance of the pasted content is known); determining whether the manual edit includes moving code; determining an amount of AI assistance used; determining an amount of development environment assistance used; and determining whether the code has been refactored. For instance, each answer to one or more of the above can be associated with a weight or score. The sum or another use of such weights or scores can be compared the threshold of significance. The relative weights or scores can be customized according to user or organizational preferences. In some examples, the significance of manual edits is compared to the significance of generative artificial intelligence edits (e.g., which may be calculated using the same or similar criteria). In some examples, the above can be provided as input to a machine learning model trained to provide an output indicative of significance.

In an example, the significance score is based on a distance traveled in embedding space as a result of the edit. For instance, where the edit is a change from one word or token to another, the prior word and the new word can be represented as embeddings in embedding space and the distance between the two in embedding space is used as the significance score. Where the edit is to more than one word, embedding space can still be used. In an example, the words can be clustered into a prior cluster and a new cluster. The distance used for significance can be a distance between the clusters (e.g., distance between centroids thereof). In addition or instead, where the edit is the addition of a word, the significance can be measured based on how the addition of the word changes a location of a centroid of a cluster of words.

Operation 228 includes accounting for the generative artificial intelligence's prompt or other input provided in the generation of the content by a generative artificial intelligence. For example, the artificial intelligence may be sufficiently constrained by the prompt, surrounding context, or human input that the resulting content should be considered to be authored by a human even if produced by an artificial intelligence. In some examples, the significance can take into account a level of intelligence or creativity of the artificial intelligence used to produce content. For example, different kinds or levels of artificial intelligence or content assistance can be graded with different levels of intelligence and treated differently for the purposes of authorship depending thereon. For example, content produced by simple assistive features like spell check, autocomplete (e.g., finishing a word based on what a user already began typing), or rudimentary intelligent code completion (e.g., suggesting functions or variables for selection or confirmation by a user based on code scope) may be considered to be produced by a human author even though such features may include relatively sophisticated levels of artificial intelligence. The threshold required to be met for content produced by such systems may be relatively low or even nonexistent. By contrast, more sophisticated intelligent systems like GITHUB COPILOT may be considered as setting a higher threshold for human authorship. Some assisting programming tools may allow for configurable levels of help and the greater the amount of judgement or creativity taken on by the assistive feature, the greater the threshold of author involvement there may need to be for human authorship to be considered to have taken place. In some examples, prompts used to generate content can be stored in association with the authorship token and used to demonstrate sufficiency of creativity or lack thereof. Such prompts can be stored in a same location as the authorship tokens or in a separate location.

In some examples, sensor data (e.g., data from sensors described above in relation to using sensors to determine whether an edit is characteristic of a manual edit or an artificial edit) can be used to determine significance of an edit. For instance, biometric data of a person may respond differently depending on whether they are observing a significant edit or an insignificant edit (e.g., pupil dilation or eye motion may vary depending on whether an edit is significant because of how a person is processing or reading the edit).

In some examples, accounting for the prompt can account for an amount of correspondence between the prompt and the resulting content or edit. For example, if there is a sufficient amount of control present in the prompt that constrains the output, then the output can be considered to have authorship that matches the authorship of the prompt (e.g., human authorship if the human wrote the prompt). But if there is not a sufficient amount of control, then the authorship of the resulting content can be determined to have artificial authorship. In an example, an amount of control can be tied to the temperature of the artificial intelligence (e.g., large language model) used. A sufficiently low temperature (e.g., a temperature below a threshold) can lower an unpredictability of the output to such a point that authorship remains with the author of the prompt.

In addition to or instead of analyzing the significance of each individual edit, the significance of a collection of or a history of edits can be determined. For instance, the method 200 may detect an edit and then wait a predetermined amount of time (or until an event occurs) to see if one or more additional edits have been received to the region of interest. Then, after a threshold amount of time has passed (or a specific event has occurred, such as saving, compiling, running, or committing the code) since the last edit has been received, the method can analyze the collection of received edits for their significance with respect to the region. In an example, a comparison is made to the string of text before and after edits are received. In some examples, edits (or proxies thereof) can be accumulated during a session (e.g., in memory, in a buffer, in human authorship tokens, in log files, or elsewhere) and then upon saving, periodically during the session, or at another time, the accumulated edits and can be analyzed for their significance in their various regions and authorship tokens are generated accordingly. In an example, keylogging or other tracking is performed to generate manual edits, then they resulting log is analyzed for significance, human authorship tokens are generated, and then the log is deleted (e.g., to preserve privacy, free up space, or for other reasons). A comparison of the changes to the file 112 since the file was last saved (or at another point in time) can be made and human authorship tokens are created, updated, or removed based on those edits. This can facilitate handling situations in which content is added and then removed, reduced, or significantly expanded, thereby improving the accuracy of the authorship tokens in labeling content.

In some examples, operation 220 includes operation 1700, which includes determining the significance based on a suggestion associated with the edit. Operation 1700 is discussed in more detail in association with FIG. 17, below.

Following operation 220, the flow of the method can move to operation 230.

Operation 230 includes determining that a region associated with the edit lacks an authorship token. The operation 230 can be performed responsive to determining that the edit satisfies the threshold of significance as determined in operation 220. This operation can include searching contents of the region of interest for the authorship token itself (e.g., using regular expressions configured to find regions of content having a format associated with authorship tokens).

This operation can include determining the one or more regions in which the significant edits were made. The region can take any of a variety of different forms depending on a level of granularity desired by a user. Where the content of the text being edited is source code, the region can include forms such as: a line of source code, a lexical scope, a function level, a class level, a file level. Where the text is prose (e.g., including narrative content and as opposed to source code), the region can take the form of a word, sentence, paragraph, page, chapter, section, or entire work. Where the text is poetry, the region can take the form of a word, sentence, paragraph, line, meter, verse, or other logical format.

In other examples, this operation need not be performed. The creation of a new authorship token need not be dependent on the lack of a previous token. In some examples, multiple tokens can be created that relate to the same or overlapping content. Later, the combination of the contribution (e.g., as expressed by the presence of or content contained within the multiple human authorship tokens) can be assessed to determine whether an overall work reaches a threshold of human or artificial authorship. In some examples, a prior authorship token is updated (e.g., rather than provided as in operation 240 below) based on the content of the edit.

Figure 2B:
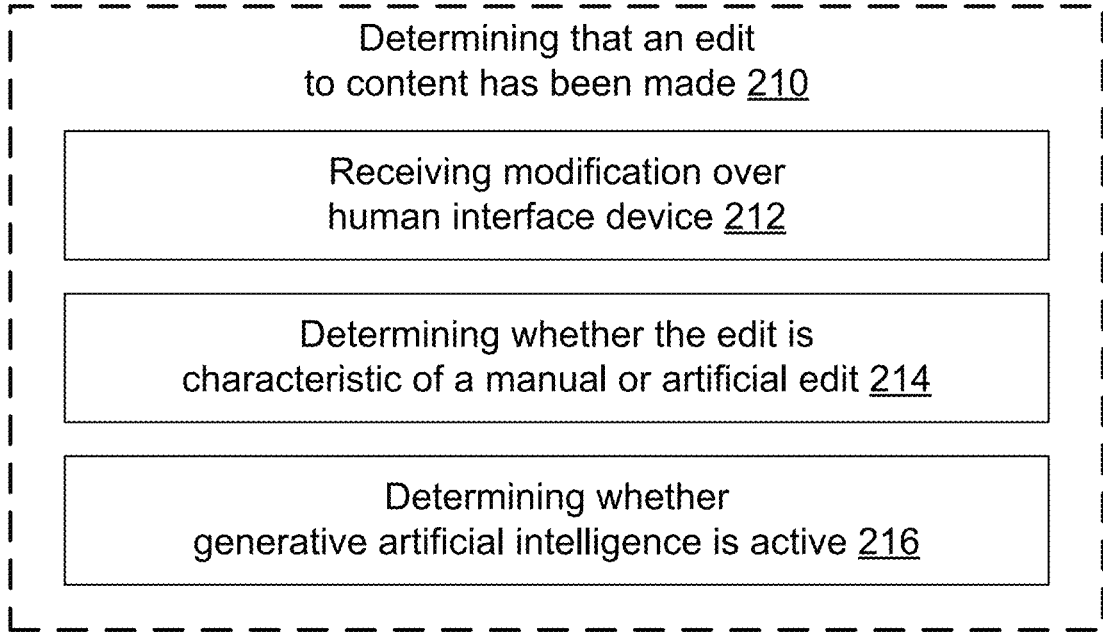
Figure 2D:
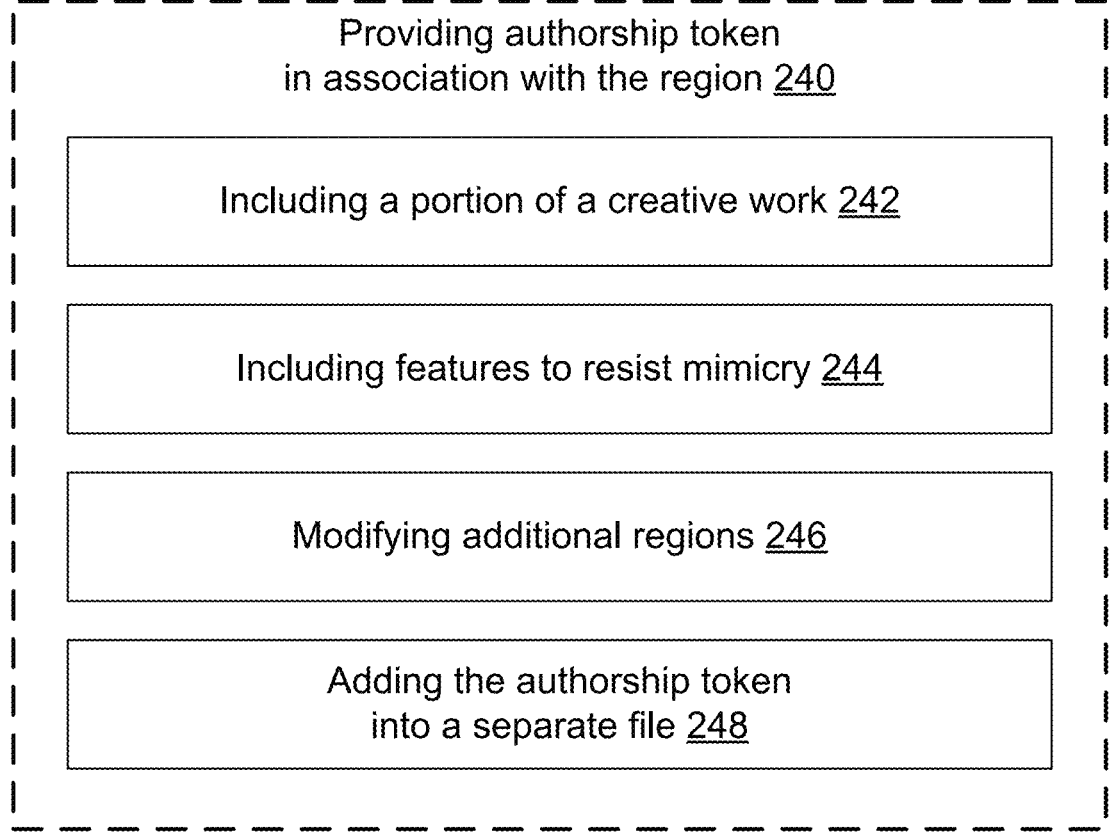

Following operation 230, the flow of the method 200 can move to operation 240, which is shown in more detail in FIG. 2D.

Operation 240 includes providing an authorship token in association with the region. The operation 240 can be performed responsive to determining that the region associated with the edit lacks an authorship token or lacks an authorship token consistent with the author of the edit. The authorship token can take any of a variety of useful forms. In many examples, authorship tokens can convey information regarding whether an associated region has or is associated with human or artificial authorship. Other authorship types or useful information can be conveyed in an authorship token. For instance, the authorship token can convey whether the author is internal to or external from an organization or what the source of the authorship is. In some examples, the authorship tokens can also express uncertainty regarding authorship. For example, authorship may be unknown and the authorship token can describe that lack of knowledge. Authorship information can be expressed in any of a variety of ways. In an example, the human authorship token includes a human-readable plain text description of authorship (e.g., "human author", "artificial author", "COPI-LOT-v2-Authored", "internal human author", "internal chatbot author", "external chatbot author", "unknown author", or "authored by human John Doe with minor support by chatbot"). In addition or instead, the authorship information can be compressed into a smaller format where symbols, characters, or abbreviations are used to convey authorship or keys to a lookup table are included. In some examples, the authorship is described in a form other than plain text.

In an example, the authorship token is included in a comment within source code (e.g., within a comment 16 as illustrated in FIG. 1). The authorship token can be appended to the end of a line of code, can be applied to a preceding line of code, or be applied in other locations. In some instances, authorship tokens are placed in particular locations before or after traditional code comments (e.g., which describe functionality of the code at issue). The comment can be created if one does not already exist. The authorship token can be added to the beginning or end of the comment. The comment can be inserted at a beginning of the region, an end of the region, or between a beginning or end of the region. In some examples, when a file is saved or at another predetermined time, the authorship tokens in a file can be automatically relocated to a more convenient location (e.g., before or after traditional comments or to a different region).

The authorship token can be predetermined and without respect to the substance of the edit. For example, in a C++ source code file, the token could be simply the "//" single-line comment marker placed at the very end of the line, where it would not interfere with any code or other comment. Alternatively, in the same circumstances, the editor may place a single line comment marker followed by a known series of characters to indicate human authorship, such as "//H". In some examples, the human authorship token can include information about the manual edit (e.g., a number or percentage of characters of the region that have changed) without including the actual changes or without substantively describing the changes (e.g., without being able to reproduce the specific changes merely from the information contained within the authorship token). The inclusion of such data can allow the information to be used later when determining whether to update authorship. The authorship token can be without respect to a form or function of the region in which the edit occurs (e.g., the authorship token can lack information describing the code of interest).

The authorship token can include one or more uncommon characters of a character encoding standard. This can be used to resist confusion and make it more likely to be identified compared to traditional comments that may be made to the source code. An authorship token can include a name associated with the developer or author (whether human or artificial) making the edit.

In some examples, the content of the authorship tokens can vary depending on the region. For example, where the file is a source code file, individual lines of code can include authorship tokens specifying a particular level of detail, whereas authorship tokens at a function, class, or file level can include relatively greater or lesser levels or kinds of detail. For instance, a line may specify a number of characters or words that were the product of human authorship, whereas a function may include a number of lines that were the product of human authorship (or were the product of more than a threshold amount of human authorship), and whereas a class may include a number of functions that include human authorship (e.g., more than a threshold amount thereof). Of course, authorship tokens may include any of variety of kinds or amounts of information. A person of skill in the art may create a format of authorship tokens that fits with a desired use case.

In some instances, the authorship tokens include an identifier such that information about authorship can be found in another file or in another location within the same file. For instance, the authorship token can be of the form "{H123abc}" where "H" indicates that the associated region has human authorship ("A" may be used to indicate artificial authorship) and "123abc" may be usable to find a portion of another file that describes more about the authorship of the region, such as information about the provenance of the region or its edits, prior authorship, other information, or combinations thereof.

In some examples, an authorship token is stored in a format that is not readily recognizable or editable to a human or an AI. In an example, one or more authorship tokens are stored in a QR code or another visual code that encodes the data.

Operation 240 includes operations 242, 244, 246, and 248.

Operation 242 includes including a portion of a creative work. This can be done to add a copyrighted work to the source code to enhance the copyrightability of the source code file. Including the portion can include accessing a library of creative works that the editor has access to and permission to use. The creative work can be a creative work that is owned by the user or an employer of the user. A snippet of the creative work can be copied and added to the authorship token or added in association with a line of code to which the authorship token is present. The creative work can continue across multiple human authorship tokens. For instance, the portion of the creative work is a continuation of a prior portion of creative work part of a prior authorship token. In an example, when an authorship token is added between two existing human authorship tokens, the corresponding portions of the creative work are automatically updated so they flow in the correct order. In some examples, the creative work can be appended to even that content that was not authored by a human. The addition of such creative work could be used to demonstrate the copyrightability of the source code. For instance, a first authorship token may include "Lorem ipsum dolor sit amet", a second may continue "consectetur adipiscing elit", a third may continue further "sed do eiusmod tempor", and so on, where the standard Lorem Ipsum passage is replaced by a copyrighted work of the author or an organization of the author. In some examples, copyrighted works are added only to regions associated with artificial authorship tokens and not human authorship tokens. In other examples, they are applied regardless of whether human or artificial authorship is specified.

Operation 244 can include adding one or more features to resist mimicry or tampering. A potential challenge is that once generative artificial intelligence learns that humans tend to put human authorship tokens in their text (manually or automatically), the generative artificial intelligence will add those human authorship tokens too. Further, a malicious human might manually add a human authorship token content that an artificial intelligence wrote or add an artificial authorship token to content that a human wrote. The features used to resist mimicry can take any of a variety of forms. In one example, the authorship token (or characteristics thereof) can be added to or derived from an exclude list for the generative artificial intelligence associated with the editor 12. Thus, the generative artificial intelligence would resist producing such tokens because it is prohibited from doing so. In some examples, authorship tokens are removed from training data or context data prior to their use with an artificial intelligence.

In another example, the authorship token can include a hash, optionally signed by a private key. The hash can be of the region, the manual edit, or another useful item that is optionally salted with a private or hidden value to resist reverse engineering. Based on the nature of hash functions, it would be difficult if not impossible for the generative AI or a malicious human to learn the hash function (and salt) used or the input to the function that produced the given result. Thus while artificial intelligence may learn to produce something that looks like a hash but that, upon trying to verify the hash, the verification would fail because the mimicked hash was not produced according to a predetermined method. In some examples, the authorship token can be cryptographically signed by a key associated with the authorship token instructions or a program running an authorship engine. Beneficially, this could resist even a human attempting to tamper with the human authorship tokens (e.g., by copying and pasting existing human authorship tokens into regions lacking them) because reproducing the signature would be difficult or impossible for the human to do. In some examples, the resisting can occur during or in response to user saving, running, or compiling the file or at another predetermined time or every time an authorship token is added. At that time, a hash of the region can be taken and put into the human authorship token. Waiting until a predetermined time can decrease an amount of resources consumed and ensure that the user is sufficiently done editing before creating the hash.

In yet another example, the content editor 12 can prohibit or prevent the direct modification of authorship tokens by human or artificial authors. In an example, only the content editor 12 (or another program running the authorship token instructions) is permitted to modify the authorship tokens. For instance, an authorship token portion may be encrypted or otherwise locked by the content editor 12 or the another program. In some examples, the direct modification of authorship tokens is at least partially permitted but tampering is detectable. For instance, the content editor 12 or the another program can generate a signed hash of the authorship tokens, another portion of the content, or the entire content. Then that hash can be used to detect tampering with the file or otherwise provide an indication that the authorship tokens may no longer be accurate. In an example, a version control system or another program may deny saving or committing a file where the authorship tokens are no longer accurate.

Operation 246 can include modifying additional regions. In some instances, although an edit is made to one region, other regions are also affected by the change. For example, an edit may involve combining or splitting regions. In another example, an edit to region corresponding to a single line of code may nonetheless affect authorship of a larger region (e.g., a function or class) containing that line of code. A function may include a function header (e.g., that includes definition of the function's return value type, the function's name, and the arguments that the function) and one or more lines of code in the body of the function, including a line with a return statement. A change to the one or more lines of code in the body may be significant enough to change the authorship of the entirety of the function, even if some portions of the function (e.g., the header) were written by another author or type of author. Likewise, an edit to a function may result in an entire class containing that function changing authorship if the edit is significant enough. So too might a change to a class or other region of a file cause an entire file to change authorship. Whether and to what extent authorship changes can be defined by parameters and can be determined in a similar way that an edit's significance is determined (see operation 220, above). Further, even if the edit to one region is not sufficient to change the authorship of a higher-level region, it may be sufficient to cause the higher level region to indicate mixed authorship and to mark other regions at the same level as the one to which the edit was made as having particular authorship. For instance, an entire class may be authored by an artificial intelligence and there can be an artificial authorship token proximate the class definition to indicate that the entire class is authored by an artificial intelligence. Lower-level regions (e.g., class variables, class functions, and individual lines of code within those functions) may lack authorship tokens (e.g., to avoid visual clutter because authorship is already described by the class). If a different author modifies a lower-level region of that class, that lower level region can be updated with an authorship token corresponding to that author. In some examples, authorship tokens are not applied other regions under that class because it can be assumed that non-labeled regions have a same authorship token as a parent region. In other examples, such other regions are labeled with authorship tokens corresponding to their parent region.

Operation 248 can include adding the authorship token to a separate file 114. In such examples, the authorship token is not added directly to the file in which the manual edits are made (e.g., which stores the content). In some examples, the authorship token is added to a separate file, such as a log file, that is in association with the file being edited. The separate file 114 can have a portion associated with the region. The authorship token in the file 114 can be produced such that one is able to determine which region of the file 112 has human authorship. For example, the log file 114 could include one line for each line in the content file 112 and list authorship information, line for line. In another example, the log file 114 could reference lines in the content file 112 by line number and provide authorship information for each line of the content file 112 that contains text. In another example, the log file 114 could refer to regions of content in the content file by title, description, number, name, or other signifier based on the content to provide details of authorship for the given region. This log file 114 may be stored as simple text, XML file, JSON file, tab-delimited file, comma-delimited file, rich text file, image file, PDF file, or any of hundreds of program-specific file implementations such as Microsoft Word document, Microsoft Excel file, or the like.

In some examples, the operation 240 includes sending a communication to a server or calling an application programming interface associated with a server or another program regarding one or both of the edit or the authorship token. The server can be a remote device that logs authorship of contributions to source code. The server could store authorship tokens directly or store additional information regarding an authorship token stored in the file 112. Storage by the receiving server or program may be accomplished through creation of a log file 114 as described above, through storage in a database (such as SQL-server, Postgres database, MongoDB, Oracle database, or any such similar tool), or any other known file 114 and data storage system. Such system could be local or remote to the receiving server or program. Though often referred to herein as being a single file for convenience one or both of the content file 112 and the log file 114 can be broken up into multiple separate files or collections of files.

In some examples, following operation 240, the flow of the method returns to operation 220 to determine whether the edit reaches a threshold of significance for a different region (e.g., a higher-level or lower-level region). For instance, whether the change to a line reaches a threshold of significance for a function, class, or file. Or whether a change to a sentence reaches a threshold of significance for a sentence, paragraph, section, or document.

Figure 2E:
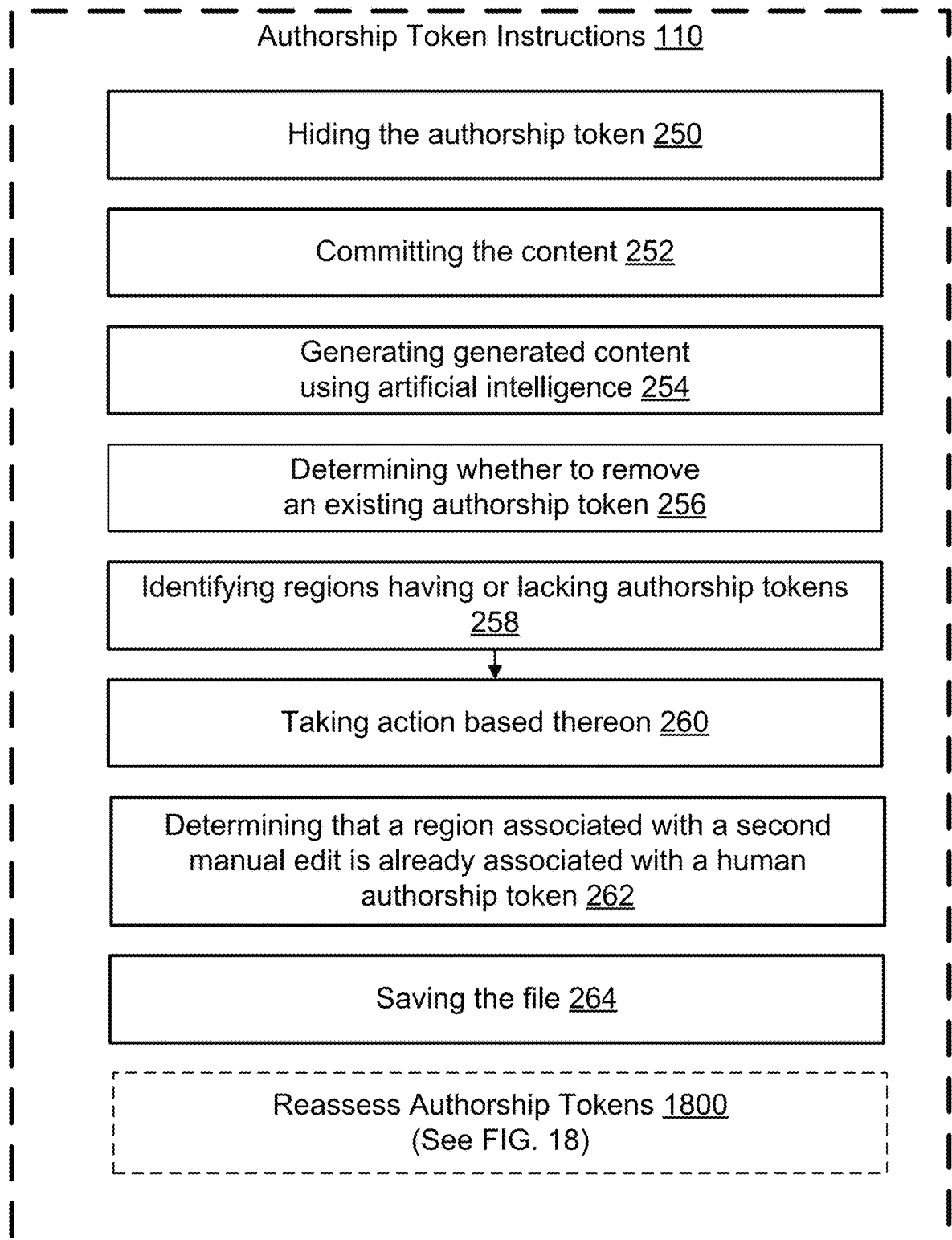

In some examples, the method 200 includes additional operations, including those shown in FIG. 2E. Such operations include operations 250, 252, 254, 256, 258, and 260, and method 1800, among others.

Operation 250 includes hiding authorship tokens. The authorship token can be hidden to, for example, preserve that information but resist distracting a user or resist tampering by the user. The authorship token can be automatically collapsed by the content editor but can be expanded by the user on demand, if permitted by a policy. In other examples, a user may need to have sufficient permissions to expand or view an authorship token within the content editor. The underlying content of the authorship tokens may be hidden from the user by obfuscating them via encryption. An authorship token can include a plurality of zero width characters that encode information (e.g., information described as being included in the human authorship token elsewhere herein). In an example, the authorship token are automatically hidden from the user by the content editor, but the authorship token may nonetheless be accessible for updating and/or analysis within the platform (e.g., by authorship token instructions). In some examples, hiding the authorship tokens include storing the authorship tokens in a location or format that is not readily accessible to the user.

Operation 252 includes committing the content, which can include committing a file containing the content using a version control system that associates the commit with the developer. While illustrated as being part of the authorship token instructions, this operation is often performed by a separate application or as part of a process managed by the content editor. In examples, the version control system may receive the commit of a new file or changes to an existing file as having been done by the author. In some examples, the version control system parses the file and attributes authorship to those regions having authorship tokens. Generative artificial intelligence authorship can be attributed to those regions lacking human authorship tokens.

Operation 254 includes generating generated content (e.g., making an edit) using an artificial intelligence (e.g., generative artificial intelligence). While illustrated as being part of the authorship token instructions, this operation is often performed by a separate application or as part of a process managed by the content editor 12. The generating can be based on, for example, the source code and the generated content can be inserted into the file. The content generated this way can lack a human authorship token or include an artificial authorship token. However, if the user subsequently sufficiently manually edits the generated code, then a human authorship token may be applied (e.g., based on how the human token instructions are configured and based on sufficiency of the manual edits).

Operation 256 can include determining whether to remove an existing authorship token. Where the generated content is within a region having a human authorship token, it can be determined whether to remove the human authorship token. Where the generated content is within a region having an artificial authorship token and new content is by a different artificial author, then it can be determined whether to remove the existing artificial authorship token. In examples, such a determining can be the same as or similar to the determination of whether the edit satisfies a threshold of significance. The determination can be made whether the generated content passes the threshold. In addition or instead, it can be determined whether the existing content (or surviving content if the generated content changes some of the existing content) is significant given the generated content.

Operation 258 includes parsing the file and identifying one or more regions having or lacking authorship tokens. This can include paring a file containing the content and identifying one or more other regions having or lacking one or more authorship tokens.

In examples, the operation 258 can further include or be related to operation 260. The operation 260 includes taking an action based on the output of operation 258. Thus, the method can include providing a report regarding an amount of human or artificial authorship of the source code based on the one or more human regions and the one or more other regions. The method can include providing a copyright notice regarding the file that indicates human authorship of the one or more human regions. The copyright notice can indicate a lack of human authorship of the one or more other regions. In examples, the action includes providing the one or more human regions to an artificial intelligence for training. But a training process may resist providing the one or more other regions as to the artificial intelligence for training. Thus, quality of training materials may increase through the providing of human authored contend rather than synthetic content already produced by a generative artificial intelligence.

Operation 262 can include determining that a region associated with a second edit is already associated with an authorship token. Further, responsive to determining that the region associated with the second edit is already associated with an authorship token, the authorship token in association with the region can be updated or preserved. This can include updating the authorship token to correspond to the authorship of the second edit.

Operation 264 includes saving the file 112 containing the content 14 and the authorship tokens 16. In an example, the operation includes saving the file 112 in a rich text format. The file 112 can be formatted according to a document standard, such as ISO/IEC 29500-1:2016 (the standard associated with the popular MICROSOFT DOCX file format) or a successor standard. In an example, the file 112 stores data using XML. The XML may include tags associated with authorship tokens. The XML may include one or more dedicated tag for distinguishing a portion of the content 14 of the file 112 as being authored by a human or an artificial intelligence. In an example, the operation 264 includes saving the file 112 in a plain text format. The file 112 may lack stylistic information. The file 112 may have a file extension associated with a programming language, such as Python (.py), C (.c or .h), C++ (.cpp or .c++), C# (.cs), or Rust (.rs). The file 112 may be directly usable by a compiler or an interpreter of a programming language. The file 112 may be in binary format. The file 112 can be saved with or in association with metadata describing authorship of the content in the file 112. For instance, the metadata can describe or be used to describe a number of or percentage of characters, words, or other delimitations of content as that have certain kinds of authorship (e.g., human or artificial).

Figure 2F:
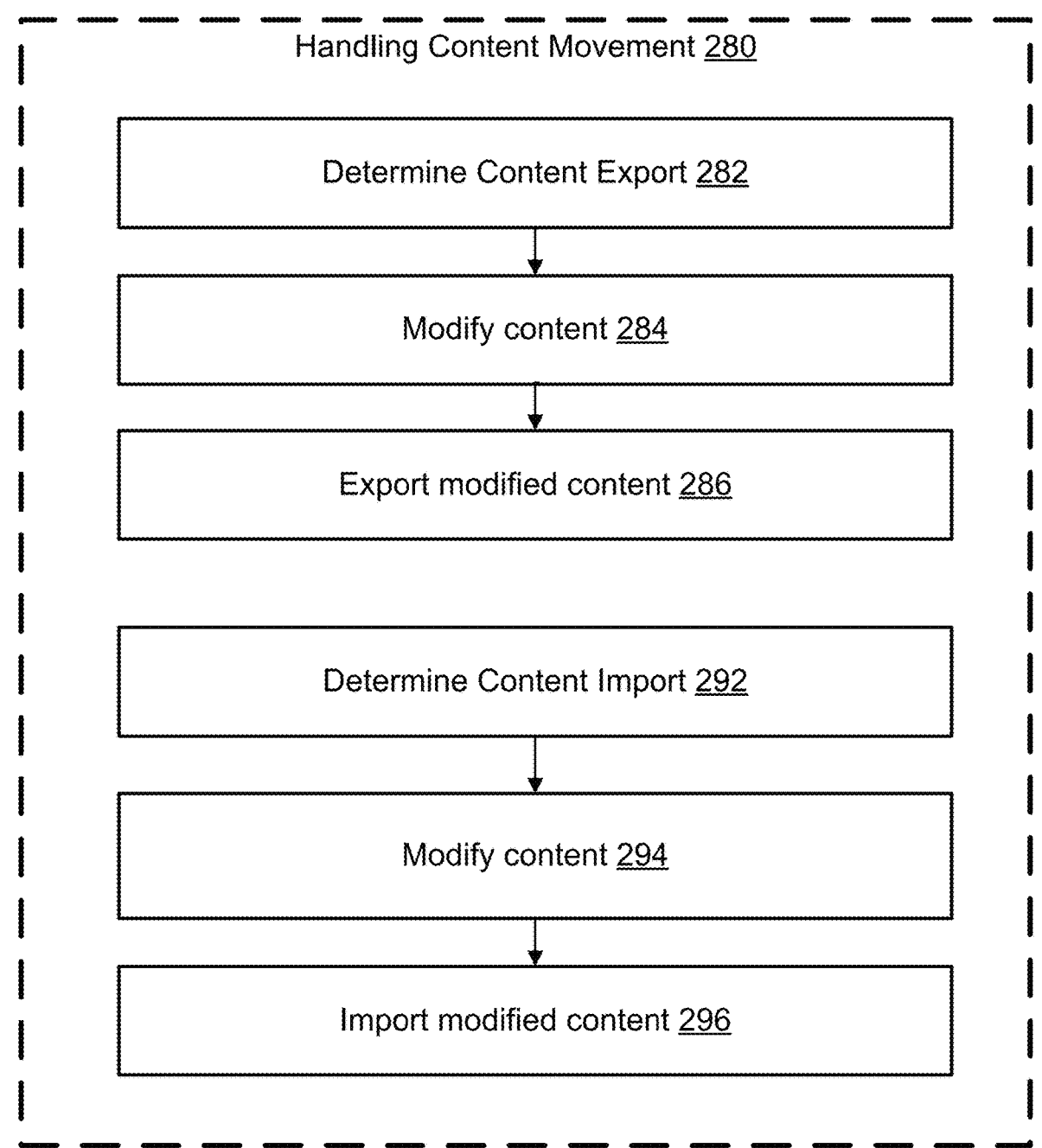

The method 200 can further include operation 280, which is described in more detail in FIG. 2F.

Operation 280 includes handling content 14 movement. During use of the content editor 12, content may be moved to the content editor 12 from another source (e.g., a location external to the content editor 12, such as a website or another program), moved within the content editor 12 (e.g., from another location within a same file 112 or from a different file open in the content editor), or moved from the content editor 12 to another source. Operation 280 can include operation 282 and operation 292.

Operation 282 can include determining that content is being exported from the content editor 12, such as from the file 112. Content exportation can include detecting a cut or copy operation is occurring on some or all of the content 14, detecting that content is being dragged out of the file 112, detecting that a screenshot is being taken, detecting that an export operation is selected from a menu of the content editor 12 (e.g., a function called "save as" or "export to"), detecting other exportation occurrences, or combinations thereof. In an example, detecting such operations includes using one or more APIs of an operating system on which the content editor 12 is running. In addition or instead, this can include detecting user input corresponding to exporting data. The detecting can include detecting a particular operation within the content editor is being activated. Detecting can occur in other ways too. In some instances, the content editor 12 includes a special export option that relates to authorship data, and determining that content is being exported can include detecting that such a special option was activated. Following operation 282, the flow of the method can move to operation 284.

Operation 284 includes modifying the content being exported. The modification can take any of a variety of forms. Authorship tokens can be removed from the content being exported. Authorship tokens can be added to content being exported (e.g., where the content being exported lacks an authorship token but is within a region associated with an authorship token or where the authorship token is stored in another file or another part of the file). For example, an authorship token of the region from which the content is being exported is added to the content being exported. Modifying the content can include removing content associated with particular authorship. For example, the content being exported may include multiple different kinds of authorship (e.g., human, artificial, internal, or external, among others). An entity controlling the content editor 12 may have policies regarding whether content having a particular kind of authorship can be exported. Thus, the content can be modified to remove content having authorship that is not permitted to be exported. In some examples, the content is modified to indicate that certain content was not exported.

In some examples, modifying the content can include adding or modifying authorship tokens to improve use by other programs. For instance, where authorship tokens are hidden or stored elsewhere (e.g., in another file), they can be unhidden or otherwise added to content being exported. In such a manner, a program that will receive the content can obtain the authorship information in a readily accessible manner. Where authorship tokens are obfuscated (e.g., hashed or encrypted), the authorship token can be decrypted or otherwise converted into a format that is easier for other programs to use.

Following operation 284, the flow of the method can move to operation 286.

Operation 286 includes exporting the modified content. This can include ensuring the content being exported in the manner determined in operation 282 is modified according to operation 284.

Operation 292 can include determining that content is being imported into the content editor 12, such as into the file 112. Content importation can include detecting a paste operation is occurring, detecting that content is being dragged into of the file 112, detecting that an import operation is selected from a menu of the content editor (e.g., a function called "import"), detecting other importation occurrences, or combinations thereof. In an example, detecting such operations includes using one or more APIs of an operating system on which the content editor 12 is running. In addition or instead, this can include detecting user input corresponding to importing data. The detecting can include detecting a particular operation within the content editor 12 is being activated. Detecting can occur in other ways too. In some instances, the content editor 12 includes a special import option that relates to authorship data, and determining that content is being imported can include detecting that such a special option was activated. Following operation 282, the flow of the method can move to operation 294.

Operation 294 includes modifying the content being imported. The modification can take any of a variety of forms. Authorship tokens can be removed from the content being imported. Authorship tokens can be added to content being imported. For example, an authorship token of the region from which the content is being exported is added to the content being imported. Modifying the content can include removing content associated with particular authorship. For example, the content being imported may include multiple different kinds of authorship (e.g., human, artificial, internal, or external, among others). An entity controlling the content editor 12 may have policies regarding whether content having a particular kind of authorship can be imported. Thus, the content can be modified to remove content having authorship that is not permitted to be imported (e.g., content from outside of the organization). In some examples, the content is modified to indicate that certain content was not included.

In some examples, this includes treating the importation as an edit and analyzing its significance. If the importation is significant, then an authorship token for the imported content is determined and added. In some instances, the authorship token simply indicates that the content is obtained from an external source or has unknown authorship. In some examples, authorship is determined based on existing authorship tokens in the content being imported. In some examples, authorship is determined based on analyzing the source of the content. For example, the content may be from a website or file and the nature of the importation process may indicate such a location (e.g., a uniform resource locator or identifier of the source). That indication can be analyzed and used as an author. For instance, the domain of the URL can be used as the author. In other examples, an artificial intelligence is applied to the source and used to determine whether that source includes an indicia of authorship and then that is used. In some examples, the entire source designator is used as an author. In some examples, a human or an artificial agent (e.g., a program running or using a large language model trained or configured to take such an action) follows the source designator (e.g., URL) and with the benefit of knowing what content is being imported (e.g., based on the content of the clipboard), can investigate the source and determine the authorship of the content. Where the content is from a blog post or a comment, the author of the comment or blogpost can be indicated as the author. Where the content is from another file that file or surrounding files in a hierarchy can be analyzed to determine authorship (e.g., based on the content of a readme file, a licensing file, metadata of files, other indicators, or combinations thereof). Where the content is from a source repository, a history of the repository can be analyzed to determine the author of the change (e.g., using git blame or another feature). The resulting determination of authorship can be used to create an authorship token. In some examples, the authorship token may include known and unknown information. For instance, a name of the author may be included but it may be unknown whether that author is the true author or whether that author used an artificial intelligence to generate it. An indication of such a lack of knowledge may be added. In some instances, human versus artificiality can be determined based on the date on which the content was first published or otherwise created. Prior to a certain date, it may be assumed that all content was human authored rather than potentially generated by an artificial intelligence. In some instances, a user or an organization may prefer to label information obtained external to the organization with an "external" label or treat is as being "artificial" rather than human generated for copyright, auditing, or other purposes. The human or artificial agent may determine whether the content is from an internal or external source depending on the source location (e.g., a local file, an intranet website, or an external website) and cause a corresponding authorship token to be generated.

In some examples, the content can be analyzed and the nature of the content may provide an indication of its source. For instance, the content being imported can be in the form of a chat log of a discussion between a human and an AI chatbot. An authorship engine can detect such a format and determine that the content being imported is artificial or add authorship tokens to particular portions of the content (e.g., human authorship to the human aspect of the content and artificial authorship to the artificial aspect). In some examples, the authorship engine can cause a prompt asking a user about the provenance of the content. For instance, the user may paste the content and provide input to the content editor 12 indicating that the content being pasted has human authorship or artificial authorship. However, this can leave open the possibility of inaccurate authorship information being stored (e.g., because the user is lying or is mistaken regarding the authorship of the pasted content). In some instances, authorship tokens can be associated with a reliability metric indicating a reliability of the authorship token. Content having manually entered authorship tokens may have less reliability than authorship tokens that are automatically determined.

In some examples, modifying the content can include rewriting the content with a large language model or having a human author manually edit the content such that authorship of the content being imported corresponds to a new author. For example, sufficient modifications can be made to transform authorship of the content. Sufficiency of the modifications can be determined using the same or similar techniques described above in relation to operation 220. In some examples, the modifications can include converting the content to a format or style preferred by the user of the content editor 12.

In some examples, modifying the content can include adding or modifying authorship tokens. For instance, the content may include authorship tokens in a different format from a format used in the file 112. The authorship tokens may be converted from a first format to a second format and the content modified to include the authorship token in the second format. In an example, the authorship tokens may be removed from the content being imported and be hidden or stored elsewhere (e.g., in another file). Where authorship tokens of the file 112 into which the content is imported are obfuscated (e.g., hashed or encrypted), the authorship tokens of the content being imported can be encrypted, hashed, or otherwise converted into the format used by the file.

Following operation 294, the flow of the method can move to operation 296.

Operation 296 can include importing the modified content. This can include adding the modified content to the file 112.

Example Content Editor

Figure 3:
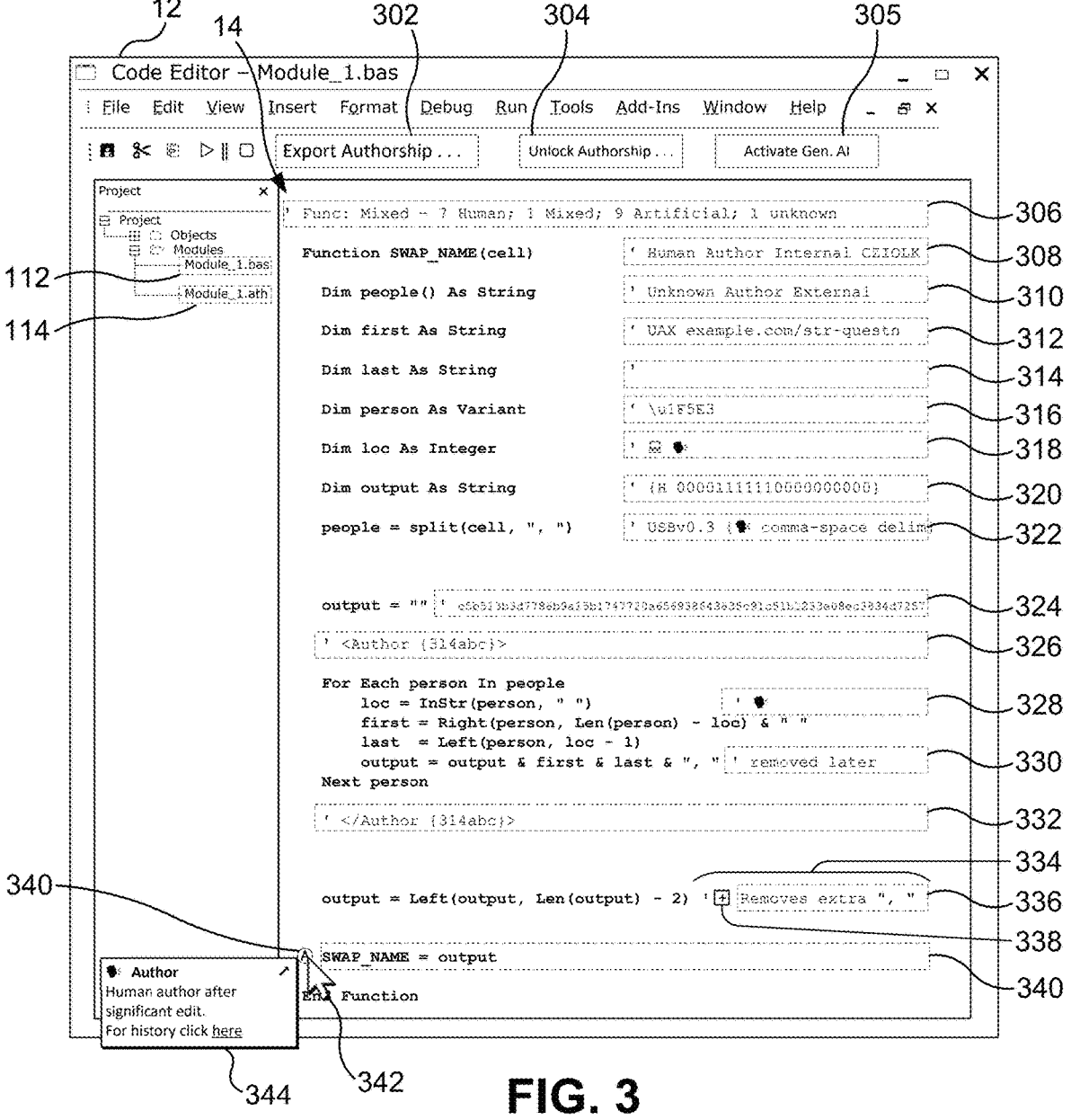
FIG. 3 illustrates an example text editor displaying a file having source code content that includes comments with varying styles of authorship tokens.

FIG. 3 illustrates an example content editor 12 (e.g., specifically a development environment) displaying a file 112 having source code content 14 that includes comments 16 with varying styles of authorship tokens. Here, the file is a visual basic file where comments begin with a ' and continue until the end of the line. In the figure, source code content 14 is bolded and comments are not bold. In many implementations, a single file 112 would likely have a small number of different kinds of authorship tokens. The variety of token formats here is for example purposes only showing some of the various ways that authorship tokens can be provided.

User interface element 302 is a button that, upon activation, causes the content editor 12 to export the content 14 in a manner that preserves authorship tokens, such as in the way described in relation to operation 282.

User interface element 304 is a button that, upon activation, causes the content editor 12 to unlock editing of authorship tokens. For example, the content editor 12 may selectively lock and unlock editing of authorship tokens. When locked, the text editor 12 prevents a user from editing portions of the content 14 that correspond to authorship tokens. When unlocked, the content editor permits a user to edit the portions of the content 14 that correspond to authorship tokens. In some implementations, the content editor 14 may require the user to demonstrate sufficient permission to unlock the editing (e.g., based on a role or status of the user or based on the user providing a password). In some instances, unlocking, locking, or editing authorship tokens may be logged in a logging system so that manual changes to authorship can be audited. In some examples, the user may be required to provide a reason for the change to authorship, that may or may not need to be approved. In some implementations, where the authorship token is designed to resist mimicry (e.g., by hashing or otherwise obscuring the authorship tokens), unlocking the authorship tokens may un-obfuscate the authorship tokens. After modification of the formerly obfuscated authorship token, the content editor may re-obfuscate the authorship token.

User interface element 305 is a button that, upon activation, causes the content editor 12 to activate a generative AI function to generate content 14 within the content editor 12. For example, when the generative AI function is enabled, generative AI may suggest new content to the user at the location of the cursor within the text. That may be the same cursor location where human text input would be provided if entered via a human interface device of the computer running the content editor 12. In addition or instead, actuation of the button 305 may create a user interface element configured to provide a generative AI chat interface with the user for responding to user prompts. Depending on whether and how the feature is implemented and how the user interacts with the feature, information can be provided to the editor 12 or an authorship engine to facilitate the addition of authorship tokens to the data.

Comment 306 includes an authorship token in the form of "Func: Mixed—7 Human; 1 Mixed; 9 Artificial; 1 Unknown". The authorship token is a comment on its own line before a function that it describes. The authorship tokens indicates that it describes the region corresponding to the function (e.g., by stating "Func:") that begins on the following line (and ends with the line that reads "End Function"). The authorship token further designates that the region corresponding to the function has mixed authorship by stating "mixed". The authorship token indicates how many lines of code within the region have human, mixed, artificial, and unknown authorship (seven, one, nine, and one, respectively). In some examples, these numbers can automatically be updated when authorship of the lines within the region are changed.

Comment 308 includes an authorship token in the form of "Human Author Internal CZIOLK", which indicates that the author is a human author internal to the organization and having a user identifier of CZIOLK. In an example, the user identifier may be the user identifier of the human user that was associated with the content editor 12 (e.g., via a user account) when the associated region (line) was authored. The identifier of that user may be obtained and used as part of the human authorship token. In other instances, the user identifier of the human user may nonetheless be used even when there is an artificial author, such as for tracking or compliance purposes.

Comment 310 includes an authorship token in the form of "Unknown Author External", indicating that the line is from outside of the organization (e.g., copied and pasted from a website) and that the author of that region is unknown. The author may be unknown in the sense that the individual author is unidentifiable or that it is unknown whether the author was human or artificial. The authorship token may include additional content indicating as much.

Comment 312 includes an authorship token of the form "UAX example.com/str-questn". Here, "UAX" may indicate that there is an Unknown Author External to the organization and that the source of the content in the region (e.g., where the region was copied from in whole or in part) is the URL "example.com/str-questn".

Comment 314 includes an authorship token in the form of an empty comment. As described elsewhere, an empty comment may be, in some implementations, sufficient to constitute a human authorship token.

Comment 316 is a comment that includes an authorship token in the form of the Unicode symbol "Speaking Head in Silhouette" but in the form of the escape sequence "\u1F5E3". Some file types, content editors, or uses of the file 112 may not support Unicode characters directly and instead require them specified as a string literal. In some instances, the comment may include the string literal but the content editor 12 may instead replace the string literal with the symbol itself for the purposes of displaying to the user. Here, the Unicode symbol "Speaking Head in Silhouette" looks like a person talking and therefore can be used to represent human authorship, though of course various symbols can be used to represent various kinds of authorship. The use of symbols can be beneficial for use in authorship tokens because they are not usually found within source code comments (e.g., because of a relative difficulty in typing them, especially in the form of an escape sequence containing multiple characters that correspond to a single symbol).

Comment 318 is a comment that includes a two authorship tokens (or a single authorship token depending on how authorship tokens are implemented) in the form of a Unicode symbols "Old Personal Computer" and "Speaking Head in Silhouette", representing artificial and human authorship respectively. As discussed above, the symbols may be stored in the form of escape sequences but here are rendered by the content editor as individual Unicode symbols. The presence of both authorship tokens can indicate that the region is the product of mixed human and artificial authorship. The ordering of the tokens for the region can indicate a relative timing of the contributions. For example, the artificial authorship token being first can represent that the region was originally the product of artificial authorship and that human authorship was added after the artificial content.

Comment 320 is a comment that includes an authorship token in the form of "{H 00001111110000000000}", where the curly brackets indicate a block of text that is an authorship token (other symbols or characters can be used in other implementations). The H can indicate that human authorship is being described and the ones and zeros can indicate which sub-region (here, characters) of the region (here, line) have human authorship. Treating the ones as meaning that the corresponding character of the source code in the region as having human authorship and the zeros meaning that the corresponding character of the source code lacks human authorship, as seen in the line "Dim output As String", the human authored the variable name and nothing else. The portions not having human authorship can be considered as having artificial authorship.

Comment 322 is a comment that includes an authorship token in the form of "USBv0.3", which indicates that artificial intelligence having the name "USB" and being version 0.3 is the author the region. The comment 322 further includes a portion enclosed in curly braces and having a symbol for "Speaking Head in Silhouette" followed by the comment "comma-space delim". The use of that symbol within the curly braces can be used to indicate that a human authored the portion of the comment "comma-space delim", which is a function comment describing the function of the region of code as requiring that the cell have names delaminated by a comma and then a space.

Comment 324 includes c5b513d77889a15b1747720a656938643835c91c51b22
33e08ec3834d7257 which is a SHA256 hash of $$H;\ SALT;\ output = \text{``''}$$

where H indicates human authorship, SALT is a salt, and output=" " is the line of code with an H appended at the beginning with a salt of the form "SALT", and with the parts of this separated by semicolons. Of course, other implementations can have different formats. In this manner, the token is obfuscated in a way that resists human or artificial mimicry of a valid authorship token.

Comment 326 is a comment before a for-each loop region and indicating a begin authorship tag having the form "<Author {314abc}>". An authorship token of this form may be used to indicate that all following regions of code (e.g., lines) until the closing tag (see comment 332) are authored by "314abc" unless otherwise indicated. 314abc may be an identifier of an author or may be a reference (e.g., key) to a region (e.g., value) within an authorship data file 114 associated with the file 112 that can be followed to understand more about the authorship of the region.

Comment 328 is a comment within the authorship region bounded by comments 326 and 332 that indicates that authorship of this particular line is by a human via the presence of a human authorship token in the form of a symbol of "Speaking Head in Silhouette".

Comment 330 is a comment within the authorship region bounded by comments 326 and 332. This comment 330 by itself says nothing about authorship (i.e., is not and does not include an authorship token). Instead, the comment is a functional comment describing non-authorship information about the region which it describes.

Comment 332 is a comment following the for—each loop region and indicating an end authorship tag having the form </Author {314abc}>. This authorship token can cooperate with the begin authorship tag of comment 326 to describe authorship.

Comment 334, which includes a first portion 338 and a second portion 336. The first portion 338 is a user interface element in the form of [+] that indicates to a user that, if actuated, the region can be expanded to reveal something. Here, that symbol can be used to indicate that the content editor 12 is not showing the entirety of the region, such as because the content editor 12 is hiding an authorship token (e.g., automatically hiding content having the form of an authorship token to prevent tampering or to resist cluttering the user's view of the content 140). Upon actuation, the content editor 12 can determine whether the user is permitted to view the hidden content and, if so, display the hidden content in line with the adjacent content that was not hidden. If the user is not permitted, the content editor 12 can display an error indicating as much and not display the hidden content. The second portion 336 can correspond to a non-authorship portion of the comment 334, such as a portion of the comment describing function of the region of code (e.g., that the line removes an extra portion of the output).

Line 340 of the content 14 lacks a comment but the editor 12 renders a symbol 342 near the line 340 indicating that there is authorship information about the line 340. For example, the authorship information for that line 340 may be stored in the form of an authorship token in the authorship token data file 114 rather than in an associated comment. The editor 12 can determine that there is associated information and render the symbol 342 so the user knows that they can hover over or otherwise interact with the symbol 342 to obtain more information. As illustrated, upon interacting with the symbol 342, a tooltip 344 is displayed. The tooltip 344 can display information about authorship of the associated region. In this case, the information is that there is human authorship after a significant edit and that an authorship history is available to the user upon clicking on a link within the tooltip.

Version Control System

Figure 4:
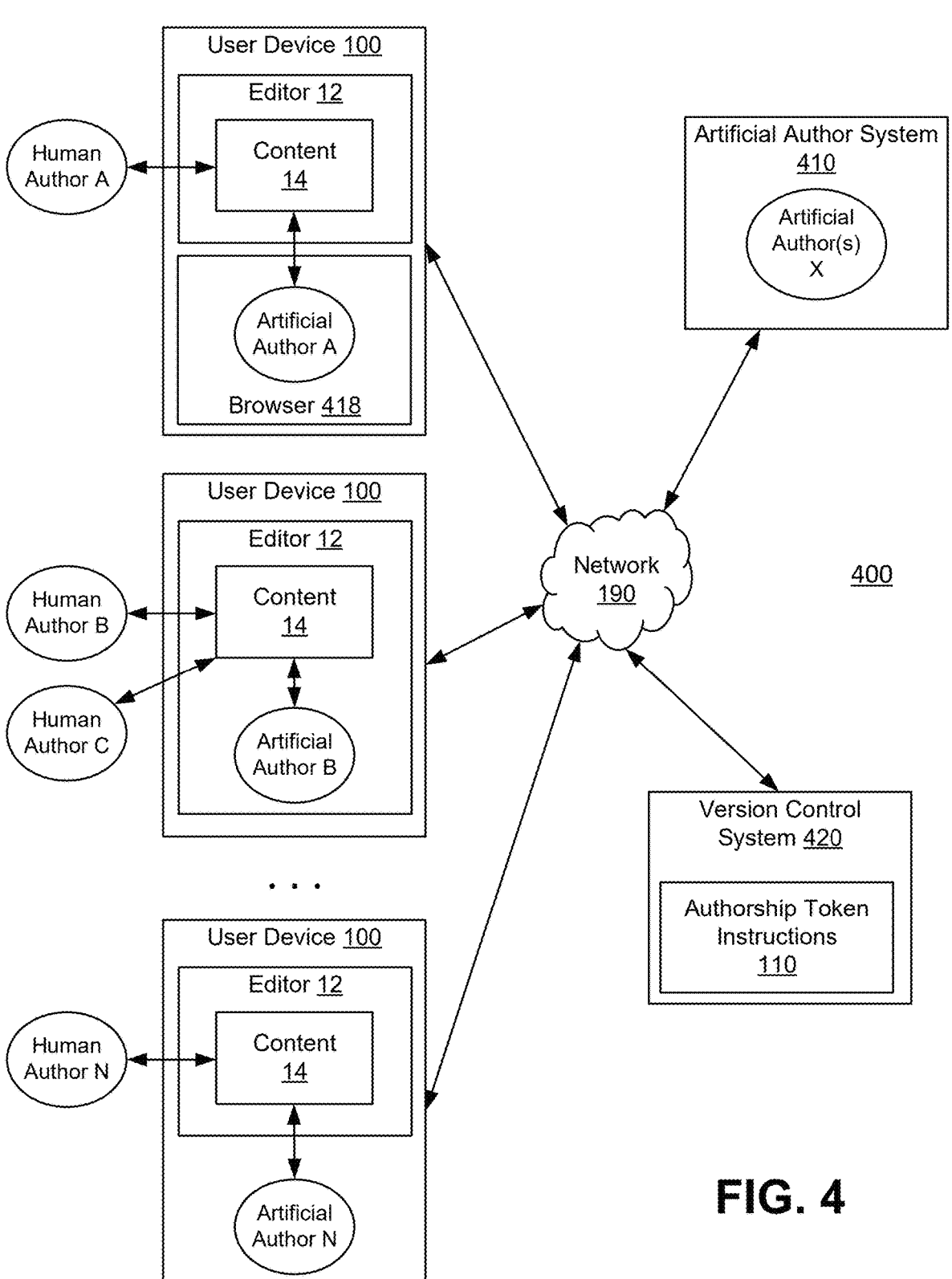
FIG. 4 illustrates an example system implementing aspects described herein.

FIG. 4 illustrates an example system 400 that can implement aspects described herein. The system 400 includes a plurality of user device 100, each having at least one human author and at least one artificial author editing content 14 in an editor 12 associated with respective user devices. The user devices are connected to an artificial author system 410 and a version control system 420 over the network 190.

Although the artificial authors are shown as being within the user devices 100 and can be running entirely or partially locally on the user devices 100, in addition or instead, the artificial authors may be running in whole or in part via a remote environment, such as the artificial author system 410. In some examples, the artificial authors are accessible through a browser 418 running on the user device.

The artificial author system 410 is a computing environment that provides one or more artificial authors remotely. Artificial authors often require significant computing resources (and concomitantly significant power and cooling resources) to operate in a timely manner. So they are often run on special purpose hardware or in other special conditions, such as those of the artificial author system 410. Capabilities of the artificial authors can be provided via application programming interfaces, web pages, via other techniques, or combinations thereof. The artificial author system 410 can include one or more aspects of the computing environment 600 described elsewhere herein.

The artificial authors are shown as having unique labels (A, B, . . . . N, and X) and can indeed be unique with respect to each other. For instance, the different artificial authors may be different generative artificial intelligence models (e.g., one may be a CHATGPT model provided by OPENAI and another may be a LLAMA model or META AI provided by META), may be different versions of a same model, may be different fine tunings of a same model, may have different initial system prompts, may have different custom parameters, other differences, or combinations thereof. But in some examples, the artificial authors across two or more user devices 100 may be the same or may be labeled as being a same artificial author. For example, the user devices 100 may access a same artificial author system and receive content from a same or substantially the same artificial author. In such instances, an authorship engine may be configured to treat content produced by such an artificial author as being produced by a same artificial author. But in other examples, an authorship engine may nonetheless treat a same artificial author operated, controlled, supervised, or otherwise used at different user devices 100 as being different artificial authors.

The version control system 420 is a system made up of one or more computing environments (e.g., computing environment 600) that provide version control functionality. Version control can relate to the management of content and changes thereto, especially by multiple different users. The version control system 420 can receive and store content created by the one or more different user devices 100 (e.g., via an editor 12 thereof). The version control system 420 can load and send content to the various user devices 100 for editing, viewing, or other purposes. The version control system can manage a content repository and handle simultaneous editing of content (e.g., using a merge model, a lock model, or other models of concurrency). The version control system 420 can provide functionality for tracking changes to content managed by the version control system. While the version control system 420 is illustrated as being separate from the user devices, some implementations of version control systems involve version control software operating on user devices 100 in addition to or instead of remotely. Example version control systems 420 include GIT, MERCURIAL, PERFORCE, SVN, others, or combinations thereof. The version control system 420 can include or cooperate with source code or other content repositories, such as BITBUCKET, GITHUB, GITLAB, AZURE DEVOPS, others, or combinations thereof.

The version control system 420 can include authorship token instructions 110 that, when executed by one or more processors of the version control system, cause the version control system 420 to perform one or more operations relating to authorship tokens. The operations can include those described elsewhere herein. In some examples, the authorship token instructions 110 can include those specific to use with a version control system.

In an example, the authorship token instructions 110 cause the version control system 420 to track changes to a maintained code base depending on authorship of the changes to the content 14. For example, the version control system 420 can maintain a change history of the content 14. The change history can include not only an indication of the changes themselves and the user that submitted the change, but also the authorship of the change. The authorship of the change can be determined based on the authorship tokens 18 of the content 14 associated with the change. For example, the version control system 420 can parse the content 14 of the change being submitted and identify the presence or absence of authorship tokens 18. The version control system 420 can then parse those authorship tokens 18 and store information about that authorship in association with the change. Such information can include a number or percentage of regions (e.g., lines of code) having particular authorship.

The authorship token instructions 110 can cause the version control system 420 to restrict changes to particular portions of a code base or other content based on authorship. For instance, an organization can set a policy regarding a relative amount of content having particular authorship and the authorship token instructions 110 can prevent changes that go against that policy. For instance, there may be a policy prohibiting any non-human authored content in a particular file or branch. The version control system 420 can then prohibit the committing or merging of a particular change or branch if the content 14 includes artificial authorship. In an example, the version control system 420 would permit a change by a user had the change included only human authorship tokens but prohibited a change by that same user had the change included an artificial authorship token.

In an example, the version control system 420 provides a user interface showing content to a user. In some examples, the user interface preserves the authorship tokens 18. In other examples, the user interface removes the authorship tokens 18 or otherwise inhibits the display of the authorship tokens 18 in the view. This can be done to remove visual clutter, improve readability, enhance privacy, or for other reasons. The version control system 420 can achieve this by identifying sections of the content 14 matching a known format of authorship tokens 18 and preventing the display of such sections of content. In addition or instead, the user interface can include a separate region that indicates authorship (e.g., a column by a line number column that includes one or more symbols indicating authorship of the associated region). An example user interface associated with changes to a code base is shown in FIG. 5.

Change View

Figure 5:
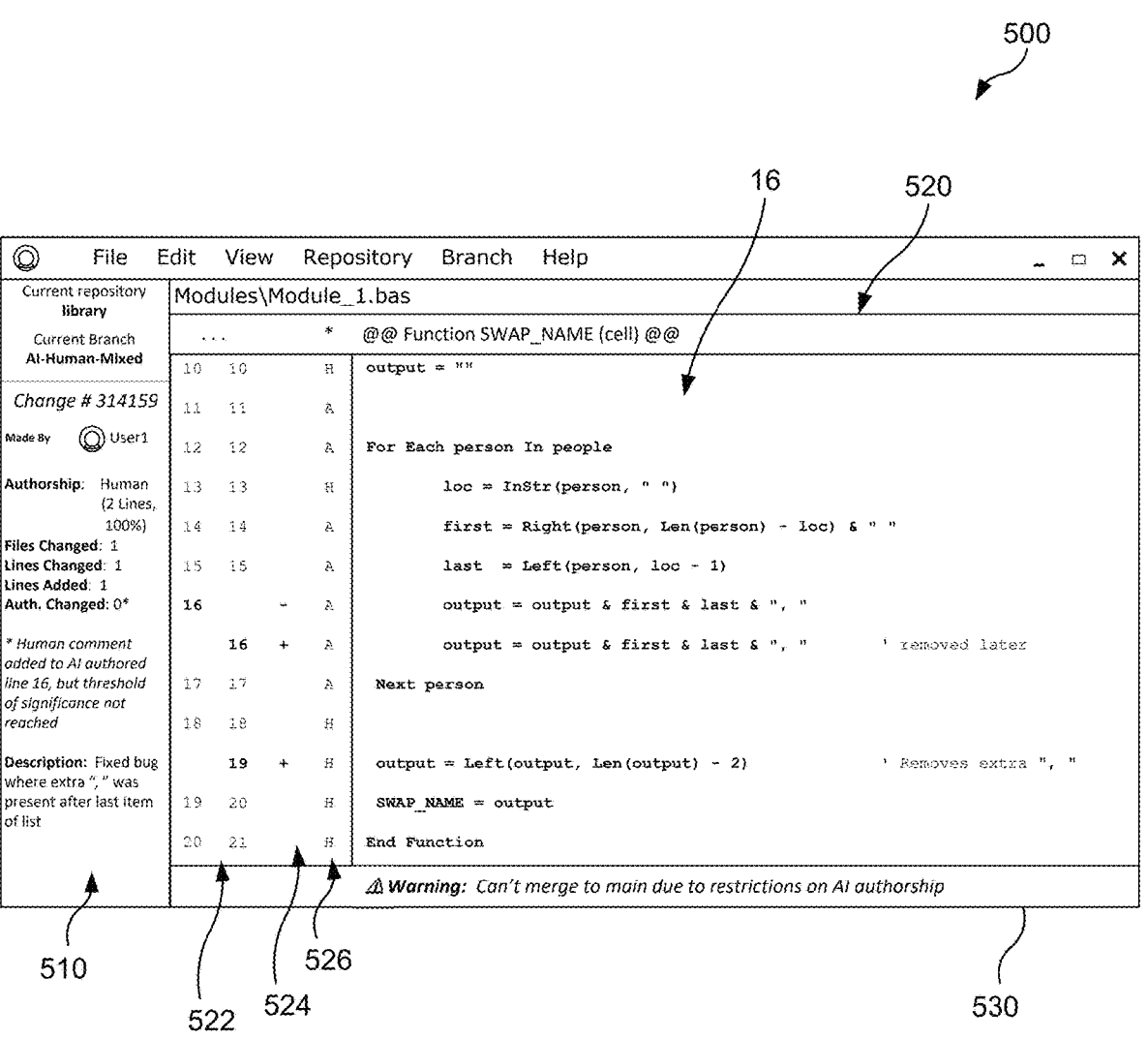
FIG. 5 illustrates an example user interface showing a change to content.

FIG. 5 illustrates an example user interface 500 showing a change to content 14. The user interface 500 includes a change information portion 510 and a content view 520. The user interface 500 further includes a warning 530 indicating that due to the presence of artificial authorship, the content 14 cannot be merged to a main branch of content 14.

The change information portion 510 illustrates information about a change to content 14 that is being displayed in a content view 520. The portion 510 includes an identifier of the change (e.g., Change #314159), the name of the user that made the change (e.g., User1), the authorship of the change (e.g., human, artificial, or mixed), an indication of the regions associated with the authorship (e.g., 2 lines of human authorship accounting for 100% of the changed content 14), a number of files changed, a number of lines changed, a number of lines added, how much authorship has changed (e.g., how many regions have changed from a first kind of authorship to a second kind of authorship), a description of the change, other information, and combinations thereof. As illustrated, the change information portion 510 can further include information about determinations of authorship. For example, as illustrated, the portion 510 indicates "Human comment added to AI authored line 16, but threshold of significance not reached".

The content view 520 is a portion of the user interface 500 that shows content 14. As illustrated, the content 14 is code based on that shown in FIG. 3. The view 520 includes indications of line numbers 522, changes 524 made by the change, and an authorship column 526. The authorship column 526 indicates, for an associated region (in this case, lines of content 14), authorship. Here, the column 526 includes an "H" indicating human authorship of the associated line and an "A" indicating artificial authorship of the associated line. In other examples, other symbols or indications can be used.

Authorship View

Figure 6:
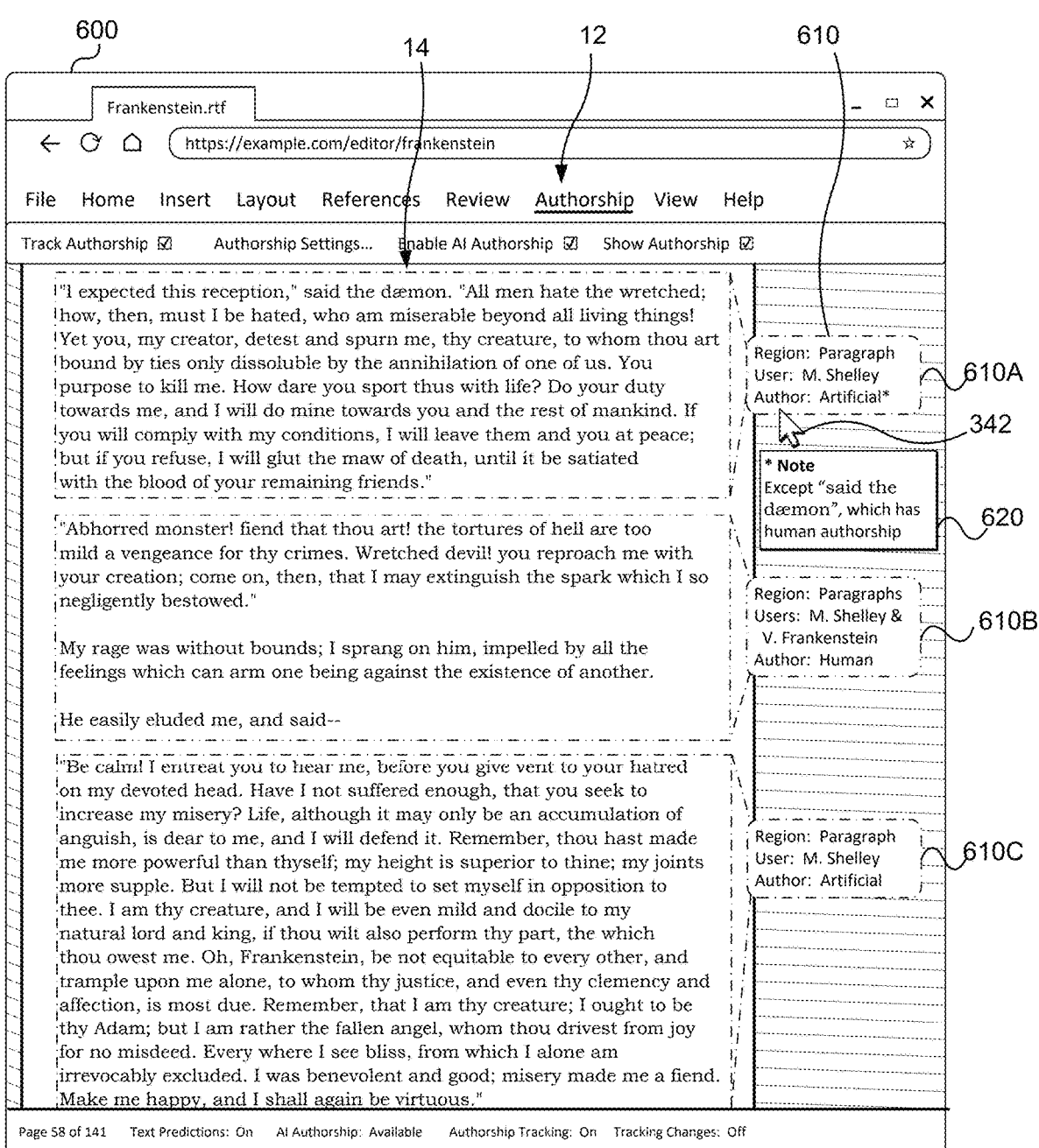
FIG. 6 illustrates an example web browser (e.g., running on a user device) rendering a web page that provides a text editor for editing content and viewing authorship information.

FIG. 6 illustrates an example web browser 600 (e.g., running on a user device 100) rendering a web page that provides a content editor 12 for editing content 14 and viewing authorship information. Here, the content 14 is prose text content that has the authorship of the content tracked (e.g., in a separate file or in another area beyond the plain text of the content 14). The editor 12 provides a view for reviewing the content. As illustrated, the view is a user interface having particular regions of content visually distinguished (e.g., by placing the region in a box) and associated with user interface elements 610 describing authorship information of the region. For example, the editor 12 shows three regions of content 14 that are all by a same user but having different authorship. For instance, one of the user interface elements 610A describes a single paragraph region by the user "M. Shelley" and which is authored by an artificial author (without specifying which artificial author). The user may correspond to the entity (typically a person) with whom the content editor 12 is associated (e.g., the user whose account is active with the content editor). As discussed elsewhere, the user associated with the content editor and the author of the content within the content editor may be different entities. The artificial authorship indication of element 610A is accompanied by an asterisk, which can be used to indicate that there is additional information about the determination of authorship. When a user hovers over or otherwise interacts with the element 610A, a tooltip 620 appears providing additional information. In the illustrated example, the additional information is that all of the content 14 of the region has artificial authorship except for the phrase "said the dæmon", which has human authorship. User interface element 610B refers to multiple paragraphs and indicate that they have human authorship provided by two different users. User interface element 610C refers to a single paragraph region having artificial authorship and provided by user "M. Shelley".

Attributing Authorship from Conversation

Figure 7A:
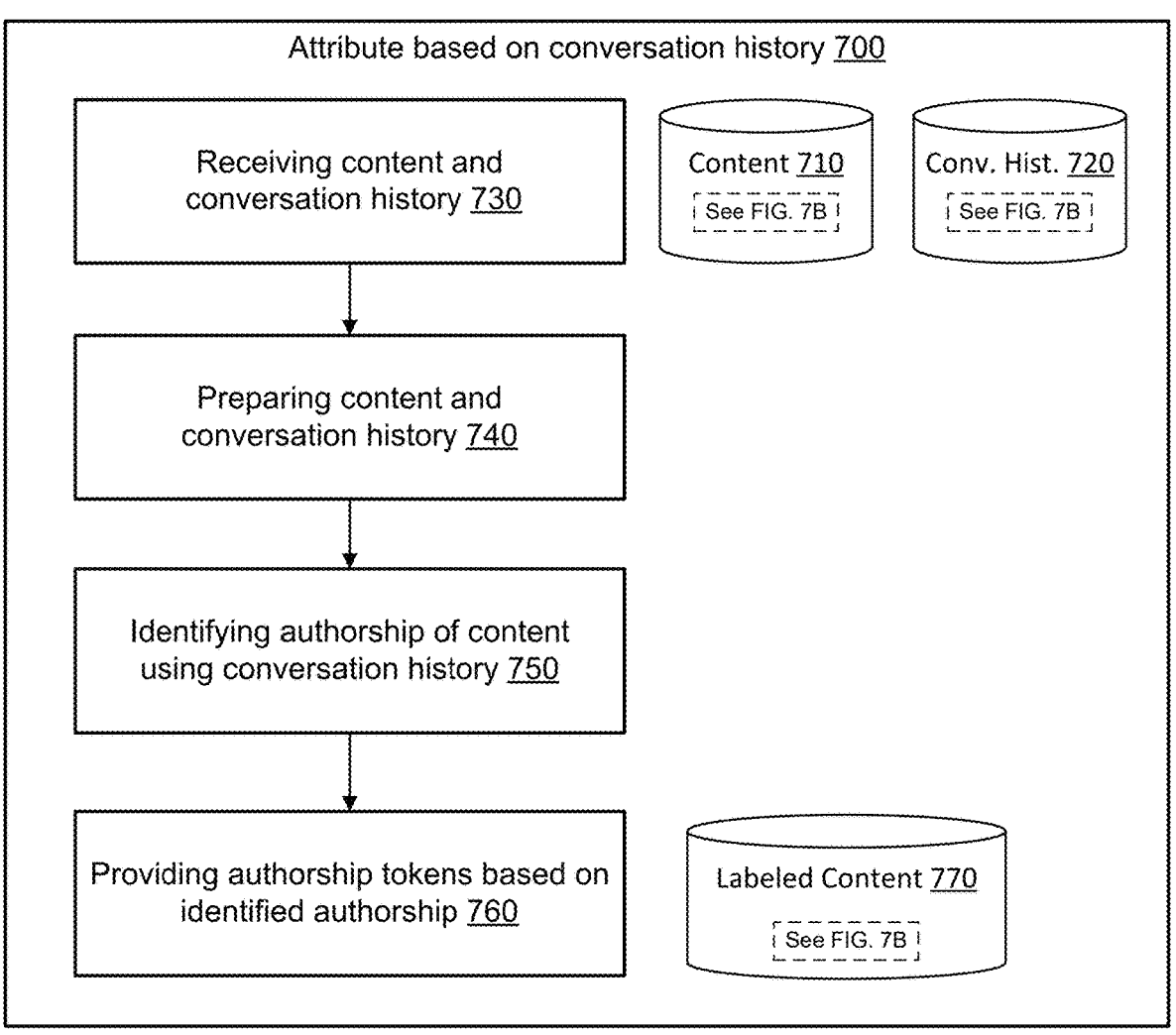

FIG. 7, which is broken into FIGS. 7A and 7B, illustrates a method 700 for attributing authorship of content 710 based on a conversation history 720. The content 710 is visual, textual, audio, or other kinds of content. In the illustrated example, the content 710 is prose text and lacks one or more authorship tokens indicating the provenance of different regions of the content 710. The conversation history 720 is a representation of a conversation among two or more artificial or human authors. In many examples, the conversation history 720 is a text representation of messages. In other examples, the conversation history is an audio or visual representation of the interactions between the authors. In the illustrated example, the conversation history 720 is in the form of a transcript of a text chat between a human user and an AI chatbot. During the conversation, the human user sends human messages 712 that are responded to with AI messages 714. The method 700 can begin with operation 730.

Operation 730 includes receiving the content 710 and the conversation history 720. This operation 730 can take any of a variety of forms. In some examples, one or both of the content 710 and history 720 are in one or more separate files that are received (e.g., by receiving indications of their locations, such as file paths). In some examples, one or both of the content 710 and history 720 is present in an editor 12 (e.g., in a main editing user interface or pasted within a field of a user interface of the editor 12). In some examples, the content editor 12 has a chat feature built in so that a user can both chat with an artificial intelligence in one area of the editor and can edit content in a same or different area of the editor. In further examples, a user can link their content editor with an account of an AI chat service and give the chat service permission to respond to queries from the content editor. In such a manner, the content editor 12 (e.g., more specifically an authorship engine thereof) can retrieve conversation histories 720 from the chat service that may be relevant to the content 710 being edited in the editor 12. Following operation 730, the flow of the method 700 can move to operation 740.

In some examples, operation 730 includes determining a relevance of the conversation history 720 to the content 710. Responsive to the relevance passing a threshold, the flow of the method can continue. In an example, the relevance is determined based on a similarity of the conversation history to the content. This can include using natural language processing techniques. It can include comparing a distance between representations of the conversation history and the content in embedding space.

Operation 740 includes preparing one or both of the content 710 and conversation history 720 for use. In an example, this includes parsing the conversation history and identifying one or more authors in the conversation history 720 and associated messages. In some examples, the conversation history 720 is analyzed to identify a prompter and a generator and the roles are used in assessing authorship in future operations. Following operation 740, the flow of the method 700 can move to operation 750.

Operation 750 includes identifying authorship of regions of the content 710 based on the conversation history 720.

Identifying authorship can include determining a difference between messages provided by a first author and a region of the content 710. If the difference is below a predetermined threshold, then the region is labeled as having the first author as an author.

Identifying authorship can include taking a piece of the content 710 and recursively finding the provenance of the portions of the content 710. For example, the content 710 may include a region that is verbatim (or within a predetermined amount of difference) provided by a second author. An authorship engine can then go backwards through the conversation history 720 to a prior message and find a difference between that content and the prior prompt by a first author. Regions corresponding to that difference can be labeled with the second author if the differences are significant (e.g., based on similar or the same determinations as operation 220) and labeled with the first author if the differences are not significant. This process of identifying differences and labeling authorship as needed can continue backwards through the conversation until the beginning of the conversation is reached.

In some examples, rather than moving backwards through the conversation, the analysis can be performed by moving forward through the conversation. In an example, a difference between an earliest relevant message and a next message is be determined. The significance of the difference can be determined (e.g., using techniques similar to those described above in operation 220) and authorship applied accordingly to the next message. After authorship is applied, the process of determining the difference and updating authorship continues for all next messages before finishing with the final difference between the last relevant message and the content 710 to be labeled.

In some examples, a branching nature of a conversation can be accounted for in the analysis. Part of the analysis can include determining the prior message or next message in the conversation. In many instances the prior or next message may be an immediately adjacent message, but in other instances, there may be intervening messages (e.g., as part of another conversation path or a tangent) between the current message and the prior or next message. Determining the prior or next message can include determining the most recent prior or next message chronologically that has the greatest similarity to the current message. This can include a straight comparison of text of the messages (e.g., using any of a variety of edit distance algorithms, such as Levenshtein distance algorithms). For instance, the message having the shortest edit distance to the current message can be determined to be the prior or next message when looking forward or backward as needed. In addition to or instead of edit distance, the distance in embedding space between a cluster of tokens of the messages can be used. Thus, the messages that are closest together in embedding space can be determined to be related. Other techniques can be used. A path from message to message (or topic to topic) through the conversation history can be determined by treating each message in the conversation history 720 as a node connected by edges having weights corresponding to the edit distance between the messages (or another technique). Then a path-finding algorithm (e.g., the A* algorithm) can be used to find a path through the messages from a start to a finish or until each node has been reached.

In some examples, a sentiment of a first author is analyzed to determine how much creative control the first author is exerting over the second author or additional other authors.

In some examples, the authorship engine can pass the conversation history and the content to a large language model or other artificial intelligence and ask whether particular portions of the content are authored by a given author.

In some examples, the authorship engine can modify the content 710 by removing contributions to the convent that were provided by (e.g., provided only by) a given author. This removal can be done using simple replacement or by using more complex approaches (e.g., asking an LLM or another artificial intelligence to do such a removal). The method 700 can then determine whether the change resulted in a significant difference, such as using one or more techniques described above in relation to operation 220.

In some examples, the content 710 is put into an embedding space with the conversation history and the points of the conversation history are labeled. The relative difference between one or more points or one or more clusters of points can be used to determine authorship.

Following operation 750, the flow of the method can move to operation 760.

Operation 760 includes providing authorship tokens for the regions based on the identified authorship, which can result in labeled content 770. In examples, the content is labeled by adding authorship tokens using techniques described elsewhere herein. In some examples, the original content included authorship tokens, which are then updated or corrected based on the conversation. The labeled content 770 includes indications of authorship in the form of authorship tokens. In the illustrated example, content written by humans is surrounded by double parentheses and content written by an artificial intelligence is surrounded by double square brackets. In addition, an authorship description 772 is provided that describes concepts provided by the human author and concepts provided by the artificial author.

In an example implementation, there is a method that includes receiving content; receiving a conversation history associated with the content; identifying authorship of regions of the content using the conversation history; and applying authorship tokens to the regions of the content based on the identified authorship to form labeled content. After applying the authorship tokens, the labeled content includes at least one artificial authorship token and at least one human authorship token.

Receiving the conversation history can include obtaining the conversation history from a chat service. The method can include parsing the conversation history to identify one or more authors in the conversation history. Identifying the authorship of the regions of the content can include: identifying a region of the regions that has more than a threshold similarity with a message in the conversation history; determining a message author of the message in the conversation history; and applying an authorship token to the region corresponding to the message author. The message author can be different from the writer of the message.

In an example, determining the message author includes proceeding backwards through prior messages in the conversation history starting at the message and, for each respective message of the prior messages: determining whether a difference between the respective message and a next message after the respective message, passes a threshold of significance. Responsive to failing to passing the threshold of significance, the method can attribute authorship of the next message such that the author of the respective message is the author of the next message. Responsive to passing the threshold of significance, the method can attribute authorship of the next message to the author of the next message.

In an example, the method includes creating a directed graph representation of the conversation history such that each message in the conversation history is represented by a node in the graph representation and such that each edge between a pair of nodes representing respective first and second messages represents a transition to the second message from a first message where the first message most relevant, prior message having more than a threshold amount of relevance to the second message. Identifying authorship of regions of the content using the conversation history can include using the directed graph.

In some examples, the content is not modified based on the conversation history other than such modifications necessary to add authorship tokens. In examples, concepts are determined, such as determining human concepts contributed by a human participant in the conversation history and determining artificial concepts contributed by an artificial participant in the conversation history.

Managing Use of Content Based on Authorship

Figure 8:
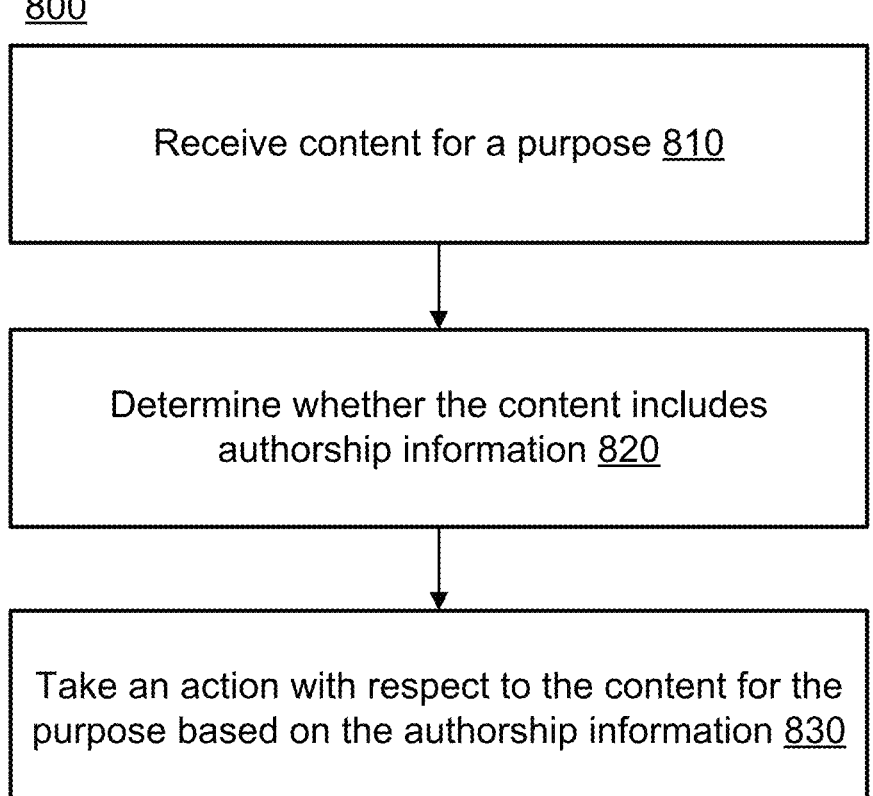
FIG. 8 illustrates an example method for using content based on its authorship.

FIG. 8 illustrates an example method 800 for using content based on its authorship. The method can begin with operation 810.

Operation 810 includes receiving content for a purpose. For instance, the content can be received through a form of a website or application, received via a paste command, received in an editor, received as a message, received over an application programming interface, received in another way, or combinations thereof. Following operation 810, the flow of the method 800 can move to operation 820.

Operation 820 includes determining whether the content includes authorship information. This can be performed in any of a variety of ways. In one example, the authorship information is generated as part of receiving the content. For instance, the content may be authored in a content entry field (e.g., text box) of a website or application that includes authorship features (e.g., that create authorship tokens as described in method 200). Thus, the content is determined to have authorship information because authorship information was generated as part of the receipt of the context in operation 810.

In another example, the authorship engine performing this method 800 has one or more supported authorship token formats and determines whether any of the content being received has content in that format. In some examples, the authorship tokens may be specifically identified or located in a different file or application programming interface call. In some examples, the authorship engine may determine a validity or a robustness of the authorship token. The validity or robustness may be based on how tamper resistant or verifiable the tokens are. For instance, a platform may have policies regarding which sources provide trusted authorship tokens (e.g., based on an ability to resist mimicry or as being certified as following particular standards for determining authorship). The trustworthiness of the provenance of the tokens may be used in the following steps.

In a further example, the validity, existence, or robustness of the authorship token is determined using a process similar to that of method 1500, which is described below in relation to FIG. 15.

Following operation 820, the flow of the method 800 can move to operation 830.

Operation 830 includes taking an action with respect to the content for the purpose based on the authorship information. For example, the action may include determining whether the authorship information complies with policies regarding the use of content having that authorship for the purpose. For instance, certain websites, social networks, applications, communications systems, version control systems, or other platforms may restrict the receipt or use of artificially generated content for a purpose. Thus, the action may be prohibiting the use of the content if it has more than a threshold amount of artificially generated content or less than a threshold amount of human generated content. In some actions, different purposes may control whether or how the authorship information is used to permit or deny use of the content. For instance, a platform may prohibit the use of artificially generated content in advertisements but not non-commercial user posts. In some examples, the platform may flag the content (e.g., internally for content moderation purposes or in an externally facing way for users) as having a particular authorship or a mix of authorship. Or it may flag the content has having unknown or unverified authorship. In some examples, the platform may use content having particular authorship for certain purposes but not others (e.g., only permit artificial intelligence training on human authored content).

In some examples, the platform is a social media platform having policies regarding authorship of content. In some examples, the platform may restrict the posting or sending of artificially generated content unless a user account specifically identifies itself as posting artificial content. In some examples, a platform may restrict the posting or sending of artificial content directed to a certain topic, such as politics or elections. The platform may determine whether the post relates to an election and, if so, determine whether or to what extent the post is artificial.

In some examples, the platform may treat content having authorship tokens that do not follow certain standards or are not certified by a particular provider of authorship tokens believed to provide accurate or high-quality authorship tokens as being less trustworthy. Such content may be demoted. For instance, if a platform is concerned about artificial content and a particular piece of content is received that has a human authorship token from an unreliable source, then the content may be treated as having artificial authorship or as having unknown authorship even though the token says otherwise.

In some examples, the platform may treat content authored by an artificial intelligence as though it were not copyrighted and may treat content authored by a human as though it were copyrighted.

Video Editor with Authorship View

Figure 9:
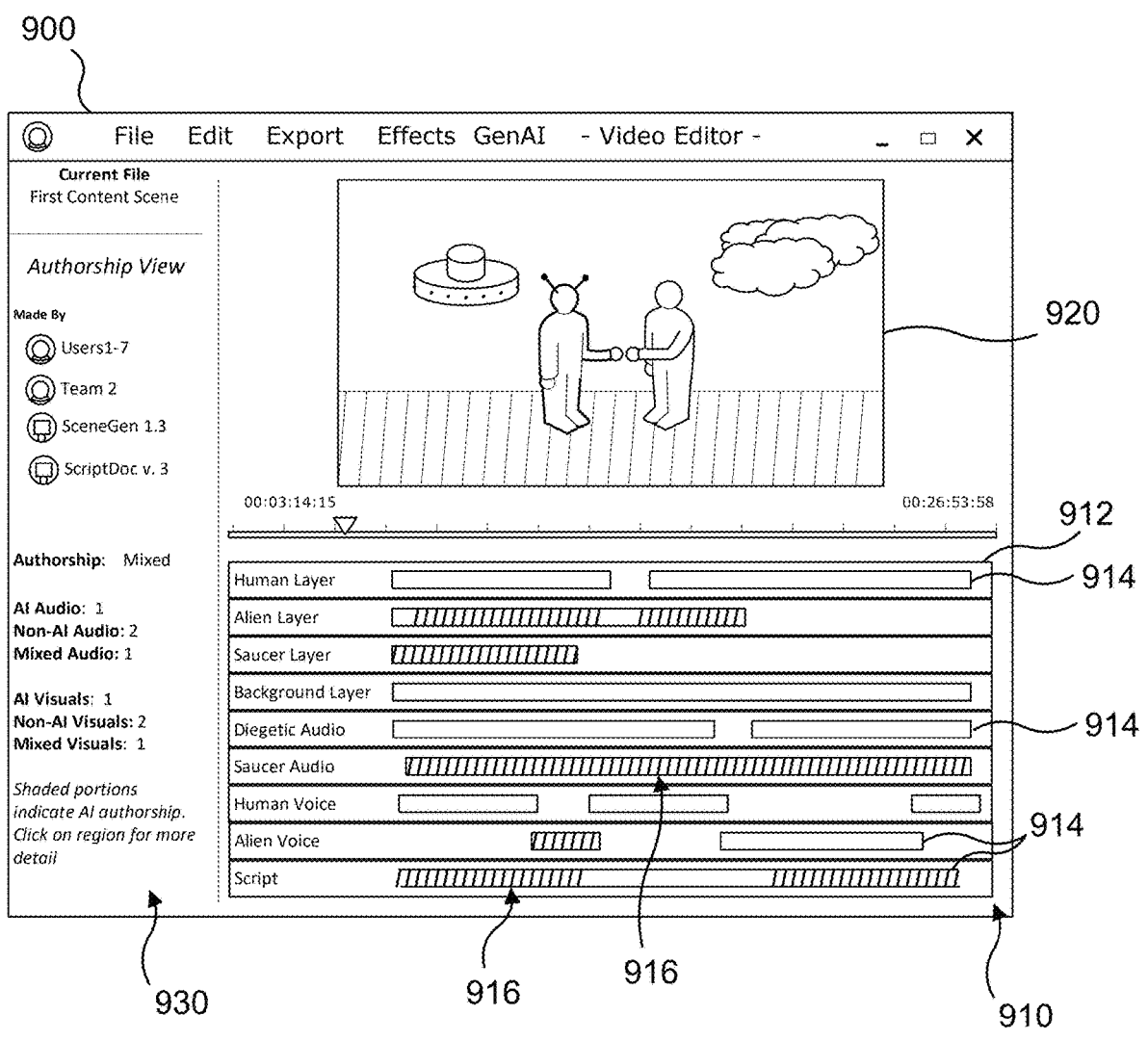
FIG. 9 illustrates an example video editor user interface having authorship attribution.

FIG. 9 illustrates an example video editor user interface 900. While many examples herein describe authorship tokens applied to text content, techniques described herein need not be so limited. Technology herein can be applied in other contexts as well. Illustrated is an example that applies authorship tokens to identify those portions of audio, visual, and textual (e.g., script of the video scene) content of a video that have artificial authorship versus human authorship. As illustrated, the user interface includes layer panel 910 that includes multiple layers 912, each having content 914 (e.g., audio or visual content) that make up a scene 920. The content 914 include portions shaded differently to serve as artificial authorship tokens 916 to identify artificial authorship (e.g., generated by a generative artificial intelligence).

The user interface further includes an authorship panel 930 showing a description of the authorship of the current file. This authorship panel 930 displays information regarding the human and artificial authors of the scene, as well as information regarding how much of different kinds of authorship make up the scene. The information provided here can be compiled based on the authorship information of each of the layers.

In examples, the software or services used to generate the layers 912 include authorship tokens during the creation of their respective content. When imported into the video editor, the editor can understand the authorship of the content (e.g., using techniques described in operations 292, 294, and 296) and apply authorship tokens accordingly.

In an example, there is a method 1 that includes providing a video editor user interface for editing a video. The user interface can show a plurality of authorship tokens applied to portions of audio content of the video and visual content of the video. The plurality of authorship tokens can include at least one human authorship token having a predetermined form indicating that a human rather than an artificial intelligence is the author of the portion of the video. The plurality of authorship tokens can further include at least one artificial authorship token indicating that an artificial intelligence rather than a human is the author of the portion of the video. The method can further include determining that a user of the video editor made a manual edit to the video within the video editor. The manual edit can include one or more changes, insertions, or deletions to the video. The method can further include determining that the manual edit satisfies a threshold of significance. The method can further include, responsive to determining that the manual edit satisfies the threshold of significance, providing a human authorship token in association with the region. The human authorship token having a predetermined form indicating that a human rather than an artificial intelligence is the author of the region of the video or that an artificial intelligence rather than a human is the author of the region of the video. The portion is an audio, visual, or textual portion of the video. The method can further include populating a description of the authorship of the video based on collecting authorship information from components of the video.

Computing Environment

FIG. 10 discloses a computing environment 1000 in which aspects of the present disclosure may be implemented. A computing environment 1000 is a set of one or more virtual or physical computers 1010 that individually or in cooperation achieve tasks, such as implementing one or more aspects described herein. The computers 1010 have components that cooperate to cause output based on input. Example computers 1010 include desktops, servers, mobile devices (e.g., smart phones and laptops), wearables, virtual/augmented/expanded reality devices, spatial computing devices, virtualized devices, other computers, or combinations thereof. In particular example implementations, the computing environment 1000 includes at least one physical computer.

The computing environment 1000 may specifically be used to implement one or more aspects described herein. In some examples, one or more of the computers 1010 may be implemented as a user device, such as mobile device and others of the computers 1010 may be used to implement aspects of a machine learning framework useable to train and deploy models exposed to the mobile device or provide other functionality, such as through exposed application programming interfaces.

The computing environment 1000 can be arranged in any of a variety of ways. The computers 1010 can be local to or remote from other computers 1010 of the environment 1000. The computing environment 1000 can include computers 1010 arranged according to client-server models, peer-to-peer models, edge computing models, other models, or combinations thereof.

In many examples, the computers 1010 are communicatively coupled with devices internal or external to the computing environment 1000 via a network 1002. The network 1002 is a set of devices that facilitate communication from a sender to a destination, such as by implementing communication protocols. Example networks 1002 include local area networks, wide area networks, intranets, or the Internet.

In some implementations, computers 1010 can be general-purpose computing devices (e.g., consumer computing devices). In some instances, via hardware or software configuration, computers 1010 can be special purpose computing devices, such as servers able to practically handle large amounts of client traffic, machine learning devices able to practically train machine learning models, data stores able to practically store and respond to requests for large amounts of data, other special purposes computers, or combinations thereof. The relative differences in capabilities of different kinds of computing devices can result in certain devices specializing in certain tasks. For instance, a machine learning model may be trained on a powerful computing device and then stored on a relatively lower powered device for use.

Many example computers 1010 include one or more processors 1012, memory 1014, and one or more interfaces 1018. Such components can be virtual, physical, or combinations thereof.

The one or more processors 1012 are components that execute instructions, such as instructions that obtain data, process the data, and provide output based on the processing. The one or more processors 1012 often obtain instructions and data stored in the memory 1014. The one or more processors 1012 can take any of a variety of forms, such as central processing units, graphics processing units, coprocessors, tensor processing units, artificial intelligence accelerators, microcontrollers, microprocessors, application-specific integrated circuits, field programmable gate arrays, other processors, or combinations thereof. In example implementations, the one or more processors 1012 include at least one physical processor implemented as an electrical circuit. Example providers processors 1012 include INTEL, AMD, QUALCOMM, TEXAS INSTRUMENTS, and APPLE.

The memory 1014 is a collection of components configured to store instructions 1016 and data for later retrieval and use. The instructions 1016 can, when executed by the one or more processors 1012, cause execution of one or more operations that implement aspects described herein. In many examples, the memory 1014 is a non-transitory computer readable medium, such as random-access memory, read only memory, cache memory, registers, portable memory (e.g., enclosed drives or optical disks), mass storage devices, hard drives, solid state drives, other kinds of memory, or combinations thereof. In certain circumstances, transitory memory 1014 can store information encoded in transient signals.

The one or more interfaces 1018 are components that facilitate receiving input from and providing output to something external to the computer 1010, such as visual output components (e.g., displays or lights), audio output components (e.g., speakers), haptic output components (e.g., vibratory components), visual input components (e.g., cameras), auditory input components (e.g., microphones), haptic input components (e.g., touch or vibration sensitive components), motion input components (e.g., mice, gesture controllers, finger trackers, eye trackers, or movement sensors), buttons (e.g., keyboards or mouse buttons), position sensors (e.g., terrestrial or satellite-based position sensors such as those using the Global Positioning System), other input components, or combinations thereof (e.g., a touch sensitive display). The one or more interfaces 1018 can include components for sending or receiving data from other computing environments or electronic devices, such as one or more wired connections (e.g., Universal Serial Bus connections, THUNDERBOLT connections, ETHERNET connections, serial ports, or parallel ports) or wireless connections (e.g., via components configured to communicate via radiofrequency signals, such as according to WI-FI, cellular, BLUETOOTH, ZIGBEE, or other protocols). One or more of the one or more interfaces 1018 can facilitate connection of the computing environment 1000 to a network 1090.

The computers 1010 can include any of a variety of other components to facilitate performance of operations described herein. Example components include one or more power units (e.g., batteries, capacitors, power harvesters, or power supplies) that provide operational power, one or more busses to provide intra-device communication, one or more cases or housings to encase one or more components, other components, or combinations thereof.

A person of skill in the art, having benefit of this disclosure, may recognize various ways for implementing technology described herein, such as by using any of a variety of programming languages (e.g., a C-family programming language, PYTHON, JAVA, RUST, HASKELL, other languages, or combinations thereof), libraries (e.g., libraries that provide functions for obtaining, processing, and presenting data), compilers, and interpreters to implement aspects described herein. Example libraries include NLTK (Natural Language Toolkit) by Team NLTK (providing natural language functionality), PYTORCH by META (providing machine learning functionality), NUMPY by the NUMPY Developers (providing mathematical functions), and BOOST by the Boost Community (providing various data structures and functions) among others. Operating systems (e.g., WINDOWS, LINUX, MACOS, IOS, and ANDROID) may provide their own libraries or application programming interfaces useful for implementing aspects described herein, including user interfaces and interacting with hardware or software components. Web applications can also be used, such as those implemented using JAVASCRIPT or another language. A person of skill in the art, with the benefit of the disclosure herein, can use programming tools to assist in the creation of software or hardware to achieve techniques described herein, such as intelligent code completion tools (e.g., INTELLISENSE) and artificial intelligence tools (e.g., GITHUB COPILOT).

In some examples, large language models can be used to understand natural language, generate natural language, or perform other tasks. Examples of such large language models include CHATGPT by OPENAI, a LLAMA model by META, a CLAUDE model by ANTHROPIC, others, or combinations thereof. Such models can be fine-tuned on relevant data using any of a variety of techniques to improve the accuracy and usefulness of the answers. The models can be run locally on server or client devices or accessed via an application programming interface. Some of those models or services provided by entities responsible for the models may include other features, such as speech-to-text features, text-to-speech, image analysis, research features, and other features, which may also be used as applicable.

In some examples, the computing environment 1000 includes special-purpose compute units for machine learning (e.g., for training or inference of artificial intelligence models). In an example, the computing environment 1000 includes a special-purpose compute unit having at least 80 gigabytes of memory, capable of performing at least 25 teraFLOPS at FP64, and capable of performing at least 1,500 teraFLOPS at FP16. Such a compute unit have a max thermal design power of up to 350 watts. In an example, the computing environment 1000 may have the equivalent performance (e.g., memory, teraFLOPS, or other such measure) of over 300,000 of such compute units. In an example, the compute units are at least as powerful as NVIDIA H100 TENSOR CORE GPUs. Such compute units can be connected or implemented using an AI platform like GRAND TETON by META.

Machine Learning Framework

Figure 11:
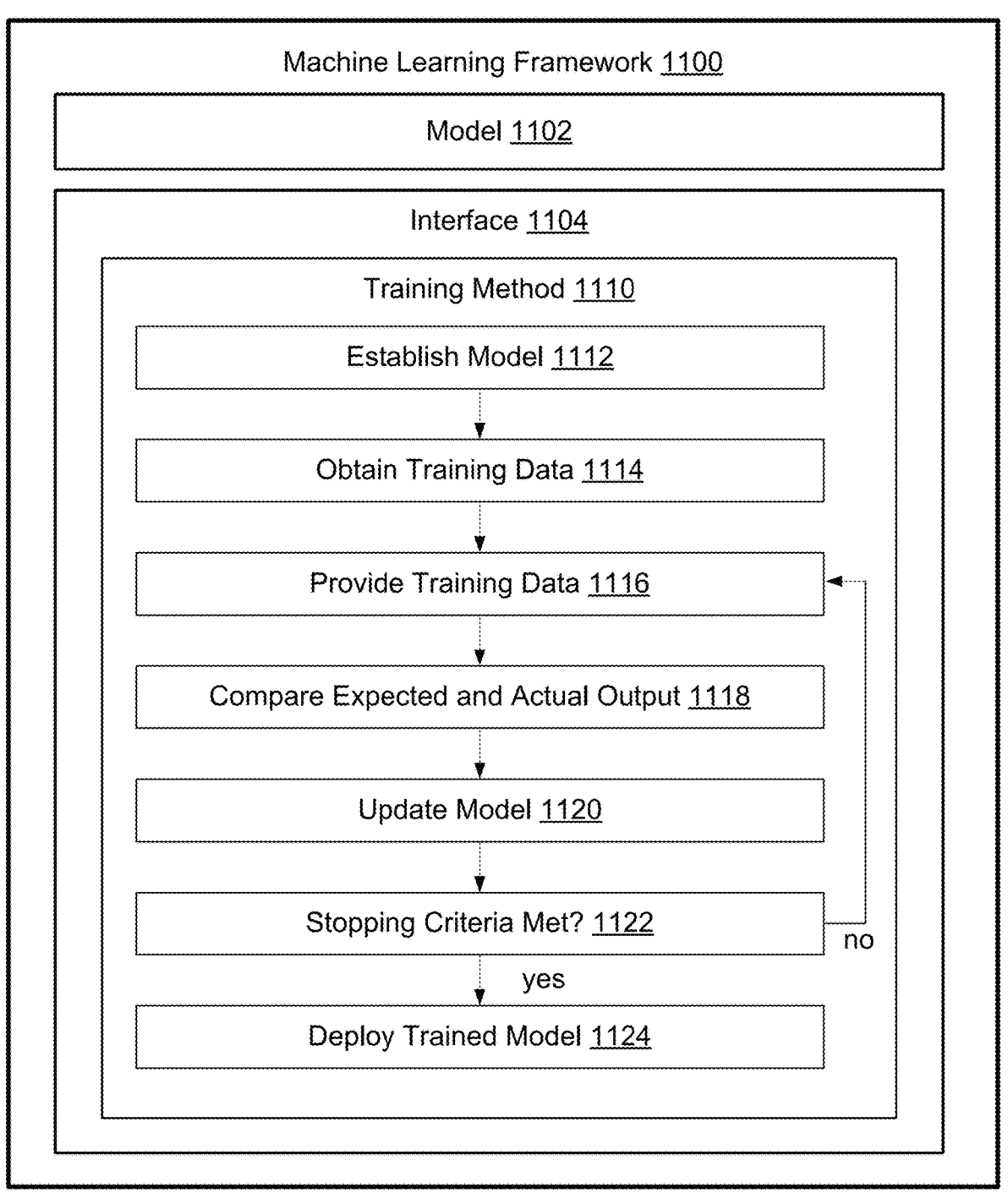
FIG. 11 illustrates an example machine learning framework that can benefit from or be used with techniques described herein.

FIG. 11 illustrates an example machine learning framework 1100 that techniques described herein may benefit from. A machine learning framework 1100 is a collection of software and data that implements artificial intelligence trained to provide output, such as predictive data, based on input. Examples of artificial intelligence that can be implemented with machine learning way include neural networks (including recurrent neural networks), language models (including so-called "large language models"), generative models, natural language processing models, adversarial networks, decision trees, Markov models, support vector machines, genetic algorithms, others, or combinations thereof. A person of skill in the art having the benefit of this disclosure will understand that these artificial intelligence implementations need not be equivalent to each other and may instead select from among them based on the context in which they will be used. Machine learning frameworks 1100 or components thereof are often built or refined from existing frameworks, such as TENSORFLOW by GOOGLE, INC. or PYTORCH by the PYTORCH community.

The machine learning framework 1100 can include one or more models 1102 that are the structured representation of learning and an interface 1104 that supports use of the model 1102.

The model 1102 can take any of a variety of forms. In many examples, the model 1102 includes representations of nodes (e.g., neural network nodes, decision tree nodes, Markov model nodes, other nodes, or combinations thereof) and connections between nodes (e.g., weighted or unweighted unidirectional or bidirectional connections). In certain implementations, the model 1102 can include a representation of memory (e.g., providing long short-term memory functionality). Where the set includes more than one model 1102, the models 1102 can be linked, cooperate, or compete to provide output.

The interface 1104 can include software procedures (e.g., defined in a library) that facilitate the use of the model 1102, such as by providing a way to establish and interact with the model 1102. For instance, the software procedures can include software for receiving input, preparing input for use (e.g., by performing vector embedding, such as using Word2Vec, BERT, or another technique), processing the input with the model 1102, providing output, training the model 1102, performing inference with the model 1102, fine tuning the model 1102, other procedures, or combinations thereof.

In an example implementation, interface 1104 is used to facilitate a training method 1110 that can include operation 1112. Operation 1112 includes establishing a model 1102, such as initializing a model 1102. The establishing can include setting up the model 1102 for further use (e.g., by training or fine tuning). The model 1102 can be initialized with values. In examples, the model 1102 can be pretrained. Operation 1114 can follow operation 1112. Operation 1114 includes obtaining training data. In many examples, the training data includes pairs of input and desired output given the input. In supervised or semi-supervised training, the data can be prelabeled, such as by human or automated labelers. In unsupervised learning the training data can be unlabeled. The training data can include validation data used to validate the trained model 1102. Operation 1116 can follow operation 1114. Operation 1116 includes providing a portion of the training data to the model 1102. This can include providing the training data in a format usable by the model 1102. The framework 1100 (e.g., via the interface 1104) can cause the model 1102 to produce an output based on the input. Operation 1118 can follow operation 1116. Operation 1118 includes comparing the expected output with the actual output. In an example, this includes applying a loss function to determine the difference between expected and actual. This value can be used to determine how training is progressing. Operation 1120 can follow operation 1118. Operation 1120 includes updating the model 1102 based on the result of the comparison. This can take any of a variety of forms depending on the nature of the model 1102. Where the model 1102 includes weights, the weights can be modified to increase the likelihood that the model 1102 will produce correct output given an input. Depending on the model 1102, backpropagation or other techniques can be used to update the model 1102. Operation 1122 can follow operation 1120. Operation 1122 includes determining whether a stopping criterion has been reached, such as based on the output of the loss function (e.g., actual value or change in value over time). In addition or instead, whether the stopping criterion has been reached can be determined based on a number of training epochs that have occurred or an amount of training data that has been used. In some examples, satisfaction of the stopping criterion can include If the stopping criterion has not been satisfied, the flow of the method can return to operation 1114. If the stopping criterion has been satisfied, the flow can move to operation 1122. Operation 1122 includes deploying the trained model 1102 for use in production, such as providing the trained model 1102 with real-world input data and produce output data used in a real-world process. The model 1102 can be stored in memory 1014 of at least one computer 1010, or distributed across memories of two or more such computers 1010 for production of output data (e.g., predictive data).

Classifying Content Authorship Using Embedding Space

Content 14 can include a region having one or more sub-regions labeled with one or more authorship tokens 18 as having human authorship and one or more sub-regions labeled with one or more authorship tokens 18 as having artificial authorship. In such an instance, the authorship of the region can be classified as "mixed" because it includes sub-regions having human authorship and sub-regions having artificial authorship. While it can be beneficial to label a region as having mixed authorship, in some instances it may be more beneficial to determine whether the human or artificial authorship predominates. It may also be beneficial to specify a relative amount of authorship (e.g., human versus artificial) of the higher-level mixed authorship region.

In addition, it may be beneficial to understand the extent to which an edit to content 14 changes the meaning of the content 14. This can be done by embedding representations of the content in a vector space and performing operations on those representations, such as clustering embeddings and measuring distances between embeddings.

Figure 12:
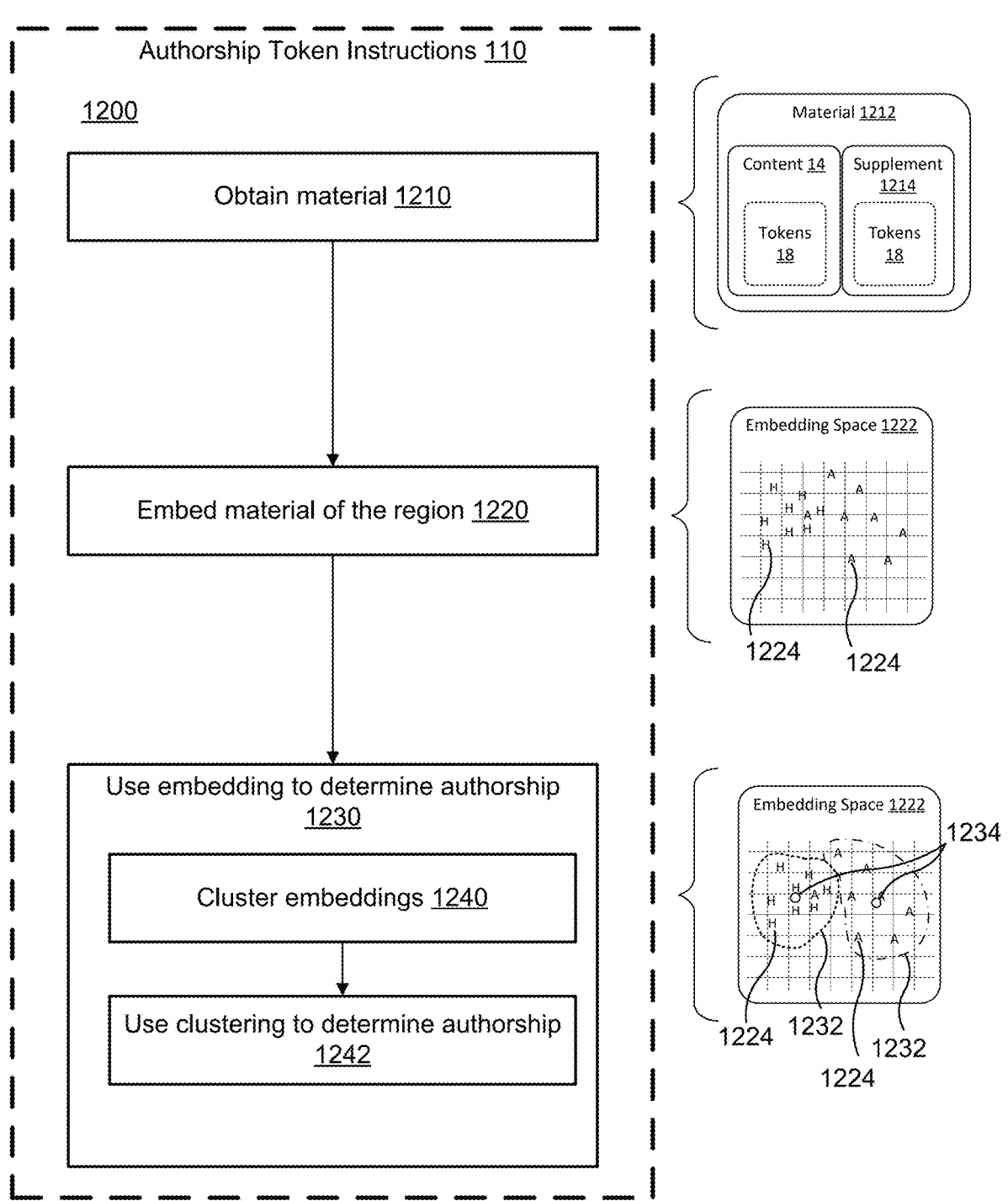
FIG. 12 illustrates the authorship token instructions including a method for determining authorship using embeddings.

An example method for using embeddings when determining authorship is described below in relation to FIG. 12. FIG. 12 illustrates the authorship token instructions 110 including a method 1200 for determining authorship using embeddings. The method 1200 can begin with operation 1210.

Operation 1210 includes obtaining material 1212. The material 1212 can include any content 14 described herein. The material 1212 may include existing authorship tokens labeling authorship of regions of content 12 according to techniques described herein. The material 1212 can also include supplemental information related to but not directly in the content 14. Such supplemental information 1214 can include, for instance, chat logs that are related to the content. The chat logs may be, for example, a discussion between a human and the artificial intelligence regarding the content 14 (see, e.g., FIG. 7B and associated discussion). In a further example, the supplemental information 1214 can include a history of recommendations by an author (typically recommendations from an artificial author to the human author). Such recommendations can be used to catch instances where the artificial author suggests a change and then, rather than having the artificial author makes the change, the human author manually makes the change. In some implementations, there is a mechanism configured to determine the likelihood that a human author has actually seen or considered the artificial recommendation to resist a circumstance where the human naturally makes a similar edit to the one suggested by the artificial author without being influenced by it. Such a likelihood determination could be made by determining whether and for how long the artificial recommendation was displayed to the user. For instance, if the recommendation was displayed for less time than an amount of time necessary to comfortably read the recommendation, then it can be determined that the likelihood that the human author considered the recommendation is low. Likewise, if the recommendation would be difficult for the human author to see or read (e.g., the font is relatively small, the text is away from an active window or main portion of the screen, the suggestion is hidden, other obfuscations, or combinations thereof), then it can be determined that the likelihood that the human author was influenced by it is low. Following operation 1210, the flow of the method 1200 can move to operation 1220.

Operation 1220 includes embedding at least some of the material 1212 in an embedding space 1222 as embeddings

1224. This can include breaking the material 1212 down into embeddable sub-components. For instance, the material 1212 may include paragraphs that can be broken down into embeddable sub-components in the form of the words or tokens that make up the sentences of the material 1212. The level to which the embeddable sub-components are broken down can vary depending on the use case, the kind of embedding technique used, or other characteristics. The embeddable sub-components can be embedded using any of a variety of useful techniques, such as Word2Vec, BERT, or other techniques. In many examples, the embeddable sub-component is a word or tokens. However, recent developments have been made in higher-level embeddings, such as sentence level embeddings (see, e.g., doc2vec). Such higher level embeddings can also be used as appropriate.

Embeddings can be grouped to facilitate analysis. In some instances, all embeddings of a region (sentence, paragraph, etc.) can be grouped to facilitate analysis with respect to the overall region. Further, the embeddings can be created, updated, or fine-tuned using attention techniques to improve accuracy of the embeddings based on the surrounding context (e.g., the context of the material 1212 or the context of the region in which the embeddable sub-component appears). Further still, some embeddings may be ignored, not produced, or given less weight if they may distract from an overall analysis. For instance, changes to nouns, pronouns, verbs, adverbs, or adjectives may have a relatively greater effect on authorship than changes to prepositions or conjunctions.

Where the material 1212 includes authorship tokens, data regarding authorship can be stored such that each embedding's associated authorship can be determined. This can include, for example, identifying the author of the content that resulted in that embedding. In an example, there is a data structure that maps each embedding 1224 to authorship data. In some examples, authorship is baked into the embeddings such that there is a direction within the embedding space (e.g., toward positive infinity along one dimension) associated with human authorship and another direction in the embedding space (e.g., toward negative infinity along the one dimension) is associated with artificial authorship. In some examples, there may be multiple authors or it may be beneficial to identify a particular author among multiple different human or artificial authors and such data can be stored or embedded accordingly. In some examples, there is a data structure that maps embeddings to their associated authors.

For ease of illustration, the embedding space 1222 is shown in two dimensions. However, it will be understood that in most instances, embedding space has many more than two dimensions. Further, the embeddings 1224 are shown as being either "H" or "A" to reflect either human or artificial authorship of the subject embeddings 1224. In many embodiments, such labeling may not be this apparent.

Following operation 1220, the flow of the method 1200 can move to operation 1230.

Operation 1230 includes using the embeddings to determine authorship. This can include, for example, updating authorship of new or existing content or applying authorship to a piece of content that previously lacked authorship.

Operation 1230 can include operation 1240.

Operation 1240 includes clustering the embeddings 1224. The clustering can be performed using any of a variety of known clustering techniques including but not limited to centroid clustering (e.g., k-means clustering), hierarchical clustering (e.g., agglomerative clustering), model-based clustering (e.g., gaussian mixture model clustering), other kinds of clustering, or combinations thereof. Because there may be significant overlap between the embeddings, fuzzy clustering techniques can be used. The clustering can be such that embeddings of like authorship are clustered together. So embeddings having human authorship tend to be clustered together and embeddings having artificial authorship are clustered together. In some examples, the clustering involves clustering just one kind of author at a time (e.g., embeddings having no other authorship are present when the clustering occurs).

Following operation 1240, the flow of the method 1200 can move to operation 1242.

Operation 1242 includes using the clustering to determine authorship. For instance, a portion of content can be embedded into the embedding space 1222 and its position in the embedding space 1222 relative to the clusters 1232 can be used to determine authorship of the portion of content. Operation 1240 can include operation 1242 and operation 1244.

Operation 1242 can include updating authorship of the content 14 based on the clustering of the embeddings 1224 of the supplement 1214. For instance, a human author may have produced the content 14 entirely on their own (e.g., each character of the content 14 was manually typed by a human) but did so by being influenced by a conversation with an artificial chatbot. In such an instance, looking purely at the manual effort of the human, the content would be determined to have human authorship even if the human manually copied verbatim text written by an artificial intelligence. While this may be desirable in some instances, it is not in others. Clustering can be used to update the authorship of the content 14 based on the clustering of the supplement 1214 (the chat with the chatbot). For instance, each embeddable portion of the content 14 at issue can be embedded into the embedding space 1222 using the same technique used to embed the clustered embeddings 1224. Then, the embedded portion of the content 14 can be compared to the clusters (e.g., based on a distance to the centroids of the clusters) to determine to which cluster the embedded portion of the content 14 most closely belongs. The authorship of the embedded portion of the content 14 can be updated to reflect the authorship associated with the most relevant cluster. However, if the embedded portion of the content 14 is more than a threshold distance away from the clusters (or sufficiently dissimilar to the clusters in a relevant way), then it may be determined that the supplement 1214 is not relevant to the authorship of that portion of the content, and the original authorship token remains unchanged.

Operation 1242 can include updating or characterizing the authorship of a region of content 14 based on authorship of its subregions. A region of content 14 can be made up of a plurality of sub-regions. In an example, the sub-regions include at least one sub-region having artificial authorship indicated with an artificial authorship token 18 and at least one sub-region having human authorship indicated with a human authorship token 18. The region may have mixed authorship and the sub-regions having ground-truth human or artificial authorship. However, in some implementations, the sub-regions themselves may have mixed or classified (e.g., using techniques described in relation to method 1200) authorship. And those sub-regions themselves may have their own sub-regions. The region can be a higher-level region encompassing a plurality of sub-regions. For instance, an editor 12 may track authorship on a word-by-word basis, so a base level authorship region would be at the word level (in other instances, it may be on a line level, token level, character level, or other level as appropriate).

These word level regions can be considered as the sub-regions of a higher-level region. In such an instance, the higher-level region may be a sentence that comprises multiple word-level regions (in other instances, it may be on a phrase level, paragraph level, function level, or other level as appropriate).

The authorship of the region can be characterized by the clusters 1234 or other aspects of the embedding space 1222. For instance, the relative size and shape of the clustering can be used to infer authorship of the wider region. Where a human authorship cluster is larger than and encompassing of the cluster having artificial authorship, then it may be determined that the region has human authorship. The relative size and position of the clusters can be used to characterize the relative strength of authorship. For instance, the ratio of the size of the smaller cluster to the bigger cluster, can be used as an indication of the extent of authorship of the region attributable to the larger size. For example, where the artificial authorship cluster is 25% the size of the human authorship cluster, then the region can be determined to have '75% human authorship. If this number satisfies a predetermined threshold, then it may be determined that the entire region has a particular kind of authorship (e.g., in this case human).

The authorship of a region of content 14 can be influenced by the edit history of the region itself and nearby regions. Take, for example, the human authored the phrase "it was the best of times, it was the worst of times", which is then rewritten by an artificial author as: "the times were the best and the times were the worst". Depending on how attribution is configured, an authorship token engine may determine that the new sentence has entirely artificial authorship based on how words were rearranged, removed, and added. That may be appropriate in some instances, but in others it may be desirable to maintain original authorship if the core meaning of the phrase hasn't changed. In this example, the phrase was merely rewritten from passive to active voice without changing the core meaning of the phrase. To improve authorship engine accuracy in such situations, it can be beneficial to determine whether and to what extent edits change the location of the region in embedding space. For instance, an original text has human authorship and edited text was produced by an artificial intelligence. If the edits change a location, shape, size, or other characteristic of the clustered embeddings of the region in embedding space less than a threshold amount, then the original authorship can remain notwithstanding the difference. The history of the edits of the text can remain and the overall effect of the edits provided by each author can be compared in this way to determine overall authorship. Thus, even if each individual change does not represent an authorship-changing step over the prior one, the overall effect of the changes can be compared and it can be determined whether that reaches significance.

If a new addition to the content is sufficiently far away from existing content in embedding space (e.g., more than a threshold distance away), then it can be determined to have the authorship of the entity making that edit rather than inheriting authorship from existing material.

Authorship Considerations for AI Content Editing Tools

Figure 13:
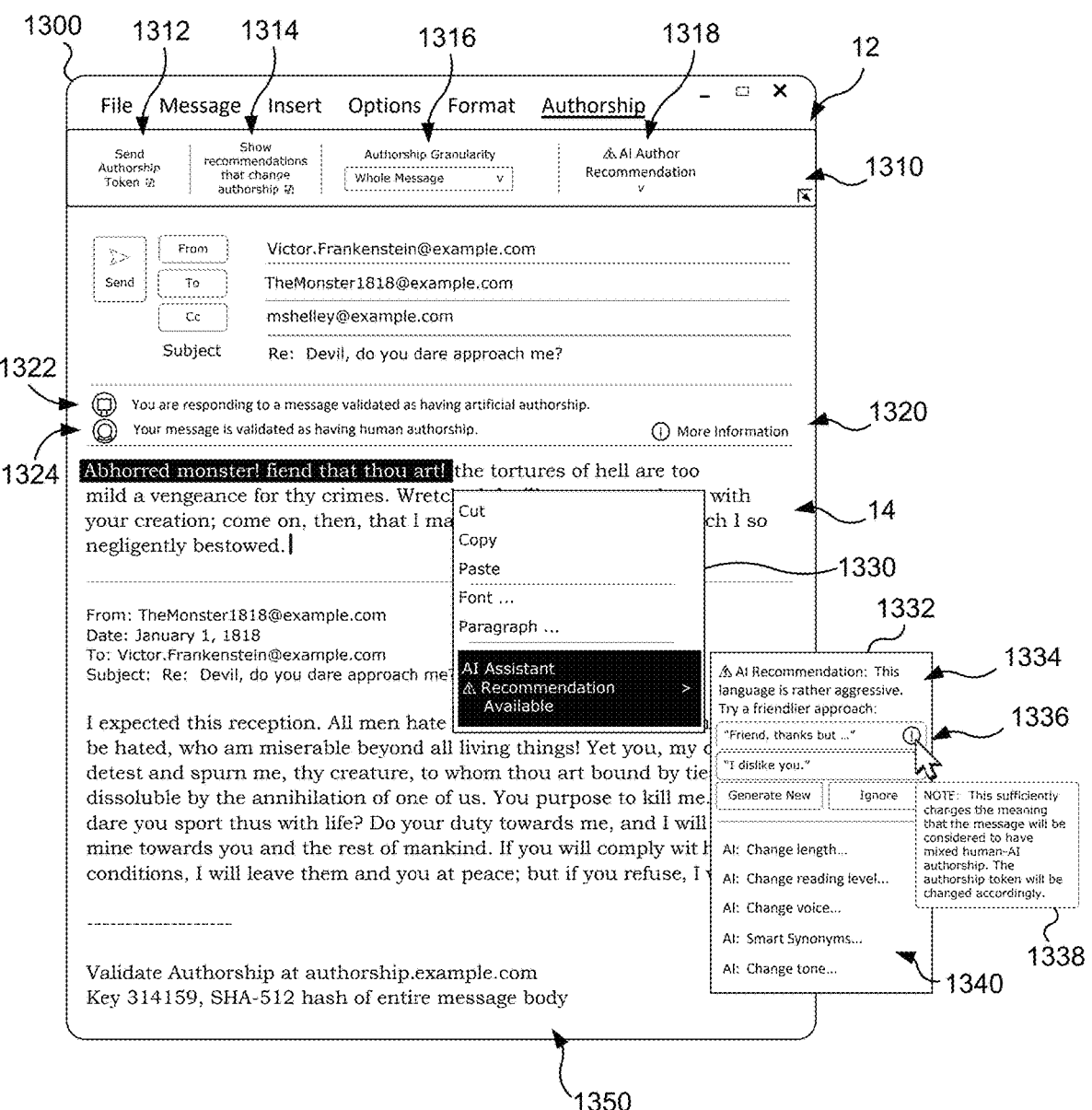
FIG. 13 illustrates an example user interface of an editor showing content.

FIG. 13 illustrates an example user interface 1300 of an editor 12 showing content 14. As illustrated, the editor 12 is for editing email message content, but techniques described herein can be applied to other editors 12 and in other contexts. The user interface 1300 includes an authorship ribbon 1310, an authorship panel 1320, and a context menu 1330. The content 14 includes an email message from a sender. The email message includes a portion 1350 describing how to validate authorship of the message.

The authorship ribbon 1310 is a user interface element showing options for a user to change settings related to authorship. In the illustrated example, the ribbon 1310 includes a first element 1312 for toggling whether to send an authorship token with the email message, a second element 1314 for whether to show recommendations that change authorship, third element 1316 for changing a granularity of authorship tracking, and a fourth element 1318 for viewing AI recommendations to the content 14.

Responsive to the first element 1312 being enabled for permitting the sending of an authorship token with the email message, the editor 12 tracks authorship and stores an associated authorship token using techniques described herein. The authorship token may then be signed or otherwise validated and sent with the message to the recipient, so an email viewer of the recipient can provide information regarding the authorship of the message. Responsive to the element being disabled, the editor 12 may warn the user that the message may be treated different by the recipient for lack of authorship tracking.

In some examples, a spam filter or another kind of filter may receive a message from a sender, determine whether the message includes an authorship token, and then take an action based thereon. For example, a user or organization may have a policy to treat messages with different levels of scrutiny depending on whether an authorship token is provided, whether the authorship token is signed, who signed the authorship token (and whether the signer is trustworthy), and what the authorship token says about the authorship of the message. Actions may include moving the message to a specific folder or channel based on authorship, identifying the message as being spam (e.g., the authorship or lack of an indication thereof may be a factor in designating the message as spam), flagging the message as having particular authorship, other actions, or combinations thereof.

Responsive to the second element 1314 for showing recommendations that change authorship setting being enabled, the editor 12 will show recommendations that may change authorship of the content 14. For instance, a user may desire an artificial author to make suggestions but only to the extent that the suggestions would not change the authorship of the content 14 to having mixed or artificial authorship. When an artificial authorship assistant of the editor 12 generates recommendations, the generated recommendations can respect this setting and not recommend changes that go too far. For example, for each recommendation, the editor 12 can determine whether the recommendation would change authorship according to current settings. If so and if the element 1314 is unchecked, then a recommendation is regenerated and the process begins again. In addition or instead, settings of the artificial intelligence are changed that will resist the artificial intelligence from generating too aggressive of a change (e.g., to lessen the likelihood of a change changing authorship). Whether and to what extent recommendations change authorship can vary depending on personal or organizational preferences and may be configurable within the editor. In some instances, the element associated with permitting recommendations that change authorship has additional granularity beyond a simple Boolean. For instance, the element 1314 may allow for the user to specify whether recommendations that would result in mixed or artificial authorship are permitted. Further still, there may be options that classify an aggressiveness of the recommendations with respect to authorship. These can be specified in any useful way, such as classifying the recommendations as small/medium/large or by providing a slider that permits a numerical quantity. In an example, an AI assistant of the editor 12 determines a current level of human authorship, determines what level human authorship will be present if a recommendation is accepted, and then determines a difference between the two. If the difference exceeds a level of artificiality permitted by the element 1314, then the AI assistant disregards the recommendation.

The third element 1316 is for changing a granularity of authorship tracking. As discussed elsewhere herein, authorship can be tracked at the level of various regions (e.g., character, word, sentence, paragraph, entire work, etc.). The third element 1316 can allow a user to specify at what level tracking is desired. For instance, a user may want to reveal the extent of authorship at a certain level but preserve privacy and not reveal authorship at lower levels of granularity. For instance, at an entire-message level authorship of the content 14 may round to having human authorship, but at a per character level, there may be at least some characters having artificial authorship. To avoid negative security or privacy implications of providing such detail, the user can specify a minimum or maximum level of granularity to provide authorship information for using the element 1316.

The fourth element 1318 is an AI author recommendation element. Upon selection, the user interface 1300 displays a menu that permits selection of recommendations by an AI author regarding the context. An example of such a menu is shown and described in relation to menu 1332, which is described in more detail below. The element 1318 includes a notification ("A") indicating that the AI author has an especially relevant recommendation.

The panel 1310 may further include an element for changing other authorship settings. Actuation of such an element can cause the system to provide a user interface for receiving changes to the authorship settings. Such settings can include any settings described herein or that a person of skill in the art can develop with benefit of the description herein.

The authorship panel 1320 is a user interface element that provides information relevant to authorship of the content 14. Here, because there is content 14 both from the user and from another, there are two authorship messages in the panel. The first authorship message 1322 in the panel 1320 is an authorship message stating that the user is responding to a message validated as having artificial authorship. The second authorship message 1324 is an authorship message stating that the message that the user is drafting is validated as having human authorship. This message 1324 enhances privacy by alerting the user that authorship information is being send as part of the message.

In some examples, the panel 1310 can alert the user to changes in authorship. For instance, a user may typically receive automated messages from a retailer regarding packages being shipped. The user would often expect those messages to have only artificial authorship because they are automated messages. If one such message came in but it was determined to have human authorship, mixed authorship, or missing authorship information, then that might be an indication of a potential security or privacy concern with the message. The editor 12 may automatically take action with respect to such a message (e.g., by making it as spam) or alert the user that the authorship is unusual or changed from what is typical. Likewise, if messages typically had human authorship but then suddenly have artificial authorship, that may also indicate a security concern and remediation can occur.

The context menu 1330 is a user interface element being displayed by the user interface 1300. In many examples (including the illustrated example), the context menu 1330 is displayed in response to a user right clicking on a text selection. The context menu 1330 provides various options for the user to select to take action with respect to the selection, including to cut, copy, or paste at the selection. Among the options is an "AI Assistant" option, which here includes a notification to the user that the AI assistant of the editor 12 has a recommendation for the user. Hovering over or selecting the AI assistant option causes the display of an AI assistant sub-menu 1332.

The AI assistant sub-menu 1332 is a user interface element providing user-selectable actions regarding an AI assistant. The menu 1332 includes a recommendation 1334 with associated actions 1336, a tooltip 1338 regarding one of the options 1336, and AI text editing options relating to the selected portion of text.

The recommendation 1334 is a recommendation regarding the content 14 for the human author by the artificial author. For instance, while a human author is editing the content 14, the artificial author may generate recommendations for the human author. The nature of the recommendations may vary depending on set user preferences. The artificial author may monitor the content 14 for tone, emotion, readability, clarity, or other factors. For instance, the editor 12 may send the current content 14 to the artificial author (e.g., via a prompt containing the content and instructions to a large language model) and receive a response from the artificial author. Depending on the nature of the response (e.g., if the response has a particular level of urgency or otherwise warrants the human author's attention based on set preferences), the editor 12 may escalate the recommendation to the user's attention via a real-time notification to ensure timely consideration by the author. For instance, here, the context menu 1330 includes a warning icon next to the statement "recommendation available". So too does the element 1318.

As illustrated, the recommendation 1334 is regarding the tone of the content 16 being potentially inappropriate. The AI assistant includes several options 1336 selectable by the user. The first two options 1336 are rewrites of the selected text.

The first of those two options 1336 is a sufficiently drastic change to the text that, at least according to current authorship rules, it would change the authorship of the message. Because of this, the option 1336 includes a warning that, when hovered over or clicked on, displays a tooltip 1338 for the user. The tooltip 1338 indicates that the recommendation sufficiently changes the meaning that the message will be considered to have mixed human-AI authorship and that the authorship token of the message will be changed accordingly.

The second option 1336 is a rewrite of the selected text but that does not sufficiently change the meaning as to warrant changing authorship (e.g., as indicated by the lack of a warning).

A third option 1336 is to generate new options. For instance, upon detecting actuation of this option 1336, the system may cause the artificial author to generate new recommended changes.

A fourth option 1336 is to ignore the recommendation. Upon detecting actuation of this option 1336, the system may hide the recommendation and remove the notification regarding the recommendation.

The additional actions 1340 are actions that can cause a change to the selected text.

The first action 1340 is to change syllables. Upon selection, the system may cause an AI author to change the length of the selected text. This may include increasing or decreasing the length. The length can be specified in any number of ways, such as a number of characters, words, sentences, syllables, tokens, or other units of length. Further, the length may be absolute length of the selection or another measurement of length (e.g., with respect to components of the selection, their average, median, minimum, or maximum length). This may include prompting an LLM with the selected text and a request to rewrite it so it has the specified length while retaining a similar meaning. In the illustrated example, the selected text is "Abhorred monster! fiend that thou art!". This text has eight syllables. Selection of the option and requesting fewer syllables may result in the text becoming, for example, "Bad beast! Fiend that thou art!", which conveys a similar meaning in only six syllables. In some examples, there is a slider that permits the user to specify how what length the new version should have.

The second action 1340 is to change the voice of the selected text. For instance, this may rewrite the text from active to passive voice or vice versa.

The third action 1340 is "smart synonyms", which allows the user to collaborate with the AI assistant to find synonyms for the words or concepts in the selected text. Where current editors use simple synonym finders on a word-by-word basis, the "smart synonyms" feature here permits a user to select multiple words or concepts and find synonyms for them. For instance, a user may select "half-horse half-man creature" and the system may propose "centaur" as a smart synonym for the combined concept. Such a system may be powered by providing the concepts as input to a large language model with a prompt asking the model to provide one or more synonyms.

The fourth action 1340 is to change the tone of the selected text. This can include changing the emotion expressed in the language. In addition or instead, this can include changing the formality of the text, such as from more formal to more casual. Other options for tone are possible, such as changing the era or location of speech. For instance, a user could choose to change the tone of the text to be that of someone living in 1960s San Francisco or 1500s England. Such an action can be performed by sending the selected text to an LLM with a prompt instructing the LLM to change the tone in the specified manner.

In the illustrated example, the content 14 portion corresponding to the message that the user is responding to includes a portion 1350 describing how to validate the authorship of the portion of the message. In the illustrated example, the portion 1350 includes a URL of a website with which authorship can be validated, a key to be used during validation, a hash function to be used for validation, and the granularity of the message that can be validated (e.g., here, the whole message, but in other examples, it may be another level of detail, such as a word or sentence level). The portion 1350 may be content added to the message that permits validation of authorship of the message using a third party. For instance, where messages are sent in a manner that may be tampered with, it may be beneficial to provide a recipient with a way to validate authorship. An example of this is described in FIG. 14.

Storage of Authorship Tokens

Figure 14:
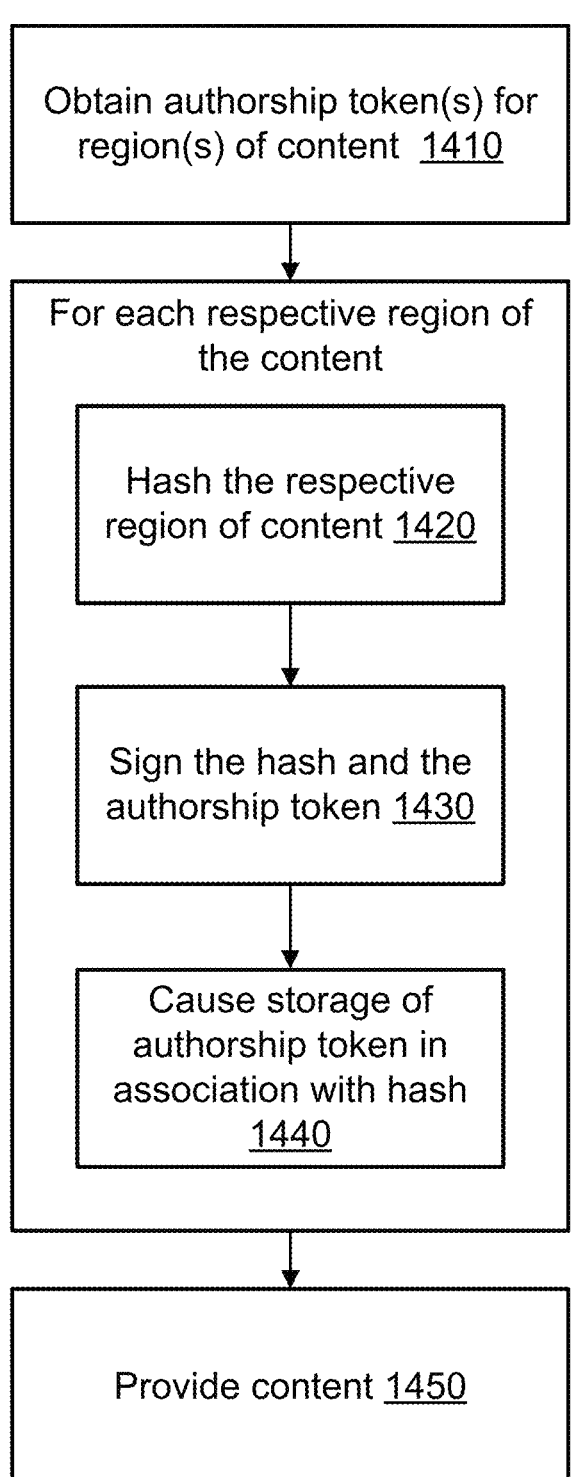
FIG. 14 illustrates an example method for storing an authorship token.

FIG. 14 illustrates an example method 1400 for storing an authorship token. It can be desirable to store an authorship token 16 of content 14 in a way that a third party (e.g., someone other than the author) can check authorship of the content. This can be especially useful when the content 14 is a plaintext message or otherwise in a format where authorship tokens may be tampered with. It may also be beneficial in situations where content is authored using an editor 12 that supports authorship tracking but then the content 14 is provided via a medium that does not support authorship tracking. The method can begin with operation 1410.

Operation 1410 includes obtaining one or more authorship tokens 16 corresponding to one or more regions of content 14 to which the authorship token 16 applies. For instance, this may be done using techniques described elsewhere herein, such as obtaining the authorship tokens 16 by executing the authorship token instructions 110. In an example, content is obtained that has a plurality of regions and a plurality of authorship tokens. For instance, a content editor may obtain or generate such tokens. A system can provide a user interface for composing an email, and while composing the email, and via the user interface, email content is created based on user input. The email content can have a plurality of regions and a plurality of authorship tokens.

Operation 1420 includes, for each respective region of content, hashing the respective region of content 14 to form a respective hash. This can include hashing the region of content 14 with a predetermined hash function, such as SHA-512 or another hash function.

Operation 1430 includes signing the respective hash, such as with a signature associated with the editor 12. The operation can further include signing both the respective hash and the authorship token. The signing can be performed with a digital signature technique, such as by signing with a private key of the editor 12 or an organization that provides or hosts the editor 12. This can be used as an assurance of the trustworthiness of the authorship token. In some instances, accompanying information may be provided, such as an indication of the settings used when determining authorship (e.g., a description or reference to the method used to determine authorship).

Operation 1440 includes causing storage of the authorship token 16 in association with the hash. This can include storing such information in an place where the information is externally retrievable. For instance, this may be storing them on a blockchain. This can include storing the information in a place accessible via a website or via an application programming interface. The information may be retrievable without with or without authentication of a requestor. In an example, the information is stored in a datastore. The datastore may be included with the content when the content is provided.

Operation 1450 includes providing the content. When providing the content, the content may be provided with an indication of how to check the authorship of the content. For instance, it may include user-readable information (e.g., information configured to be readable and understandable by a human) describing how to check the authorship. An example of this is shown at reference 1350 of FIG. 13, which includes text with the content 14 that states "Validate Authorship at authorship.example.com Key 314159, SHA-512 hash of entire message body". This directs the user where to go to validate the authorship. In that example, it is a URL of a website, but in other instances it may direct a user to an application, chatbot, or another location. As illustrated, the information is spelled out in plaintext, but the information (e.g., the key, etc.) could be preloaded into a URL. In addition or instead, there could be instructions configured for use by a program (e.g., the program viewing the content) to automatically retrieve the authorship information from a third party. In addition or instead, the program viewing the content can automatically verify the authorship information directly (e.g., verifying that a hash of the content matches the hash associated with the authorship token and verifying a signature associated with the hash and the authorship token).

In the illustrated example, the instructions include a key, which may be used as an optional extra layer of security (e.g., a person is prevented from retrieving authorship information or specific details about authorship information without providing the key). In addition or instead, it can be used to resist misattributing authorship in the case of hash collisions or multiple identical strings having different authorship. For instance, the string "good morning" may authored by many different authors in many different places. Merely relying on a hash would result in a collisions and may provide incorrect authorship attribution. The addition of the key can be used to distinguish between the same string authored in different contexts. The instructions also include a description of the hash function used to hash the message (here, SHA-512).

Verification of Authorship Tokens

Figure 15:
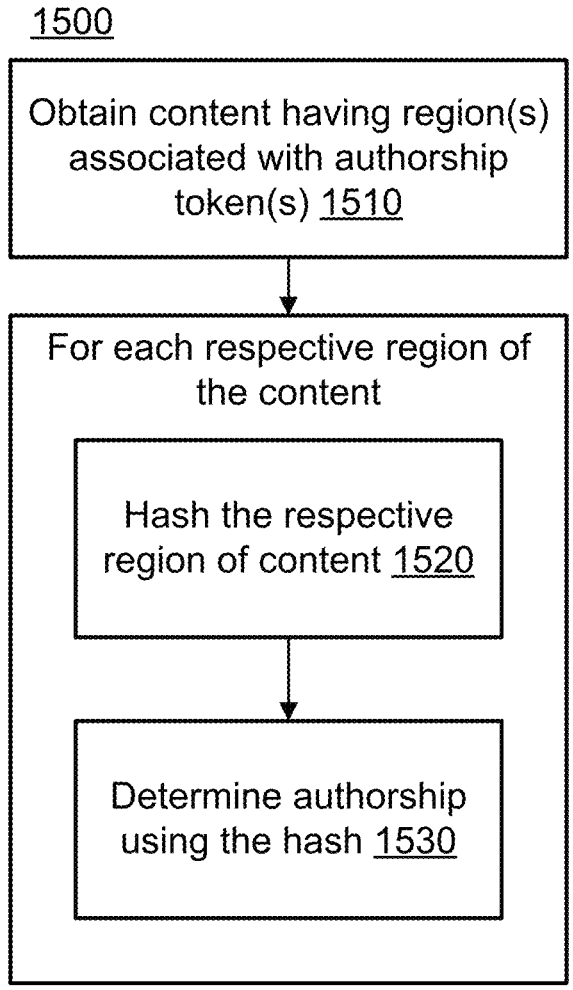
FIG. 15 illustrates an example method for verifying an authorship token.

FIG. 15 illustrates an example method 1500 for verifying an authorship token. The method 1500 can begin with operation 1510.

Operation 1510 includes obtaining content having one or more regions associated with one or more authorship tokens. For example, the content can be obtained as a result of operation 1450 of FIG. 14. In some examples, the content is obtained over a website, application, messaging platform, another source, or combinations thereof. Following operation 1510, the flow of the method 1500 can move to operation 1520.

Operation 1520 includes, for each respective region of the content, hashing the region of content. In some examples, the size of the respective regions is defined in the content itself. For instance, the region may be defined by the setting of an authorship granularity parameter of an editor 12 that created the content (e.g., see reference 1316 of FIG. 13 and associated description). The editor 12 creating the content having authorship at that level of granularity can include an indication of the granularity in the content 12. A hash function to be used can also be determined from the content (e.g., the content may specify a hash function to be used) or the hash function can be inferred from a context (e.g., it can be determined that the content was received from a particular source and that source is known to use a certain hash function). Following operation 1520, the flow of the method 1500 can move to operation 1530.

Operation 1530 includes determining authorship using the hash. This can include providing the hash to a service that stores authorship tokens. For example, it can be provided over an application programming interface, over a form, smart contract, in another way, or combinations thereof. In some examples, the service provides a response with an authorship token associated with that hash. The service may also provide a digital signature associated with the authorship token. The recipient can verify the digital signature and evaluate a trustworthiness of the signatory of the authorship token. The recipient can then take an action based on the authorship token. In an example, the recipient is a software program (e.g., an editor 12 or a content viewer) and the program provides an indication of the authorship to a user (e.g., via an authorship panel 1320).

In an example, an indication of authorship is provided. The indication of authorship can be the authorship token itself or something based on the authorship token. In an example, the indication of authorship is based on a comparison of a received authorship token and a stored authorship token (e.g., stored in association with a hash).

Different Kinds of Authorship

There may be different kinds of authorship. For example, concept versus expression. One author may decide that "the rock is big", where "rock" and "big" are concepts. But another author may choose specific words for how to express "rock" and "big" by changing them to be "the agate is huge". While the concept is unchanged, how that concept is expressed is changed. And that may be important in certain contexts. In particular, the humor of content may depend on specific word choices. Similarly, such expression may be relevant to certain kinds of content like poetry, song, or other forms of artistic content where things like syllables, rhyming, or other aspects are important. But in still other contexts, specific expression may not matter. For example, in a business email, journal article, patent application, or elsewhere there may be little importance placed on the authorship of expression. Instead importance may be placed on the author of the concept. Authorship need not be binary and instead may be allocated among the two (or more) but with different weights.

The difference between concept and expression can be determined based on a location of embeddings of a word in embedding space. Small distances (e.g., distances of less than a threshold) caused by an edit can be considered to edits to expression. Whereas large distances (e.g., distances greater than that threshold) can be considered to be edits to concept. Thus, the author of the content can be changed to the author of the edit depending on settings regarding whether expression or content are more important to authorship.

While many examples herein have focused on authorship, techniques described herein can also be applicable to demonstrating inventorship. For example, it may be beneficial to be able to demonstrate a level to which an invention was invented by a human versus an artificial intelligence (see, e.g., Inventorship Guidance for AI-Assisted Inventions, 89 Fed. Reg. 10043 (2024)). However, as artificial intelligence becomes integrated into the invention process (e.g., conducting research using artificial intelligence, writing code with artificial intelligence, brainstorming with artificial intelligence, drafting an invention writeup with an editor having artificial intelligence) and the patent drafting process (e.g., drafting a patent application with the assistance of artificial intelligence), it may become beneficial to demonstrate which ideas were invented by a human versus an artificial intelligence. Authorship tokens described herein can be modified for such a use case. In an example, authorship token settings can be modified to focus on authorship of concepts rather than creative expression of words as a way to focus more on inventiveness rather than mere creative expression of an invention. Thus, an invention disclosure or patent application can include authorship tokens, that can be used to support statements regarding the inventor.

Tracking the Selection and Arrangement of Content

Authorship tokens can be used to track the selection and arrangement of content. For instance, a token can maintain an indication not just of its relation to the content it is in, but also the content it originated from. An example is shown in FIG. 16.

FIG. 16 illustrates example first content 1602. The first content 1602 is content written by a first author (e.g., an artificial author). A second author (e.g., a human author) then selected and arranged a subset of the first content 1602 to form second content 1604. In this example, the second author chose fifty characters (excluding spaces) from eight different places in the first content 1602 and combined them to form the second content 1604. In certain implementations, an authorship engine may determine that because the second content 1604 is a subset of the first content 1602, it retains the same authorship. This is represented by a first representation 1610 in which the entirety of the second content 1604 has the same authorship (e.g., artificial) and is labeled accordingly with an authorship token 16.

But in a second representation 1620, one or more authorship tokens 16 may capture not just content authorship but also arrangement authorship. In the second representation, different portions 1606 of the second content 1604 are described by different portions of the authorship token 16. For example, a portion 1604 (e.g., a subset of the second content 1604) can be described by a locator 1622 describing where in the original work (e.g., here, the first content 1602) the respective portion 1604 is from. Here, the locator 1622 describes the range of characters in the original work that correspond to the respective portion 1604, but other descriptions are possible. There can be a content authorship token portion 1624 describing the authorship of that respective portion 1604. The content authorship portion 1624 can be an authorship token (e.g., as described elsewhere herein) that describes the authorship of the entirety of the respective portion 1604 (e.g., which may be a largest contiguous block having a same authorship without contribution by any other author).

The arrangement portion 1626 can describe authorship of arrangement. In some examples, the arrangement portion 1626 can describe how different the arrangement is from the original (e.g., measured with Levenshtein distance or another measure). Other measures can be used to determine difference, such as measuring sentiment (e.g., emotion). Further, a difference between the two in embedding space can be measured. Each can be put through an embedding function that also uses attention of the block of text at issue (e.g., first or second content) and then cluster the resulting embeddings and measure their distance in embedding spaces.

There can be a content size indication 1628, which describes how much of the original work the portion 1606 made up. In the illustrated example, the content size indication 1628 describes the size in terms of the percentage of the first content 1602 that the portion 1606 represents.

As illustrated, the arrangement portion 1626 applies to a higher-level region (e.g., a sentence level) than the portions 1606 (e.g., a word or phrase level). In some instances, an authorship engine can determine a minimum size that a region can be to have arrangement authorship (or at least have arrangement authorship independent of the authorship of the content of the region). For instance, an individual character or word may lack sufficient length for arrangement authorship to apply, but a sentence, paragraph, or longer could have sufficient length for arrangement authorship to apply.

In some examples, the authorship engine determines whether the selection and arrangement follows an explicit procedure, process, system, method of operation, concept, or principle as described in 17 U.S.C. § 102(b). If so, the selection and arrangement credit is prohibited. In addition or instead, arrangement credit is given but attributed to the particular process applied. In an example, such a process for the selection and arrangement is identified based on one or more tools or commands used to effectuate the selection and arrangement. For instance, if the user activates a sorting feature of the content editor 12, which then causes data to be arranged in a specific order (e.g., alphabetically, numerically, by type, by size, another sorting technique, or combinations thereof), then authorship of the selection and arrangement can be determined to be the sorting method used rather than by the user. If a user activates a filtering function of the content editor 12 (e.g., to filter by type or other characteristics), then that filtering function can be given selection and arrangement credit rather than the user. However, in some instances, the user may be given credit for the selection of the filtered data based on the user exercising judgment in reducing the content included using the filtering. In addition, if a user instructs an artificial agent to perform some kind of filtering or sorting process, then the sorting process may be given arrangement credit rather than the user providing the instruction. For instance, the user may provide a prompt like: "remove every other word in this sentence" or "sort these functions by return type", but because a specific scheme was used to effect the arrangement or selection (e.g., in contrast to creative judgement), authorship in the selection and arrangement can be given to the scheme rather than the user.

In a further example, a user may write content in a rich text editor having various formatting, copy that rich text content, and paste it into a plain text editor (e.g., an editing application or a text field of a social media site). But rather than pasting using a traditional paste feature, the user pastes using an AI paste feature (e.g., POWERTOYS ADVANCED PASTE by MICROSOFT) that reformats the copied content. Thus, the AI arranges or otherwise changes content such that it is pasted in a new format (e.g., markdown format). But because the selection and arrangement (or other modification) of the content is performed using a predetermined rote scheme (e.g., converting rich text format to markdown format), credit for the selection and arrangement (or other changes) is not given to the AI that made the change.

In an example, there is a method that includes obtaining first content associated with authorship tokens indicating that a first author authored the first content; receiving one or more edits to arrangement of the first content from a second author different from the one or more first authors, thereby forming second content; and updating the authorship tokens to reflect that, with respect to the second content, the second author has authorship of at least some of the arrangement of the second content.

Updating the authorship tokens can include maintaining the indication of authorship by the first author. One or more of the authorship tokens can include one or more indicators of where in the first content a respective portion of the second content originated. The method can further include determining a significance of the one or more edits to the arrangement of the first content. The updating of the authorship tokens can be based on the significance of a respective edit satisfying a threshold of significance. Determining the significance of the one or more edits to the arrangement of the first content can include an operation selected from the group consisting of: determining how different edited content is from unedited content; calculating a Levenshtein distance; measuring sentiment; and determining a distance in embedding space.

In an example, the method can include receiving one or more edits to selection of the first content from the second author. The second content can be the product of the one or more edits to selection. The authorship tokens can be updated to reflect that, with respect to the second content, the second author has authorship of at least some selection of the second content. The method can further include determining a likelihood that the one or more edits to selection of the first content follow an explicit procedure, process, system, method of operation, concept, or principle. The updating of the authorship tokens can be responsive to determining that the likelihood fails to satisfy a predetermined threshold.

In an example, the method further includes determining a likelihood that the one or more edits to arrangement of the first content follow an explicit procedure, process, system, method of operation, concept, or principle. The updating of the authorship tokens can be responsive to the likelihood failing to satisfy the threshold. In an example, the method can resist updating the authorship tokens responsive to the likelihood satisfying the threshold. Determining the likelihood can include determining that the one or more edits to the arrangement of the first content are responsive to the actuation of a tool or command used to effectuate the arrangement. For example, the tool or command can be a sort tool or command. Determining the likelihood can include determining that the one or more edits to the arrangement of the first content are responsive to the actuation of a tool or command used to effectuate the arrangement. Determining the likelihood can include determining whether the second author instructed an artificial agent to perform a specific sorting process. Determining the likelihood can include determining whether the second author exercised judgement in the arrangement. The method can include providing arrangement credit to the explicit procedure, process, system, method of operation, concept, or principle rather than the second author.

Removing the Selection and Arrangement of Content

As discussed above, authorship tokens can be used to track the selection and arrangement of content. But it may be beneficial to provide a feature to remove the selection and arrangement of content. For instance, a first author (e.g., an artificial author) may produce first content. Then a second author (e.g., a human author) produces second content by selecting and arranging the first content. A third author (e.g., a human or artificial author) having access to the second content but not the first content wants to create third content that remixes or otherwise modifies the artificially generated aspects of the second content but without copying the selection and arrangement of the second content by the second author. For instance, this may be because the first content is a copyright free work generated by an artificial author, and the second author has a copyright in their selection and arrangement of the first content that formed the second content. Undoing the selection and arrangement in a useful way that retains aspects of the first work presents a technical challenge that can be addressed through certain implementations of an authorship engine.

Continuing the example of FIG. 16, an authorship engine can receive the second content 1620 having the authorship tokens 16. The authorship engine can break the second content 1620 into the portions 1606, rearrange the portions (e.g., randomize the position of the portions 1606) to be used as the basis for the third content by the third author. The third content can thus have removed at least a portion of the arrangement of the second content provided by the second author.

In addition or instead, the content engine can undo the selection performed by the second author. Where the authorship tokens 16 include information about the first content, that information can be used to undo the selection. For instance, where the authorship tokens 16 include an identifier of the first content, some or all of the first content can be retrieved and used as the basis for the third content. The authorship tokens 16 may include a description of the first content (e.g., a prompt used to generate it) but lack an identifier of the first content itself. In such an example, the authorship engine can use a large language model or other generative artificial intelligence to produce mock first content (e.g., a non-verbatim simulacrum of the first content) and use that mock first content to dilute the second content. The diluted second content can then be provided to the third author for use in forming the third content. For instance, the authorship engine can provide the prompt described by the authorship tokens and include an instruction to include the rearranged portions in the output. The resulting output can thus mimic the first content but be diluted in such a way that removes the selection and arrangement by the second author.

Using the above process or similar processes, a user can undo the selection and arrangement of the first content by another author and use the resulting third content as the basis for their own work.

Figure 17:
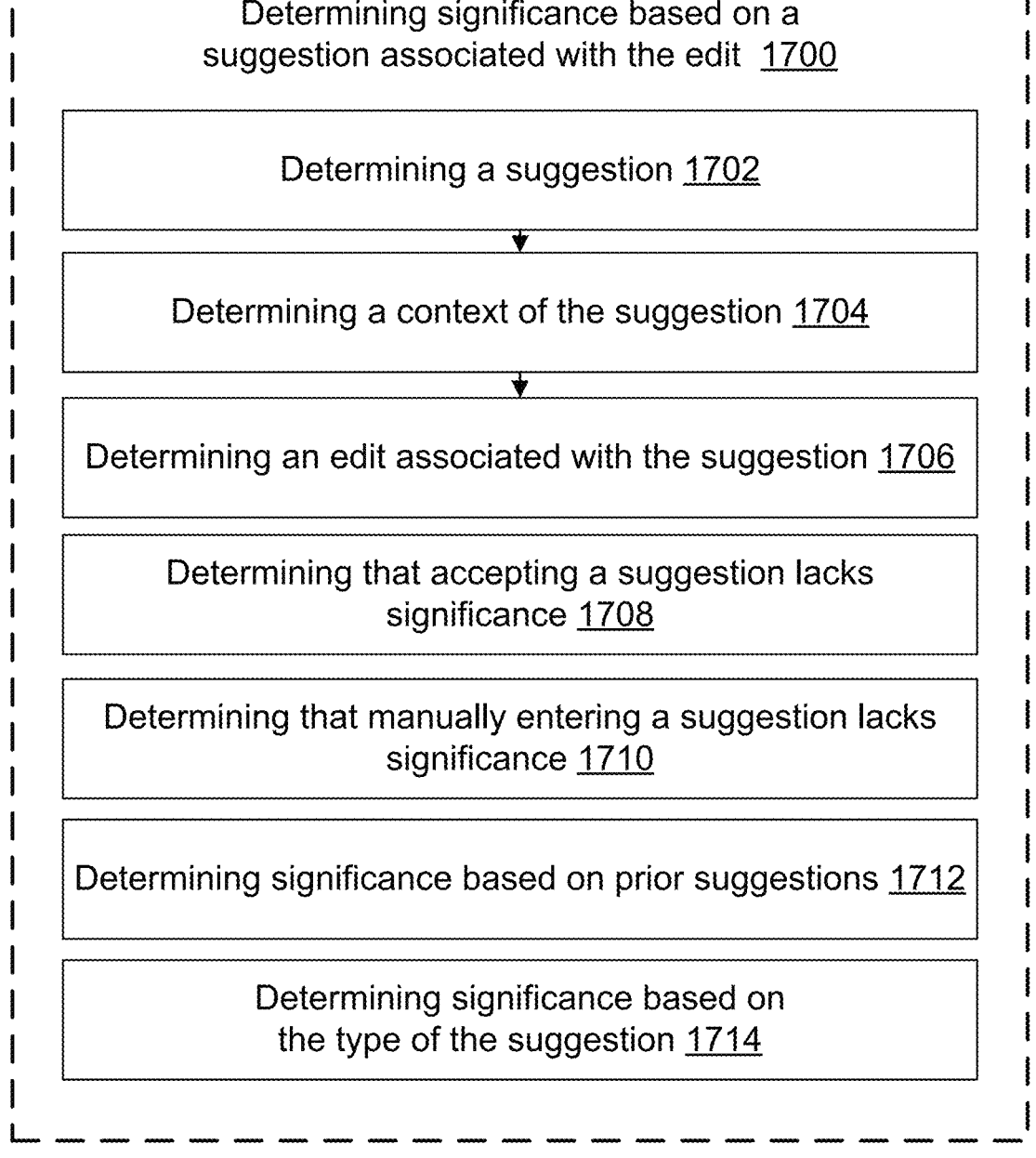
FIG. 17 illustrates an example method for determining significance based on a suggestion associated with an edit.

In an example, there is a method comprising obtaining first content associated with first authorship tokens indicating that a first author produced the first content and second authorship tokens indicating that a second author selected or arranged the first content; modifying the first content to form second content based on the second authorship tokens; and providing the second content, wherein the second content maintains the first authorship tokens and lacks the second authorship tokens. In an example, the method is performed by a content editor. In an example, the first author is an artificial author and the second author is a human author. Modifying the first content to form the second content can include rearranging the first content to remove arrangement by the second author. Rearranging the first content can include randomizing a position of portions of the content arranged by the second author. Modifying the first content to form the second content can include generating ersatz content based on the first content; and adding the ersatz content to the first content, thereby removing selection by the second author. Generating ersatz content based on the first content includes generating the ersatz content with the first author (e.g., a large language model). Modifying the first content to form the second content can include removing content regions produced by the second author. In an example, the method can further include applying an edit to the second content by a third author to form third content. The third content can include an authorship token corresponding to the third author. The content can be, for example, text content. Significance of Suggestion Related to Edit FIG. 17 illustrates an example method 1700 for determining significance based on a suggestion associated with an edit. The method 1700 can begin with operation 1702.

Operation 1702 includes determining a suggestion. In some examples, this can include determining a suggestion being presented or provided using an API associated with an active artificial author. In an example, the suggestion is received by the editor 14 from artificial author (e.g., from an API of the editor 14). In examples, the suggestion is provided by the editor 14 (e.g., a process or subprocess of the editor that provides suggestions). In another example, a screen reader or other monitor watches the content on the screen and identifies suggestions. The suggestion can be stored, for example, in a data structure (e.g., a list). There can be a history of the recent suggestions that can be later referenced.

Some implementations of generative AI assistants (sometimes referred to as "copilots") automatically provide a suggestion of what the user may want to write next (or what the AI assistant believes the user will write next) in the form of suggested text being written in a different shade than already-entered text and extending past the cursor. Typically, if a user hits the "tab" button, the suggested text is entered and the cursor moves to the end of the just entered text. Alternatively, the user could manually enter the content of the suggestion. In some instances, if the user writes something different than what is suggested, then a new suggestion replaces the old suggestion or the suggestion disappears until the generative AI proposes a new suggestion. In some instances, the suggestion remains visible if the user manually types the content (e.g., characters) of the suggestion.

Following operation 1702, the flow of the method 1700 can move to operation 1704.

Operation 1704 can include determining a context associated with the suggestion. Here, the context is the factors that affected the suggestion. In many examples, the context includes the immediate surroundings of where the suggestion is being placed. For instance, the user may have started a sentence and there is a suggestion for how to finish the sentence. The context would often include the start of the sentence because that influences the suggestion of how to end it. The context may include preceding sentences because they may provide antecedent basis or other support for what is being suggested. Where the suggestions are in association with source code content, the context may include the scope of the class, function, loop or other region at issue because they may affect what variables are suggested. The context may include other factors, such as information about preferred styles of the user, training data of the machine learning model used to produce the suggestion, a dictionary from which the suggestions are pulled, other contexts or combinations thereof. The context may be limited to what the artificial author (or other suggester) actually considered when making the suggestion. The context may be determined by calling an API or by analyzing what information was provided to the artificial author that resulted in a suggestion as output. In some examples, the context is estimated based on a predetermined number of characters, words, or other regions surrounding (e.g., both before and after) the location of the suggested edit. The context can be stored in an appropriate data structure. Following operation 1704, the flow of the method 1700 can move to operation 1706.

Operation 1706 can include determining that an edit is associated with the suggestion. In an example, edits are determined using techniques described in relation to operation 210. The edit may be an individual edit (e.g., a character) or a combination of edits (e.g., one or more words). The edit can be compared with the edits in the history to determine whether the edit is associated with a suggestion.

In some examples, there is association if the edit (or a portion thereof) matches verbatim the suggestion. In an example, the suggestions are stored in a trie data structure. While an edit is being made, the trie data structure is traversed based on the edit and used to quickly and efficiently determine whether the edit exactly or approximately matches a suggestion. If so, then it can be determined that the edit is associated with the suggestion. In addition or instead, matches are found by embedding the suggestions and edit in vector space and then comparing a distance between them. Further still, if the editor 14 determines that a user accepts a suggestion, then the edit resulting from the suggestion can be automatically determined to be associated with the suggestion. For instance, where the clicking of a button (e.g., an "accept" button) or pressing a key (e.g., hitting tab results in the placement of the suggestion in the content, then the edit corresponding to that placement can be determined to be associated with the suggestion.

Operation 1708 includes determining that accepting a suggestion lacks significance. For example, it can be determined that the edit accepts the suggestion. Responsive to such a determination, it can be determined that the edit lacks independent significance. For instance, the author accepting the suggestion is not the author of it, but rather the author that made the suggestion is the author of the edit.

Operation 1710 includes determining that manually entering a suggestion lacks significance. This includes determining that the edit was merely typing what was already suggested. Thus, the significance or provenance of an edit is affected by whether a user is merely manually entering suggested text. For example, an authorship engine can compare text entered manually by a human with text suggested by an artificial intelligence. If the text is identical or substantially similar, then the engine may determine that no significant human authorship occurred (e.g., because the human user was merely manually following the artificial suggestion). However, in some instances, the edit may be considered to have human authorship if the suggestion by the artificial intelligence lacks significance of its own. How the authorship engine handles content provided in that manner can depend on policies and preferences set by the user or an organization. For example, there may be circumstances where it is desirable to resist circumstances in which a human user merely manually edits what an AI user suggests to have the content receive human authorship attribution for something that was actually authored by an AI. But on the other hand, it may be the case that the AI "thinks" of the same content that the user did and suggests it faster than the user can type. It may be undesirable for the user to lose credit in such a circumstance. The authorship engine may provide configurable settings or preferences to address authorship in such situations to achieve a desired balance.

Operation 1712 includes determining significance based on prior suggestions. For instance, although an author "merely" accepts a suggestion, that acceptance may follow significant prior editorial control over the suggestion. In an example, an AI suggests a first portion of content, whereupon the human author begins typing a second portion of content different from the first. The AI then updates its suggestion based on the typed beginning of the second portion of content and suggests a third portion of content. When the human accepts the suggested third portion of content, then that accepted suggestion may be considered to have human authorship even though it was suggested by an AI because it reflected human creativity in disregarding the first portion of content that was suggested by the AI and affirmatively beginning an alternative portion. User or system thresholds may be needed to determine how much accepted AI content qualifies as human authored in this instance. These thresholds may reflect a count of letters, words, or sentences; or the thresholds could be variable (e.g. as a multiple of the amount of text entered before accepting the suggestions) or the thresholds could be AI-determined based on one or more factors such as length of accepted content; how different the first, second, and third portions of content are from each other; and how original the resultant content is.

For instance, a user may have received several suggestions from an artificial author while producing content that were not accepted, and then the user finally accepts a suggestion. In some circumstances, the level of editorial control in disregarding prior suggestions before finally accepting a suggestion can indicate authorship by the author accepting the suggestion. Thus, the level of an author's involvement can be a factor in determining authorship. In some instances, human authors are present for and supervise the creation of content by an artificial intelligence. In some implementations, that level of involvement can be a factor in indicating that human authorship is present despite the actual content being created by an artificial author. In other instances, the artificial author may autonomously or semi-autonomously generate the content with little to no human supervision or input. Such a relatively limited level of involvement may weigh against a finding of human authorship. Thus, the nature of involvement (even supervision) by the authors can be a factor in determining authorship. A human accepting, certifying, or supervising changes to content by an artificial author may weigh in favor of human authorship even if such involvement does not happen contemporaneously with the artificial authorship (e.g., the human may provide such involvement later).

Operation 1714 determining significance based on the type of the suggestion. Suggestions may take different forms and they may affect the significance of an edit based thereon. Types of suggestions include correction suggestions, template suggestions, prediction suggestions, and generic suggestions.

A correction is a suggestion that is selected to correct a perceived error in content. A common example of this arises in the context of spell check. A user operating an editor 14 may enter a word that is not in a dictionary of a language that the editor believes the user is typing in. For instance, a user may type "paetnt", which is not a valid entry in a dictionary that the editor 14 uses for checking the spelling of text content. The editor then highlights the word (e.g., by rendering a red wavy line beneath the word) to indicate that the word may not be correct. The user may activate a spell check function (e.g., by right clicking on the word) and be presented with suggestions for how to correct the error (e.g., "patent", "patient", and "paint") as well as an option to add the word to a dictionary or have the editor ignore the alleged misspelling. Upon selecting one of the suggestions for how to correct the error (e.g., selecting "patent" because the user intended to type that word but transposed the "e" and the "t"), the editor replaces the erroneous word with the suggestion, thus making an edit to the content. In some implementations, because the user did not make the suggestion and did not make the change, the edit can be considered to have artificial authorship. In some implementations, because the user selected the suggestion to accept, the user has authorship. In some implementations, because the user selected the suggestion from among many different possibilities, the user has authorship but had there only been one suggestion that was accepted the user would not have authorship. However, as relevant to this operation, a distinguishing factor may be that the suggestion is a suggestion to correct an error. An authorship engine may determine the type of the suggestion (e.g., using an API, an internal state of the editor, or examining what kind of author is making the suggested change) is a correction of an error and determine that the suggestion is not significant (e.g., does not override authorship of the original content even if the original content is incorrect). This may be beneficial in certain circumstances by more accurately reflecting user expectations of authorship. Similar changes may be applied in the source code context, such as by the correction of a variable, function, or class name from one that doesn't exist (even if it is spelled correctly) to one that does exist. Of course, there may be other situations in which the correction of an error is important to authorship. For instance, the fixing of a more substantial bug than a misspelled variable or correcting an incorrect answer to a math problem or proof may warrant different significance considerations. Regardless of how it may be used, the type of suggestion being the correction of an error can be used as a factor in determining significance of an edit.

A template suggestion is a suggestion to have the form or format content conform to a template. A classic example is an editor that can detect that a user is writing a letter (e.g., based on detecting a user typing "Dear . . . ") and apply a template or formatting to help the user write the letter (e.g., adding a date section, signature block, return address, or other aspects). As another example, the editor may detect that an author wants to make a list (e.g., a bulleted or numbered list) and automatically apply an edit to the content to apply that template (e.g., by converting an asterisk to a bullet). In the source code context, the editor may automatically apply code indentation or add closing parentheses or braces to conform to a code formatting template. Thus, the application of a template may be an edit to content performed by an artificial author, but nonetheless it may be considered to be authored by the author of the content that prompted the application of a template. So responsive to determining that the suggestion is the application of a template in a context in which the content appears to match a template, the suggestion is not considered to be significant.

The personalized suggestion is a suggestion that is a prediction of what that specific author's next edit will be. For instance, a human author may be entering text and the editor suggests the next few words based on what the artificial author of the suggestion predicts that the specific human author would type next (e.g., based on learning from other content written by that specific human author). A personalized suggestion can be similar to but different from a generic suggestion. A generic suggestion can be what an artificial author would produce next without respect to the specifics of the author of the next content. The personalized suggestion may be the result of fine tuning on other content produced by an author (e.g., the human author), whereas the generic suggestion may lack such fine tuning or be fine-tuned on a non-author-specific set of content. As a specific example, a human author may start typing the following in a new document "Mr. Smith ran". If the human author routinely writes descriptions of how people ran that year's Twin Cities Marathon, then a personalized suggestion by the editor may be "the 2024 Twin Cities Marathon". But without any other context, a generative artificial intelligence producing a generic suggestion might suggest "very fast" or "for office" because its training data is sufficiently diverse that either of those could be the highest likelihood way to continue the sentence. Further, even if the word "marathon" did appear in the context, the generic suggestion may be a more popular marathon in the training data like "the Boston Marathon" than the more likely marathon that the human author would normally write about. Thus, suggestions can be classified as a personalized suggestion or a generic suggestion depending on how personalized or generic the suggestion is.

In some examples, it is sufficient to classify a suggestion as personalized if the artificial intelligence making the suggestion has been fine tuned on or otherwise customized for the author's content beyond the current context. But, in some instances, a generative AI may be personalized to a user but be unable to offer a personalized suggestion (e.g., because the context for which the suggestion is being generated is sufficiently novel) and may instead provide generic suggestions. In some instances, this can be determined based on determining whether a confidence level for a suggestion passes a predetermined threshold. If the threshold is satisfied, then the suggestion can be considered personalized, otherwise the suggestion is considered generic. In some examples, a suggestion can be considered significant if it is a generic suggestion but not significant if it is a personalized suggestion.

In an example, there may be two competing artificial authors making suggestions. One of them may be fine-tuned or otherwise personalized an author (e.g., a human author) and the other may make generic suggestions. The output of the generic artificial author and the personalized artificial author can be compared. Where the suggestions match, then the suggestion can be considered to be not significant (e.g., because it's personalized to the human). If they do not match, then the generic suggestion can be considered to be significant (and the resulting edit would therefore be considered to have artificial authorship).

While several different operations have been discussed above and they may be independent or mutually exclusive, they need not be. The determining of significance may be based on the combination of multiple aspects or factors described above or elsewhere herein.

Reassessing Authorship Tokens

There may be tradeoffs between authorship accuracy and computing resource consumption. For instance, as described herein, there are many techniques, factors, and settings that can be applied when determining authorship to improve accuracy of the determination. However, at least some may require significant enough computing resources that their real-time application becomes infeasible or detracts from a user experience of the editor. For instance, many users of an editor may value responsiveness and low latency, but the resources required to assess authorship for every edit made using an editor by a human or artificial author may negatively affect the responsiveness of the editor. Thus, there may be a tradeoff between accuracy of authorship determination the experience of the user operating the editor. One solution to address this tradeoff is to begin by applying a fragile authorship token and then reassessing that authorship token at a later time.

Further, additional data may subsequently become available that changes one or more assumptions on which an authorship token was originally based. Thus, reassessing an authorship token can improve accuracy.

Figure 18:
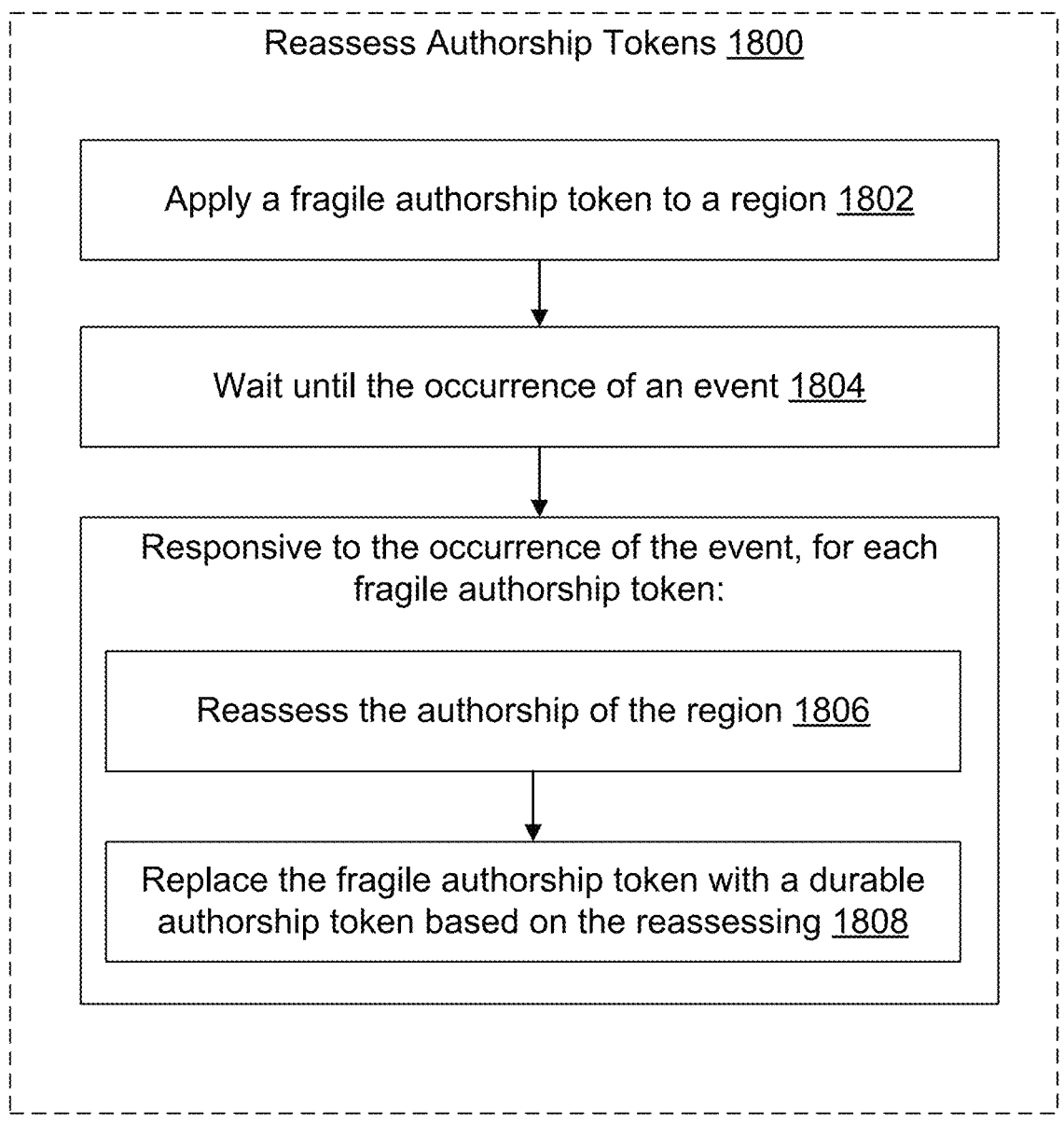
FIG. 18 illustrates an example method for reassessing authorship tokens.

So, in some circumstances, it may be beneficial to reassess an already-applied authorship, such as using the technique described in association with FIG. 18.

FIG. 18 illustrates an example method 1800 for reassessing authorship tokens. The method 1800 includes operation 1802.

Operation 1802 includes applying a fragile authorship token to a region. The fragile authorship token is an authorship token configured to be replaced by a durable authorship token after reassessment. A fragile authorship token can include or lack a feature that indicates that it is fragile. In some examples, a fragile authorship token is stored in a location or region different from a durable authorship token. In some examples, fragile authorship tokens lack a protection feature present in durable authorship tokens (e.g., fragile authorship tokens may lack encryption, hashing, anti-mimicry features, other aspects, or combinations thereof). In an example, the fragile authorship token is based on a first standard and the reassessment will be based on a second standard. In some examples, the second standard is an approach to determining authorship that is more resource intensive (e.g., in terms of amount of time, memory, or clock cycles required to perform the associated calculations) than the first standard. In an example, the first standard is less accurate than the second standard. In an example, the first standard considers less data than the second standard.

Operation 1804 includes waiting until the occurrence of an event. The event can be any of a variety of relevant events including but not limited to: expiration of a timer, resource consumption levels falling below a threshold, a pause in receiving new input, saving of a document, uploading of a file, compiling a program, actuation of a user interface element, receiving a command, other events, or combinations thereof.

Then certain operations occur responsive to the occurrence of the event. In an example, for each relevant fragile authorship token (e.g., each one in a document, project, or other relevant delineation), operation 1806 occurs.

Operation 1806 includes reassessing the authorship of the region to which the fragile authorship token applies. In an example, the reassessing is according to a second standard. Following operation 1806, the flow of the method 1800 can move to operation 1808.

Operation 1808 includes replacing the fragile authorship token with a durable authorship token based on the reassessing. The replacing can include retaining authorship and changing only the durability of the authorship token. In another example, the replacing includes replacing a fragile authorship token indicating that a first author has authorship with a durable authorship token indicating that a second author has authorship.

In an example implementation, there is a method that includes, while providing a content editor to a user having a file containing content, determining that a user of the content editor has made a manual edit to the content within the content editor, wherein the manual edit includes one or more changes, insertions, or deletions in a region of the content; determining first authorship of the region associated with the manual edit according to a first standard; applying a fragile authorship token in association with the region based on the first authorship; responsive to occurrence of a predetermined event, determining second authorship of the region associated with the manual edit according to a second standard different from the first standard; and replacing the fragile authorship token associated with the region with a durable authorship token based on the second authorship. The predetermined event can be an event selected from the group consisting of: expiration of a timer, resource consumption levels falling below a threshold, a pause in receiving new input, saving of the file, uploading of the file, compiling a program associated with the file, actuation of a user interface element of the content editor, and receiving a command. The first authorship can be the same as the second authorship. In an example, the fragile authorship token is stored in a first location and the durable authorship token is stored in a second location different from the first location. For instance, the first location is in a file containing the content and the second location is external to that file (e.g., local to the file or remote from the file). A region associated with the fragile authorship token can be different from a region associated with the durable authorship token (e.g., the fragile authorship token can be associated with a word and the durable authorship token can be associated with a sentence that contains the word). The fragile authorship token can lack a protection feature present in the durable authorship token. In an example, predetermined event is a first predetermined event of a first event type; and the method further includes: detecting the occurrence of a second predetermined event of a second predetermined event type different from the first predetermined event type;

responsive to detecting the occurrence of the second predetermined event, reassessing the authorship of the region; and modifying the durable authorship token associated with the region based on the reassessing. In an example, the first standard is less resource intensive than the second standard. In an example, the region changes between determining the first authorship and determining the second authorship.

While much of the above method 1800 is focused on reassessing fragile authorship tokens and replacing them with durable authorship tokens, even durable authorship tokens (or authorship tokens lacking a fragile or durable classification) can be reassessed. In many examples, content may undergo significant edits over the course of being created. This may include content being authored by two or more different authors and then being subsequently revised by one or more of those authors or different authors. This may result in a hodgepodge of regions of content having various authorship that lacks meaning. For instance, after a significant amount of edits, there may be individual words or letters having one authorship but are surrounded by regions of other authorship. In addition to being distracting and potentially misleading, the additional authorship may take up unnecessary space and maintaining it may waste resources. Such islands of content authored by another author may be reassessed to determine whether that content should still have different authorship in the current context. One way to assess such content is to determine whether it is predictable given its new context. For instance, if all text except for the italicized portion in the following sentence had the same authorship: "It was a dark and stormy night", an authorship engine may determine whether the word having unique authorship (here, "and") would be predictable or insignificant given the surrounding context (e.g., based on standards of significance or predictability described elsewhere). If so, it can have its authorship changed to the authorship of the surrounding text. Otherwise it can maintain its independent authorship. In an example, such islands of content can be identified by comparing the size of the island of content with surrounding content. If the island is smaller than a threshold size (e.g., a predetermined number of words or characters) and is adjacent one or more regions having the same authorship, then the region can be identified as an island and have its authorship reassessed.

In an example, there is a method comprising, while providing a content editor to a user showing content, identifying a meta-region of content having mixed authorship, the meta-region including a first sub-region of the content having first authorship indicated by a first authorship token and a second sub-region of content having second authorship indicated by a second authorship token. The method further includes determining a significance of the first sub-region based on the second sub-region; determining that the significance fails to satisfy a threshold; and responsive to determining that the significance fails to satisfy the threshold, updating authorship of the meta-region. Determining the significance of the first sub-region can include treating the first sub-region as being an edit to the second sub-region and determining a significance of the edit. Updating authorship of the meta-region can include updating the first authorship token to indicate second authorship. Updating authorship of the meta-region can include removing the first authorship token, removing the second authorship token, and ensuring that a third authorship token associated with the meta-region indicates second authorship. Ensuring that the third authorship token associated with the meta-region indicates second authorship can include, for example, modifying an existing authorship token associated with the meta-region or adding the third-authorship token to the meta-region Identifying the meta-region can be responsive to the occurrence of an event selected from the group consisting of: expiration of a timer, resource consumption levels falling below a threshold, a pause in receiving new input, saving of the file, uploading of the file, compiling a program associated with the file, actuation of a user interface element of the content editor, and receiving a command. In an example, the first and second sub-regions are word-level regions and the meta-region corresponds to a sentence-level region.

In an example, the method further includes identifying a second meta-region of the content that also has mixed authorship. The second meta-region can include a third sub-region of the content having first authorship indicated by a third authorship token and a fourth sub-region of content having second authorship indicated by a fourth authorship token; determining a significance of the third sub-region based on the fourth sub-region; determining that the significance of the third sub-region based on the fourth sub-region fails to satisfy a threshold; and responsive to determining that the significance satisfies the threshold, maintaining mixed authorship of the meta-region. Maintaining mixed authorship of the meta-region can include replacing a fragile authorship token with a durable authorship token. In an example, the method further includes determining a significance of the fourth sub-region based on the third sub-region; determining that the significance of the fourth sub-region based on the third sub-region fails to satisfy a threshold; and wherein maintaining the mixed authorship of the meta-region is further based on the significance of the fourth sub-region based on the third sub-region fails to satisfy the threshold.

Predictability

In some examples, the authorship of an edit is based on the predictability of an artificial suggestion in response to existing content. For instance, given existing content authored by a human (e.g., "it was a . . . "), an artificial author reads that existing content and generates a suggestion (e.g., " . . . dark and stormy night") for the next content that continues the existing content. A question relevant to authorship can be: how predictable was the next content? If the process of reading the existing content and generating the suggestion for next content were repeated one-hundred times, what is the distribution of the results? Continuing the above example, the majority of the suggestions may be "dark and stormy night", but some suggestions may have been "good day", "pleasure to meet you" or "pleasure to burn". The lack of predictability can arise from any of a variety of sources. A common source of unpredictability is the temperature setting of the artificial author. Large language models and other artificial authors often have a temperature setting that injects randomness into the next selected tokens in order to increase diversity and creativity of results.

Authorship can change depending on how much the input to an artificial author dictates a specific result. Where the temperature setting of an artificial author is zero or sufficiently low that the prediction of the next token is otherwise nearly certain (e.g., has a predictability above a threshold), then the author of the edit accepting the suggestion can be determined to be not the author of the suggestion, but the author of the content that influenced the suggestion.

In some examples, it can be beneficial to increase a predictability of the output of an artificial author, so the artificial author does not have authorship of a work. For instance, a human novelist may want to have an artificial intelligence help write a novel but still be considered the author of the resulting novel (e.g., the novelist is a slow typist and wants help from an autocomplete or other suggestion feature from an artificial author). So the human novelist modifies a setting of their editor that lowers a temperature of the artificial copilot. This may have the drawback of reducing the creativity or diversity of the suggestions by the artificial copilot while having the benefit of increasing certainty of the output to sufficient levels that the human novelist retains authorship of the resulting work.

In addition to or instead of changing the temperature, the editor (or artificial copilot) can be modified such that a suggestion only appears if the predictability of the suggestion is above a threshold. In addition or instead, the size of the prediction can be reduced in order to increase predictability. For example, predicting the next token can be relatively accurate, predicting the next two tokens can be less accurate, and predicting subsequent tokens can be less accurate still as uncertainty piles on. The size of the prediction can be reduced to the point where predictability remains sufficiently high to maintain human authorship.

In some examples, the editor may permit the making of suggestions that would change authorship, but provides such suggestions in a distinct way. For instance, a suggestion that would not change authorship can be displayed in light gray while a suggestion that would change authorship can be displayed in light red.

In many of the examples discussed above, predictability was discussed in the context of individual suggestions. However, in some examples, the predictability of all presented suggestions can be considered. For instance, there may be a situation in which there are two equally likely next tokens (e.g., "she flipped a coin and it came up . . . "), but there is near certainty that the next token will be one of those two tokens (e.g., either "heads" or "tails"). The editor may determine to present both of those tokens as suggestions and the user is permitted to pick from among those. In such an example, because the probability of the next token being from among the presented possibilities is above the threshold, either suggestion accepted by the human author is determined to have human authorship.

Further, the authorship of suggestions can depend on the context in which the suggestions are made. For instance, authorship of suggestions in a creative context (e.g., narrative writing or source code comment writing) can be different from authorship of suggestions in a functional context (e.g., source code writing). In an example, determining authorship of an edit can be based on whether the context of the suggestion is creative of functional.

In some examples, the acceptance of a suggestion is determined to be completely predictable (e.g., and therefore the author of the edit that accepts the suggestion is the author that accepts the suggestion rather than the author of the suggestion). For instance, because the author that accepts the suggestion knows that the suggestion will be, they can be deemed to be the author.

While many of the examples above are focused on predictability of prose text, they need not be so limited. For example, a user may activate a feature of an editor that causes all selected lines to be indented a certain amount. Because that feature is entirely predictable (e.g., the change to the text content always be the same), the author performing that change (e.g., an artificial author of the editor) does not have authorship over that change. Rather, the individual that caused that change to happen (e.g., a human) would be considered the author of that change. But, that change may not be significant with respect to the underlying content of the lines, so the authorship of the lines may not change anyway. Other examples of such a predictable change includes changing the case of a region (e.g., to uppercase, lowercase, camelCase, kebab-case, snake_case, Sentence-case, other cases, or combinations thereof). Another example of a more complicated but still predictable change is a request to an AI coding copilot to change a local variable to a global variable. Such a change may include more steps (e.g., deleting the local variable definition, creating the global variable in upper snake case, and replacing all remaining original instances of the local variable with the global variable), but such a change is predictable from the instruction that the author gave to the AI coding copilot, so there would be no authorship change or the author instructing the AI coding copilot would have authorship.

In an example, a creativity score can be calculated for tokens of a work. Portions of the work through a token predictor for predicting a next token of the work. The actual next token in the work can be compared to the probabilities of the next tokens from the token predictor. Then probability assigned to the actual next token can be inversely proportional to the creativity of the actual next token. In other words, if the token predictor assigned the actual next token as having a high probability of being next, then the actual next token is rather uncreative. But if the token predictor assigned the actual next token as having a relatively low probability of being next, then the actual next token is rather creative. While creativity is typically difficult to quantitatively assess, the next token probability generated using token predictors is a concrete number, thus increasing the accuracy and predictability of the creativity score for given tokens.

In an example, the work may be the sentence: "You will rejoice to hear that no disaster has accompanied the commencement of an enterprise which you have regarded with such evil forebodings". The creativity can be calculated by providing a section of the work "You will rejoice to" to a next token predictor and observing what probability is assigned to the actual next token ("hear"). In that example, the prediction was made solely in the forward direction (e.g., asking what is the next token). In other examples, the prediction can be made in the backward direction (e.g., asking what is the previous token). In further examples, the prediction can be bidirectional (e.g., asking what is the masked token, such as "You will rejoice to [MASK] that no disaster"). In an example, the token predictor used is BERT by GOOGLE, though other token predictors can be used.

The resulting creativity score can be used to determine authorship. For example, where a suggestion has a creativity score that satisfies a threshold, then the author of the suggestion can be determined to be the author of the edit that accepts that suggestion. Where the suggestion has a creativity score that does not satisfy the threshold (e.g., the suggestion is highly predictable), then the author of the context for which the suggestion is made can be determined to be the author of the edit that accepts the suggestion even if a different author made the suggestion.

In an example, there is a computer-implemented method. The method can include determining that an artificial intelligence made an edit to content within a content editor. The edit can include one or more changes, insertions, or deletions to the content. The method can further include determining a region associated with the edit has human authorship based on determining that the edit satisfies the threshold of predictability. The method can further include, responsive to determining that the region associated with the has human authorship, ensuring the presence of a human authorship token in association with the region. The human authorship token can have a predetermined form indicating that a human rather than an artificial intelligence is the author of the region of content. Ensuring the presence of the human authorship token can include applying a human authorship token in association the region. In addition or instead, ensuring the presence can include retaining an existing human authorship token in association with the region. In addition or instead, ensuring the presence can include removing an artificial authorship token from association with the region. Determining that the edit satisfies the threshold of predictability can include determining that a temperature setting of the artificial intelligence is below a threshold. The method can further include generating the edit using the artificial intelligence, wherein the generating is configured to generate an edit having higher than the threshold amount of predictability. The generating can be so configured by generating potential edits until a potential edit has higher than the threshold amount of predictability. The generating of the potential edits can be such that the length of the potential edits becomes smaller as more potential edits are generated. The generating can be so configured by reducing a temperature parameter of the artificial intelligence. The method can further include presenting, by the content editor, the edit as a suggestion; receiving acceptance of the suggestion; and applying the suggestion to the content. The determining that the artificial intelligence made an edit to content can be responsive to applying the suggestion to the content.

The edit can be a first edit, and the suggestion can include the first edit and a second edit. Receiving acceptance of the suggestion can include receiving acceptance of only one of the first edit and the second edit. Applying the suggestion to the content includes applying the accepted edit. The predictability of the first and second edits, separately, can be less than the threshold, but suggesting both the first edit and the second edit can be responsive to the combined predictability of the first edit and the second edit being greater than the threshold.

Determining that the edit satisfies the threshold of predictability can include determining the predictability of the edit. Determining the predictability of the edit can include determining a likelihood that that a process that causes the edit given a content will produce a same edit given the same context. The edit can be changing case of the region, and edit can be entirely predictable. The edit can be changing a local variable to be a global variable, and the edit can be entirely predictable. The edit can result from a human user instructing the artificial intelligence to change the local variable to be a global variable. The edit can be changing data from a first format to a second format, and the edit can be entirely predictable.

In another example, there is a computer-implemented method comprising: determining that an artificial intelligence made an edit to content within a content editor. The edit can include one or more changes, insertions, or deletions to the content. The method can further include determining a region associated with the edit has human authorship based on determining that the edit fails to satisfy a threshold of creativity. The method can further include, responsive to determining that the region associated with the edit has human authorship, ensuring the presence of a human authorship token in association with the region, the human authorship token having a predetermined form indicating that a human rather than an artificial intelligence is the author of the region of content. Determining that the edit fails to satisfy the threshold of creativity includes calculating a creativity of the edit. The creativity of the edit is inversely proportional to the predictability of the edit. Calculating the creativity of the edit can include masking a token in the region to form a masked region, providing the masked region to a token predictor to predict the masked token, and using an output of the token predictor to determine the creativity.

Anthropogenic Versus Technogenic Content

It may be beneficial to understand whether content is authored by a human (e.g., "anthropogenic") versus authored by an artificial intelligence (e.g., "technogenic"). For instance, when browsing social media or blog posts, it may be beneficial to understand the anthropogenic or technogenic origin of the content. An example method for assisting in such a determination can be performed by an anthropology engine running on a device. An example method is shown and described in relation to FIG. 19.

Figure 19:
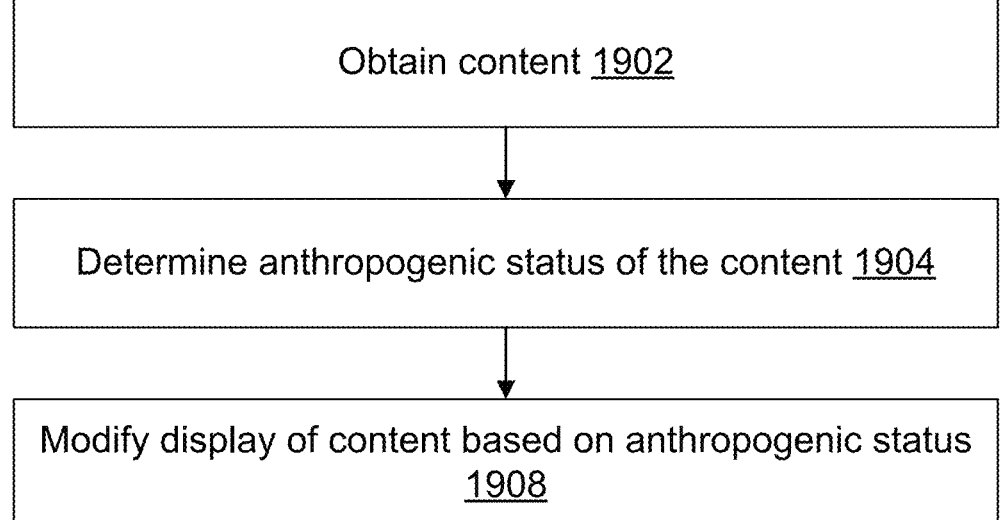
FIG. 19 illustrates an example method for determining the anthropogenic status of content.

FIG. 19 illustrates example method 1900. In an example, the method is performed by the anthropology engine. In some examples, the anthropology engine is built into a web browser, built into an application displaying content (e.g., a text editor, a web browser or a special-purpose application), an operating system providing the application displaying the content, a plugin to the application (e.g., a browser extension). In some examples, the method 1900 is performed by a web browser, browser extension, artificial assistant, or other program. The method can begin with operation 1902.

Operation 1902 includes obtaining content blocks. For example, content may be the content of a web page and the content blocks may be portions of that content. The content (e.g., a web page) may be received into a browser or other application from an Internet resource (e.g., a server or other host). Obtaining the content can include obtaining a monolithic block of content, obtaining portions of content. That monolithic block of content can be split into smaller content blocks. Where a monolithic block is broken into smaller blocks of content, those smaller blocks of content can be sub-regions of content (e.g., pictures, videos, frames, words, sentences, paragraphs, pages, or other regions) or logical blocks of content based on how the content is structured (e.g., e.g., by parsing the content using parsing software, such as BEAUTIFUL SOUP by Leonard Richardson). In some examples, the content is a social media page and the content blocks are comments, posts, videos, other content blocks, or combinations thereof. In some examples, the browser that obtains the content is not a general-purpose web browser (e.g., EDGE by MICROSOFT, SAFARI by APPLE, CHROME by GOOGLE, or FIREFOX by the MOZILLA FOUNDATION) but rather a special-purpose application for a specific Internet resource (e.g., the FACE-BOOK app for accessing FACEBOOK by META).

Operation 1904 includes determining an anthropogenic status of the content block. This can include determining whether the content block has an authorship token. If the content block has an authorship token, then the authorship token can be analyzed to determine whether the authorship of the content is anthropogenic (e.g., based on the authorship token indicating human authorship), technogenic (e.g., based on the authorship token indicating artificial authorship), or has another status (e.g., mixed or unknown origin). In some examples, this can include determining a credibility, trustworthiness, or authenticity of the authorship token. For instance, this can include determining whether a hash of associated content matches a hash associated with the authorship token, determining a format of the authorship token, determining a credibility of a provider of the authorship token, using other techniques, or combinations thereof.

If the content block lacks an authorship token, the anthropogenic status can be determined through other means. In an example, the anthropogenic status is determined by first determining authorship using a process based on the method described in relation to FIG. 15. Then the authorship can be used to determine an anthropogenic status of the content using techniques described above. In another example, the anthropology engine determines when the content was first authored (e.g., using a date associated with the content or by searching elsewhere). If the content was first authored prior to a date on which sufficiently advanced artificial content generation for the kind of content of the content block became available, then the content can be considered to be anthropogenic. Further, the content block can be analyzed for indications of being artificially authored. If the content block has indications of artificial authorship, then it can be considered to be artificially authored.

Operation 1906 includes modifying the display of the content based on the anthropogenic status of the content. In an example, this can include displaying anthropogenic content in a first manner, displaying technogenic content in a second manner, displaying mixed content in a third manner, and displaying content having unknown origin in a fourth manner. The manners of displaying the content can be such that content having different anthropogenic/technogenic statuses can be distinguished. In some examples, this can include making content more visible (highlighting content), making content less visible (decreasing contrast of the content, saturation, greying out the content, hiding the content, or not rendering the content), adding an identifier to the content that wasn't already present (e.g., a flag), other techniques, or combinations thereof. In an example, technogenic content is suppressed. In some examples (e.g., where the anthropology engine is part of an operating system), the modifying of the presentation can include providing an overlay over the browser (e.g., over portions of the browser corresponding to content having particular technogenic statuses) or modifying how the operating system causes the browser (e.g., portions thereof) to be displayed using APIs of the operating system.

Figure 20:
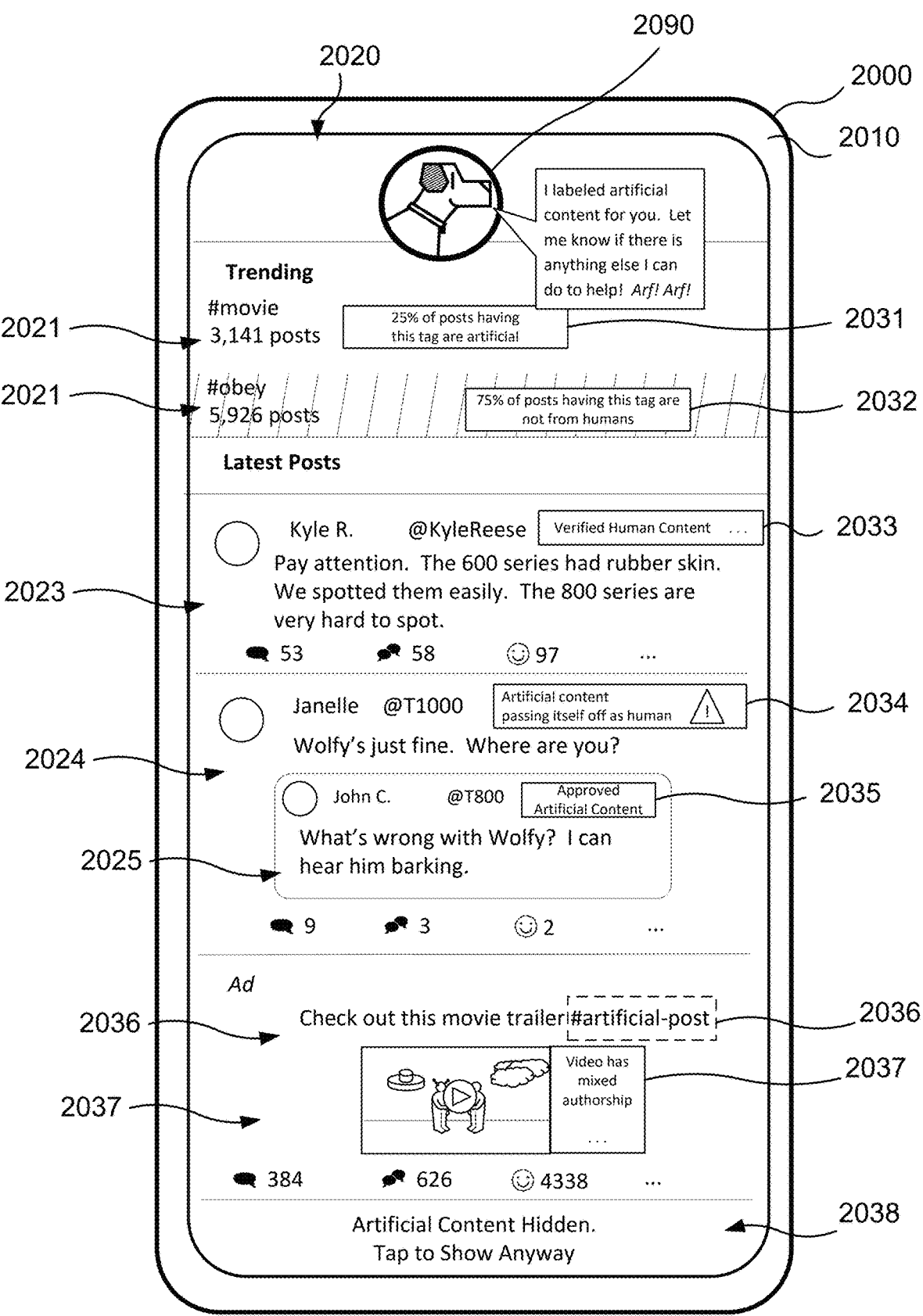
FIG. 20 illustrates an example user device having a user interface showing content.

Example content modified based on anthropogenic status is shown in relation to FIG. 20.

FIG. 20 illustrates an example user device 2000 having a user interface 2010 showing content 2020. The content 2020 includes content blocks.

A first content block 2021 shows a trending topic on a social media platform. The content block 2021 shows that there are a certain number of posts. The content block has associated with it an anthropogenic tag 2031 indicating that a certain percentage of the posts associated with that tag are artificial. This may be useful because the anthropogenic status of the tag itself is unknown or not useful (e.g., because it is a standard tag applied to many different posts). However, whether the overall use of the tag is coming from humans (e.g., in response to organic usage) or from artificial agents (e.g., in a campaign of inauthentic behavior by bots) may be relevant and the tag 2031 can be applied accordingly.

A second content block 2022 shows another trending topic on the social media platform. The content block 2022 also shows that there are a certain number of posts using that tag. However, here, an anthropogenic tag 2032 indicates that a substantial percentage of the posts using that tag are not from humans. As a result, the entire section of the content 2020 relating to that content block 2022 is deemphasized (e.g., by adding shading)

A third content block 2023 is a post from a user. The anthropogenic tag 2033 indicates that the content is verified human content. The tag 2033 includes a user interface element that, when actuated, causes display of more information regarding the authorship.

A fourth content block 2024 is a post from another user. The anthropogenic tag 2034 indicates that the content is artificial content and that the user is attempting to pass off artificial content as human content. In an example, this is determined based on first determining that the content is artificial content (e.g., though lacking an explicit disclaimer that the content is artificial) and then examining the user to determine if there is a disclaimer that the content posted by the user is artificial.

A fifth content block 2025 is a post from another user that the fourth content block 2024 is responding to. The fifth content block 2025 includes a fifth anthropogenic tag 2035 indicating that the fifth content block 2025 is from an artificial author, but that the artificial content is approved. For example, a user of the user device 2000 may have an allow-list of artificial content or artificial authors (e.g., that are low-risk, trustworthy, or otherwise okay) and the labeling with tags can be based on such an allow-list.

A sixth content block 2026 is an ad. The content block 2026 includes its own sixth anthropogenic tag 2036. As a result, the anthropogenic engine detects this tag in the content (e.g., by parsing the content for such a tag) and resists applying its own tag because it would be redundant. In other examples, the anthropogenic engine may apply its own (e.g., in addition to or replacing the existing one) for consistency or other reasons.

A seventh content block 2027 is a video embedded in association with the sixth content block 2026. A seventh anthropogenic tag 2037 is applied in association with the seventh content block 2037 indicating that the video has mixed artificial and human authorship. The tag 2037 includes a user interface element that, upon selection, can display an indication of which parts of the video have which kinds of authorship (see, e.g., FIG. 9 and the associated description).

An eighth anthropogenic tag 2038 indicates that an eighth content block is hidden because it is artificial. The tag 2038 indicates that, upon actuation, the suppressed content can be displayed.

As illustrated, there is a user interface element 2090 for an artificial assistant of an operating system of the mobile device 2000. Here, the artificial assistant facilitated the labeling of the content 2020, which would have otherwise generally not had labels.

While these examples were focused primarily on content, in some examples the anthropogenic status of a user of the platform can be determined. For example, there can be a tag that indicates an amount of content that the user posts that has human or artificial origins. There may be users that post only human generated content, only artificially generated content, or a mixture of content. This can be analyzed and used to label the user.

Collaboration Profile and Visualization

Authorship information can be complied into a report, profile, or visualization describing how an author collaborates with other authors (e.g., "how you work with AI" or "how you work with your team"). The report can be based on the authorship tokens. In an example, the report includes a graph that shows the relative amount or ratio of authorship of the content over time (e.g., human versus artificial). In some examples, authorship styles can be determined based on this. For instance, a person may tend to take in a lot of AI content and then edit it. Another may supplement their own content with AI suggestions. Still other may write without significant AI involvement and then bring in the AI at the end as an editor.

Figure 21:
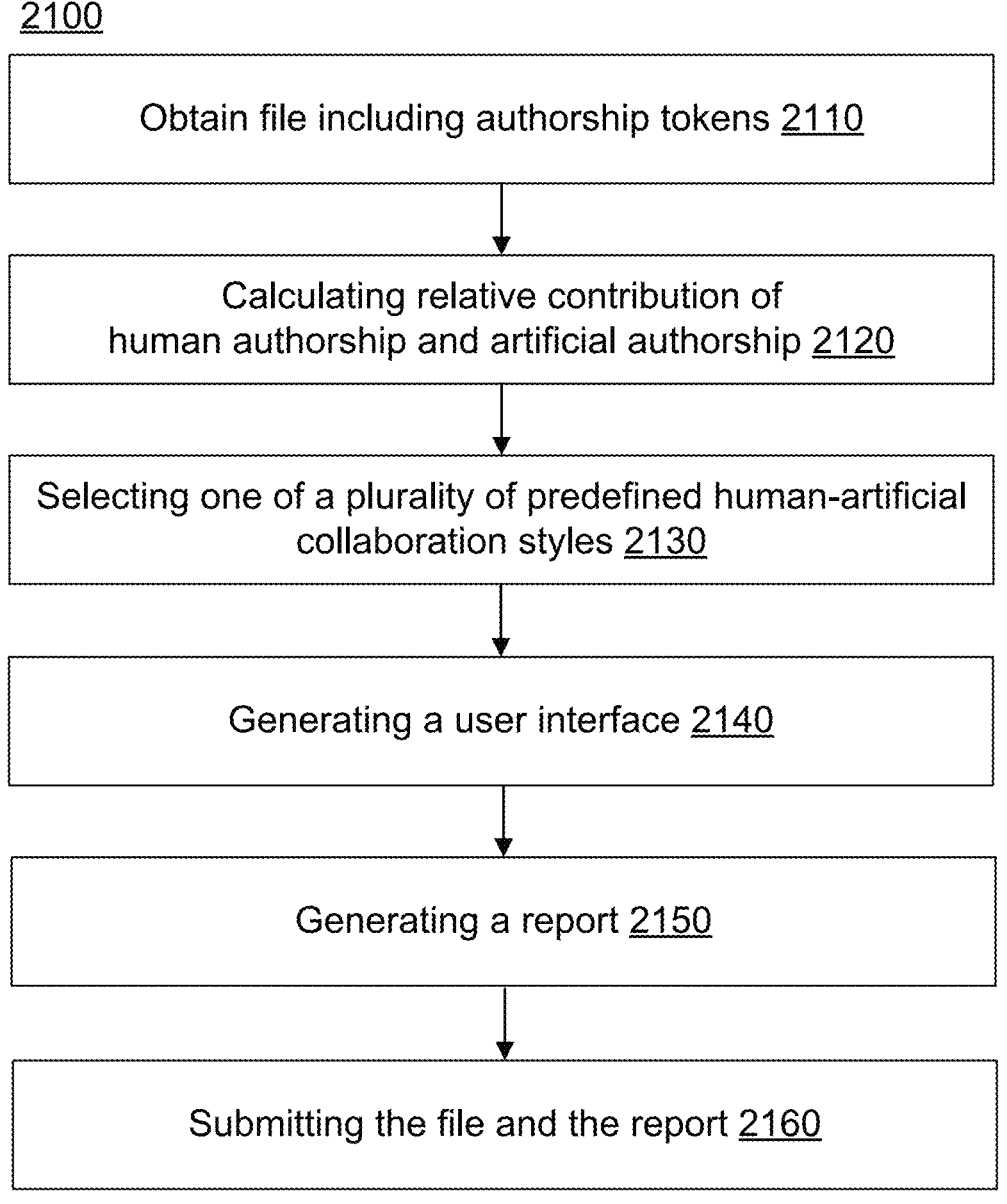
FIG. 21 illustrates an example method involving a collaboration profile and visualization.

FIG. 21 illustrates an example method 2100 involving a collaboration profile and visualization. As described herein, given how intertwined human and artificial authorship of content can be, it can be difficult for systems to provide a readily comprehensible way for a user to understand the relative contribution of human and artificial authorship. While, as described elsewhere herein, authorship tokens can provide important insights into authorship of content, it may be relatively difficult for system to provide an intuitive, overall sense of authorship and collaboration styles to a user. This method 2100 is relevant to improvements it the ability of a content editor or viewer to interact with a user with respect to provenance of content over time. The method 2100 can begin with operation 2110.

Operation 2110 includes obtaining a file including authorship tokens. This can include obtaining the file with the content editor, such as a local or web-based content editor. In some examples, the file is a prose text document stored in a cloud. In another example, the file is a source code file. The authorship tokens can include a first set of authorship tokens describing associated content of the file as having human authorship and a second set of authorship tokens describing associated content of the file as having artificial authorship.

The content editor can be a different content editor from the one that added the authorship tokens. In other examples, it is the same content editor. For instance, the method can include generating, with the content editor, the first set of authorship tokens describing associated content of the file as having human authorship responsive to receiving input from a human; and generating, with the content editor, the second set of authorship tokens describing associated content of the file as having artificial authorship responsive to receiving content from an artificial intelligence.

In some examples, the obtaining can include obtaining an indication of a relative change in authorship of the file over time. For instance, the file (or another file or data source associated with the file) can store an authorship history of the file. Time may refer to actual time spent editing the file. In addition or instead, the x-axis can be a total number of characters (or another relevant delineation, such as words, sentences, lines, pixels, or frames) authored.

Operation 2120 includes calculating a relative contribution of human authorship and artificial authorship. This can include calculating, with the content editor, statistics regarding a relative contribution of human authorship and artificial authorship using the first set of authorship tokens and the second set of authorship tokens.

The calculating can include calculating statistics. The statistics can include at least one statistic selected from the group consisting of: a percentage of words in the file that have human authorship, a percentage of words in the file that have artificial authorship, a percentage of characters in the file that have human authorship, a percentage of sentences in the file that have human authorship, a percentage of sentences in the file that have human authorship, a percentage of suggestions by an artificial author that were accepted by the human author, and a percentage of file that has human arrangement.

Operation 2130 includes selecting one of a plurality of predefined human-artificial collaboration styles. This can include selecting, with the content editor, one of a plurality of predefined human-artificial collaboration styles based on the statistics. In some examples, the predefined human-artificial collaboration styles can include a characterization of how a human user interacts with one or more artificial intelligences. In a first example style, the user may prefer to provide an initial prompt to generate a large amount of artificially authored content and then work over time to edit that content. A chart of such an interaction style may indicate a large amount of human authorship, then a large decrease in human authorship (or a large increase in artificial authorship), and then a gradual increase in human authorship as the human edits the artificial text. In a second example style, the human may prefer to substantially draft the content themselves and involve artificial author as an editor or proofer. A chart of such an interaction style may indicate a relatively consistently high level of human authorship with relatively minor decreases representing additions or changes by an artificial author.

In addition or instead, the predefined human-artificial collaboration styles may include characterizations of the artificial author's role in the content creation process. For instance, in the first example style above, the artificial author may be classified as having a role as a "first drafter". In the second example style above, the artificial author may be classified as having a role as an "editor" or "coach".

In some examples, a user may prefer to follow a particular interaction style. A user may be able to be identified based on how they interact with an artificial intelligence. For instance, an authorship engine may identify an interaction style of a current user, compare that interaction style with a stored profile of different users, and select a particular user as the current user based on the interaction style matching a stored profile.

Operation 2140 includes generating a user interface. In an example, the user interface includes at least one element describing at least one statistic of the statistics; at least one chart representation of the at least some aspect of the authorship; an indication of the selected predefined human-artificial collaboration style; and a narrative description of the selected predefined human-artificial collaboration style.

At least one chart representation can show the relative change in authorship of the file over time. For instance, such a chart (e.g., a line graph) can show the relative change in the amount of content that has human authorship versus artificial authorship. The selecting of the predefined human-artificial collaboration style can be based at least in part on the relative change in the authorship of the file over time. For instance, the selecting can include selecting a first human-artificial collaboration style responsive to transition from a relatively higher amount of artificial authorship to a relatively lower amount of artificial authorship over time. The selecting includes selecting a second human-artificial collaboration style responsive to transition from a relatively lower amount of artificial authorship to a relatively higher amount of artificial authorship over time. In some examples, the chart includes an indication of a threshold of an impermissible amount of artificial authorship (or a required amount of human authorship).

Operation 2150 includes generating a report. For instance, generating the report can include generating a report that includes two or more of: a report element describing at least one statistic of the statistics; a report chart representation of the at least some aspect of the authorship; an indication of the selected predefined human-artificial collaboration style; a narrative description of the selected predefined human-artificial collaboration style; and applying a digital signature to the report, the digital signature being associated with the content editor.

Operation 2160 includes submitting the file and the report, such as to a third party. The third party can verify the digital signature of the signed report.

Figure 22:
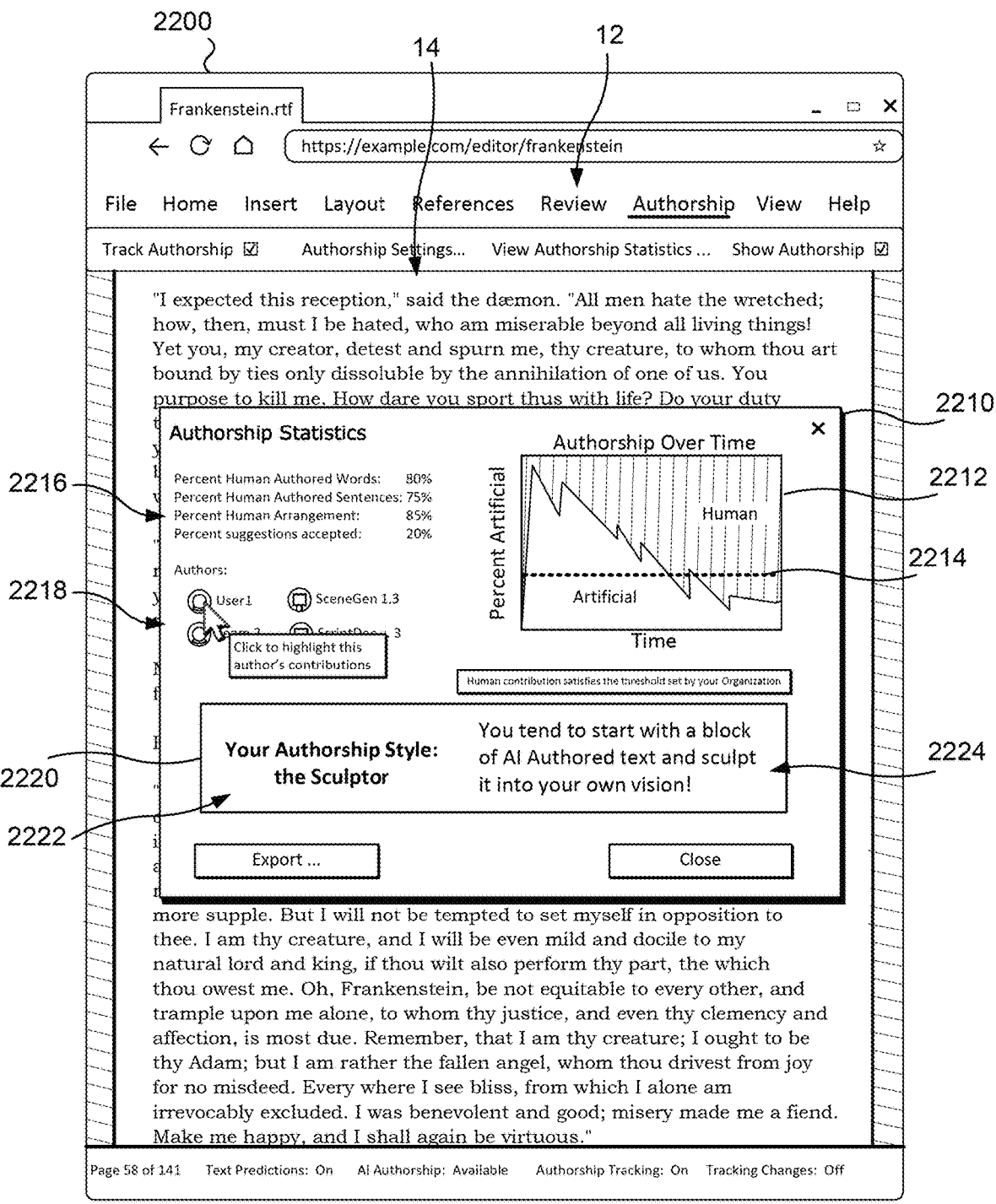
FIG. 22 illustrates an example web browser running on a user device and rendering a web page that provides a content editor for editing content stored in a file.

FIG. 22 illustrates an example web browser 2200 (e.g., running on a user device 100) rendering a web page that provides a content editor 12 for editing content 14 stored in a file. Here, the file is stored in the cloud and has prose text content. The web browser is showing a user interface window 2210 showing authorship statistics. In an example, the user interface window 2210 can be a user interface generated in operation 2140, above. As illustrated, the user interface 2210 includes a chart representation 2212 of authorship information with an illustrated threshold 2214, authorship statistics 2216, a list of authors 2218, and an authorship style element 2220 including an identification 2222 of a selected predefined human-artificial collaboration style and a narrative description 2224 of that collaboration style.

Figure 23:
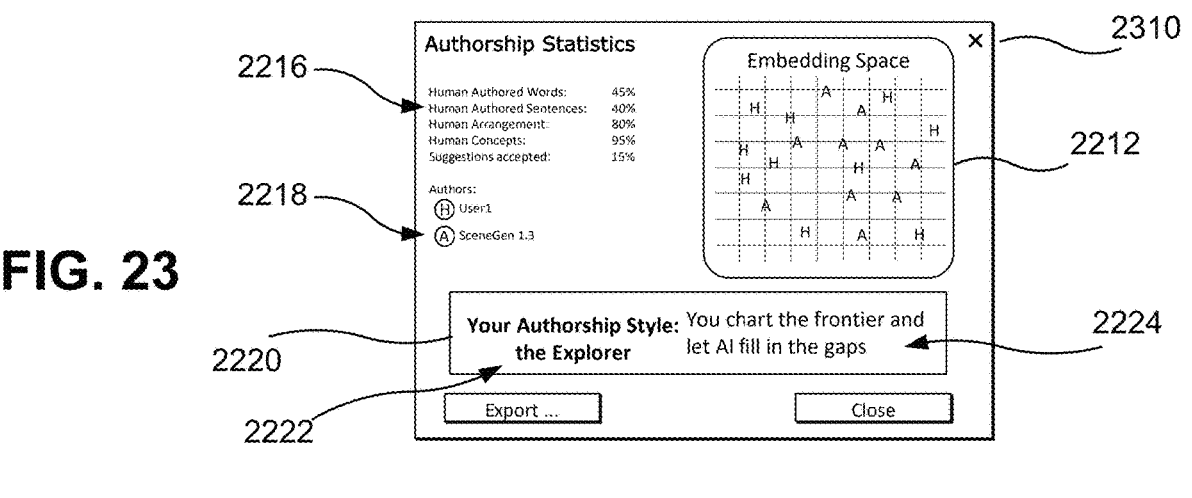
FIG. 23 illustrates a first example user interface including a chart representation of authorship information.

FIG. 23 illustrates an alternative user interface 2310. Like the user interface 2210, the user interface 2310 includes a chart representation 2212 of authorship information, authorship statistics 2216, a list of authors 2218, and an authorship style element 2220 including an identification 2222 of a selected predefined human-artificial collaboration style and a narrative description 2224 of that collaboration style. But here the chart representation 2212 is in the form of a representation of human authored and artificially authored embeddings in embedding space. This can be used to visualize a map of concepts (or words or another embeddable component) authored by the different authors. In an example, a user can click on the embeddings to see what they represent.

Figure 24:
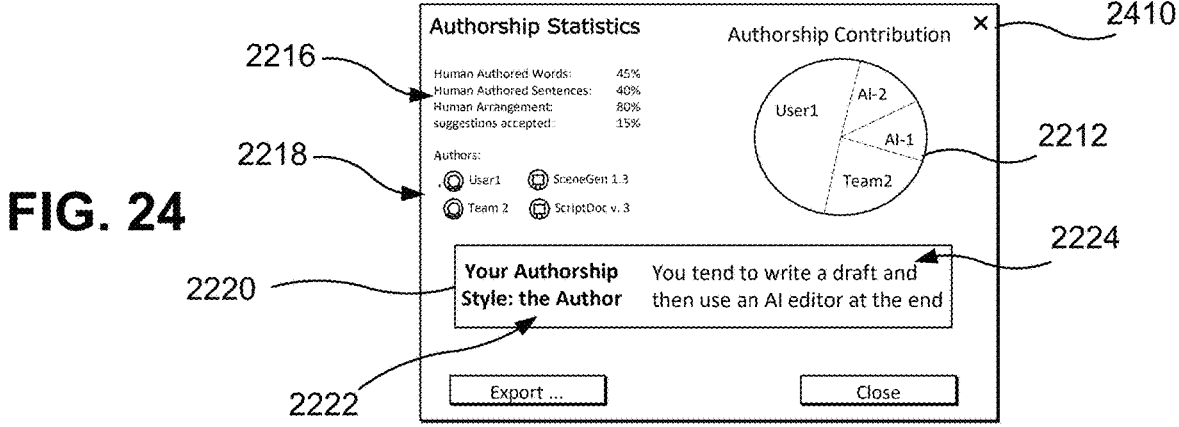
FIG. 24 illustrates a second example user interface including a chart representation of authorship information.

FIG. 24 illustrates an alternative user interface 2410. Like the user interface 2210, the user interface 2410 includes a chart representation 2212 of authorship information, authorship statistics 2216, a list of authors 2218, and an authorship style element 2220 including an identification 2222 of a selected predefined human-artificial collaboration style and a narrative description 2224 of that collaboration style. But here the chart representation 2212 is a pie-chart showing the relative contribution of the different authors to the content.

Figure 25:
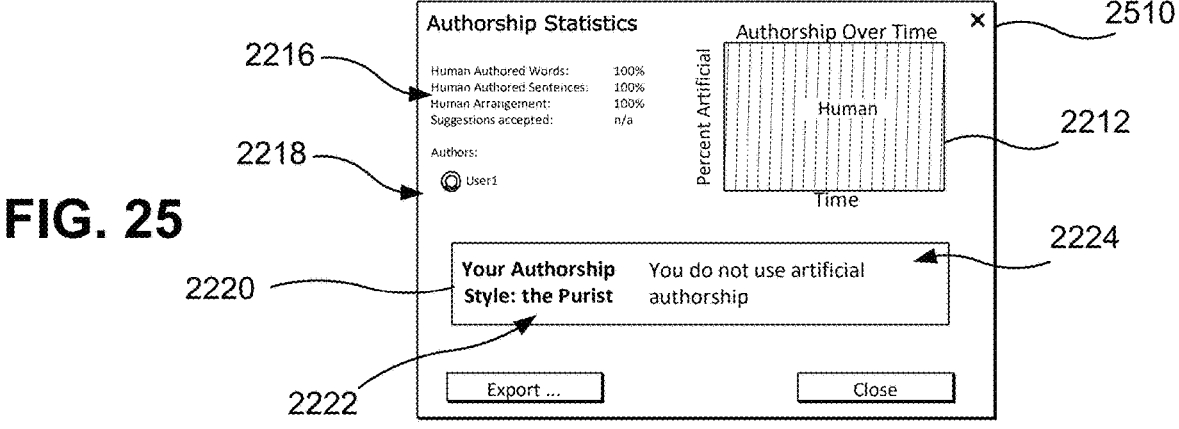
FIG. 25 illustrates a third example user interface including a chart representation of authorship information.

FIG. 25 illustrates an alternative user interface 2510. Like the user interface 2210, the user interface 2510 includes a chart representation 2212 of authorship information, authorship statistics 2216, a list of authors 2218, and an authorship style element 2220 including an identification 2222 of a selected predefined human-artificial collaboration style and a narrative description 2224 of that collaboration style. But here the authorship is entirely human.

Visualizing Relative Change in Authorship of Regions

Figure 26:
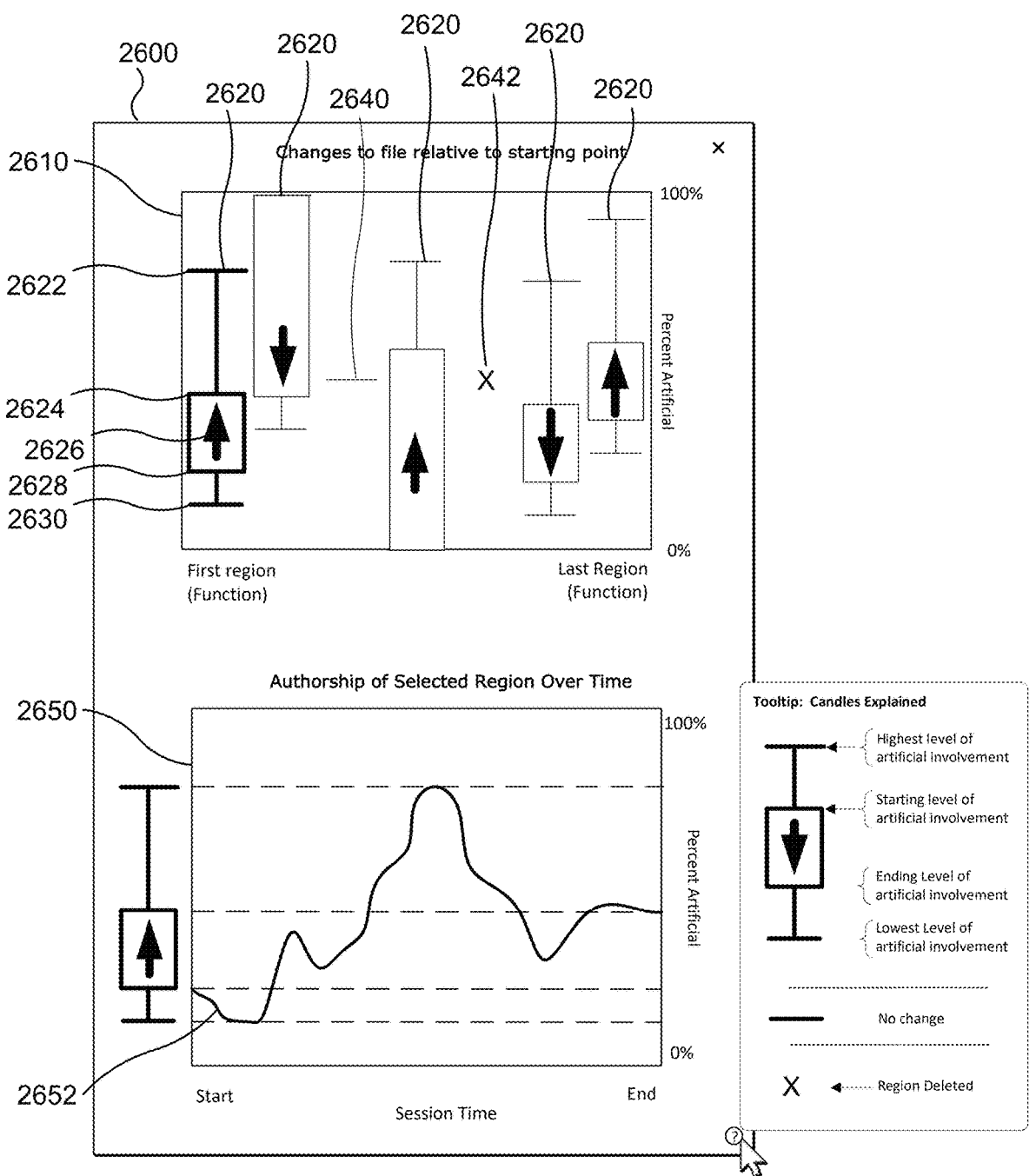
FIG. 26 illustrates an example user interface for visualizing a relative change in authorship of regions of a file over the course of an editing session.

FIG. 26 illustrates an example user interface 2600 for visualizing a relative change in authorship of regions of a file over the course of an editing session. The editing session can be any relevant length of time of interest. In an example, a user checks out a file containing source code, modifies the file with the assistance of an artificial author, and then commits the changes to a source code repository. The span from check out to check in can be considered a session. In another example, the session can be from when a user opens a file to when a user closes a file. In another example, the user interface 2600 can be used to visualize a relative change in regions of a file between different versions of the file, such as between a previous and current version of a file (e.g., a locally stored file, a remotely stored file, or stored via a version control system).

The user interface 2600 includes a candlestick chart 2610 that uses candlestick elements 2620 to demonstrate a relative change in authorship of regions of the file. The Y-axis of the chart indicates a percentage of artificial authorship (though in other implementations the Y-axis can represent a percentage of human authorship or any other relevant statistic). The X-axis represents an ordering of regions in the relevant file from first to last. As illustrated, the relevant region is function and the chart 2610 conveys information about how each of the seven functions in the file changed, over the course of the session (including one being unchanged and another being deleted). In other examples the region could be any other relevant region for the content at issue, such as line, class, logical block, sentence, paragraph, chapter, file, block, layer, or another region.

As illustrated, each candlestick 2620 includes different elements including: a highest element 2622, a starting element 2624, a direction element 2626, an ending element 2628, a lowest element 2630. The highest element 2622 indicates the highest level of artificial authorship that was achieved during editing (e.g., what was the highest percentage of the content of the region that had artificial authorship at any point during the editing session). The starting element 2624 indicates the starting level of artificial authorship (e.g., what percentage of the content of the region had artificial authorship when the editing session in question began). The direction element 2626 is some portion of the candlestick 2620 that indicates whether the amount of artificial authorship increased or decreased during the editing session. As illustrated here, the indication is an arrow showing the direction of change from start to end, but in other implementations color, shading, or other distinguishing techniques can be used. The ending element 2628 indicates the amount of artificial authorship that the region had at the end of the editing session. The lowest element 2630 indicates the lowest level of artificial authorship that was reached during the editing session.

The chart 2610 further includes an unchanged element 2640 and a deleted element 2642. The unchanged element 2640 indicates that the associated region did not change. As illustrated, that unchanged element 2640 is a line placed at a location along the Y-axis indicating the amount of artificial authorship of that region. Other indications can be used. The deleted element 2642 indicates that the associated region in the file was deleted.

The user interface 2600 also includes a line chart 2650 showing a change in authorship of the selected region over time during the editing session. The Y-axis of this chart also corresponds to the percentage of authorship (or another relevant statistic), but here the X-axis corresponds to time during the session. By placing the region's candlestick next to the chart 2650 it becomes clear how the starting, lowest, highest, and ending values that the line 2652 reaches over time corresponds to associated portions of the candlestick.

In an example, there is a method that includes determining a relative change in authorship of regions of a file over the course of an editing session and providing a diagram illustrating the relative change in the authorship of regions of the file using a plurality of candlesticks. Each candlestick of the plurality of candlesticks corresponds to a different one of the regions of the file. At least one of the plurality of candlesticks can include a highest element indicating a highest level of artificial authorship of a corresponding region during the editing session; a starting element indicating a starting level of artificial authorship of the corresponding region; a direction element indicating whether an amount of artificial authorship of the corresponding region increased or decreased during the editing session; an ending element indicating an amount of artificial authorship that the corresponding region had at the end of the editing session; and a lowest element indicating a lowest level of artificial authorship that the corresponding region had during the editing session. The diagram can further include an unchanged element indicating that authorship of a corresponding region did not change during the editing session. The diagram can further include a deleted element indicating that the associated region was deleted during the editing session. The relative change in authorship can describe a relative change in the percentage of artificially authored content in a corresponding region. The relative change in authorship can describe a relative change in the percentage of human authored content in a corresponding region. The editing session can be a span of time between checking out the file and committing the file. The editing session can be a span of time between opening the file and closing the file. The editing session can be a span of time between creation of a first version of the file and a second version of the file. In an example, the method further includes responsive to detecting selection of one of the plurality of candlesticks, providing a chart showing a change in authorship of a region corresponding to the selected candlestick over the editing session. The x-axis of the chart can correspond to time during the editing session.

Modifying Artificial Involvement Based on Authorship History

It may be beneficial to limit an amount of involvement by an artificial author. For instance, there may be some circumstances where a person wants a relatively limited amount of involvement by an artificial author and other circumstances where the person wants a relatively high amount of involvement. For instance, a law school may want to limit an amount of involvement by an artificial author when a student is using a content editor to write an essay for homework (e.g., to demonstrate what the student was able to learn). But when that same student works as a law clerk, their firm may want relatively high artificial involvement for a memo that the clerk is writing (e.g., to improve consistency with other firm documents or to re-use standard language for memos). The desired level of involvement can be configurable by a setting in a content editor, authorship engine, or artificial author system.

FIG. 27 illustrates an example method 2700 for modifying artificial involvement based on a contribution history. The method 2700 can begin with operation 2710.

Operation 2710 includes generating a first edit to content based on a level of involvement setting. In an example, the operation 2710 includes generating the first edit to the content with an artificial author based on a level of involvement setting of the artificial author. In an example, generating the first edit includes inserting content written by the artificial author, modifying the content with the artificial author, or providing a suggestion to the user from the artificial author. Here, (as with some other uses elsewhere herein) "first" is merely a way to distinguish from future edits herein rather than implying that the edit is actually chronologically first.

Operation 2720 includes tracking an amount of technogenic contribution to the content by the artificial author. In an example, the tracking is based on artificial authorship tokens in the content. In addition or instead, the tracking is based on similar factors to those discussed elsewhere herein with respect to authorship tokens. Tracking the amount of technogenic contribution to the content by the artificial author can include includes tracking all edits to the content by the artificial author, all substantial edits to the content by the artificial author, all suggestions made by the artificial author that are accepted by the user, other edits, or combinations thereof.

In some examples, anthropogenic contributions is also tracked, such as by using any technique described herein for tracking manual edits or other human-provided content. For instance, anthropogenic contributions can be tracked using human authorship tokens.

Operation 2730 includes determining a contribution metric. The contribution metric can be based on the amount of technogenic contribution. In an example, the contribution metric includes a percentage of the total amount of content that has human or artificial authorship.

Operation 2740 includes comparing the contribution metric to a collaboration setting. In an example, the collaboration setting specifies a desired amount of artificial authorship or an amount of human authorship.

Operation 2750 includes modifying the level of involvement setting based on the comparison.

Operation 2760 includes generating a second edit to the content based on the modified level of involvement. The second edit can be more or less substantial than the first edit, such as based on the second edit having been generated based on a modified level of involvement setting. Whether the second edit is more or less substantial (e.g., its substantiality) can be based on various factors, such as an amount of content added, removed, or modified as a result of the second edit. In addition or instead, the substantiality of the second edit can be based on a change in the relative percentage of the total content that has artificial authorship. In some examples, the substantiality changes or how the substantiality is calculated changes based on the amount of existing content. For instance, changing two words in content may be insubstantial when the content contains thousands of words, but may be substantial when the content contains only four words. In some examples, the method 2700 can further include applying an artificial authorship token to a region associated with the second edit.

In an example, generating the second edit includes generating a first set of candidate edits. Then any candidate edits from the plurality of candidate edits are removed that fail to satisfy the level of involvement setting. This results in forming a second set of one or more candidate edits, The second edit can be part of the second set.

In an example, the method 2700 further includes receiving a third edit to the content from a human author. Then the contribution metric is updated based on the third contribution.

Artificial Authors as Tool Users

Many aspects herein have focused on scenarios in which the artificial author creates content itself based on its own model (e.g., via a chat functionality or a prompt-response framework). However, artificial authors may use tools to create those answers or obtain data. Such tools can include the use of application programming interfaces or other ways of interacting with other applications or sites to obtain an answer. Further, such tools could include searching local documents (e.g., documents of a human user interacting with the artificial author or documents of an associated organization) and providing answers based thereon (e.g., using so-called Retrieval Augmented Generation or another such technique). As a result, even if the artificial author provides a response having particular content, that content may not have been actually authored by the artificial author. Instead, the content in the artificial author's response may have been authored by the author of a document from which the artificial author is quoting. As an example, a human may ask a multimodal model "what is the first line of Moby-Dick?". The multimodal model may respond "Call me Ishmael" and the author includes that sentence in a book report, but that may not mean that the line has authorship attributable to the model (or even the human that provided the prompt). Rather, the authorship can be attributed to Herman Melville, the author of Moby-Dick that originally wrote that line.

The authorship engine herein can take such sourcing into account. For instance, the artificial authorship engine can analyze the response of the artificial author and determine whether the content was authored by the artificial author or it has been quoted from another source (e.g., based on citations or quotations in the content). The authorship engine can then determine the authorship of that source (e.g., based on authorship tokens of that source, such as by determining authorship tokens of the portion of the source that was quoted or referenced in the artificial author's content) and apply that authorship to the relevant portion of the content provided by the artificial author.

In some instances, a source token can be applied to content to describe a source of the content, even if it were authored by someone else. Thus, a portion of content can have an authorship token, a source token, and even a selection and arrangement token. A source token can be a citation and can include or be based on any traditional or new citation format (e.g., APA, Bluebook, Chicago, MLA, or others). In an example, a human prompter can ask an artificial agent to summarize an article. The author of the summary may be the artificial agent, but because the summary is drawn from the article, the source of the summary is the article.

In an example, there is a computer-implemented method that includes determining that an artificial user of a content editor made an edit to content within the content editor. The edit can include one or more changes, insertions, or deletions to the content. The method can further include determining that the edit satisfies a threshold of significance. The method can further include determining that the artificial user originated at least a portion of the edit from an external source. The method can further include providing a token in association with the region. The token can identify the external source or an author thereof. The token can have a predetermined form indicating that associated region has data from an external source rather than from a user of the content editor. The token can further have a predetermined format indicating that an author of the external source is a human rather than an artificial intelligence or is an artificial intelligence rather than a human. The token can be a source token. The method can further include applying an authorship token indicating that the region associated with the edit has artificial authorship. The method can further include applying a selection token, an arrangement token, or a selection and arrangement token to the region indicating artificial or human authorship.

Not only can tool use by an artificial author influence authorship tokens, authorship tokens can apply to tool use by artificial agents as well. As artificial agents become more and more autonomous, it can be beneficial to provide an indication of the author of the agent's actions. For instance, is the artificial AI agent acting alone or under the direction of another (e.g., a human or even another AI agent). Authorship tokens can be applied in this context to describe the authorship of the agenda that the AI agent is following. For instance, an author can write a plan, agenda, to-do list, script, or other set of instructions (e.g., in natural language, a programming language, spoken word, or other formats) for an artificial agent to follow. Authorship tokens can be applied to the instructions and can then be applied to the action. Applying the authorship token to the action can include, for example, including the authorship token (or something based thereon) as part of an API call associated with the action. Thus, the service exposing the API can determine that although an artificial agent is accessing the API, it is doing so on behalf of a specific author.

Selection and Arrangement of Suggestions

In some examples, information about how a first author (e.g., a human) interacts with suggestions by a second author (e.g., an artificial author) is tracked to support assigning the first author credit for selecting and arranging such suggestions. In an example, suggestions made to the first author by the second author are retained (e.g., in a log file) even if those suggestions were not accepted. Traditionally, such unused suggestions would be discarded (e.g., deleted or not even stored outside of temporary memory). In another example, statistical information about the suggestions is tracked. Information can include how many word completions were suggested, how many word completion suggestions were accepted, how many next words were suggested, how many next word suggestions were accepted, how many characters were those suggestions (e.g., including accepted versus made), how many were not accepted, what percentage of suggestions were accepted, other statistics, or combinations thereof. Such statistical information or logs can be used to support a notion that even though the first author accepted suggestions, the first author retained control (or at least credit for selection and arrangement) by actually thoughtfully selecting an arranging such suggestions rather than just blindly accepting what the second author suggested.

In some examples, the suggestions that were made but not accepted can be re-added from the log to the file to undo the selection and arrangement of the text by the author (see above section "Removing the Selection and Arrangement of Content"). In some examples, undoing the selection and arrangement can include generating false suggestions based on the statistics in order to undo the selection and arrangement of the text by the author. For instance, if the statistics state that twenty suggestions were rejected, then twenty suggestions can be generated and readded to the text. Where information is stored regarding the nature of the suggestions (e.g., the number of words or characters that made up the suggestion), such information can be used to generate the false suggestions.

Similar information can be used with respect to prompts and responses from a chatbot. For instance, information about how much detail is provided in a prompt, how much of a chatbot output is kept, and how much of the resulting chatbot output is unchanged can be used to support a notion that the content is the product of selection and arrangement by the first author.

FIG. 28 illustrates an example method 2800 for determining authorship of suggestions. In an example, the method 2800 is performed in whole or in part by a content editor or an application (or operating system) that provides the content editor. The method 2800 can begin with operation 2802.

Operation 2802 includes receiving, at a content editor, first edits to content from a first author. In an example, first author is a human and the first edits are manual edits. The content editor can be a text editor and the content can include text content. Following operation 2802, the flow of the method 2800 can move to operation 2804.

Operation 2804 includes determining, with a second author, a first suggestion based on the first edits. In an example, determining the suggestion can include providing a context (e.g., a region around a cursor or an area that the first author is editing) to a suggestion engine and receiving an output from the suggestion engine. In an example, the suggestion engine is a large language model, artificial author, spell check system, next-word(s) predictor model, other suggestion engines, or combinations thereof. Following operation 2804, the flow of the method 2800 can move to operation 2806.

Operation 2806 includes providing, to the first author, the first suggestion. For example, providing the first suggestion can include providing the first suggestion past a current position of a cursor in a user interface of the content editor such that the first author can see the first suggestion. Following operation 2806, the flow of the method 2800 can move to operation 2808.

Operation 2808 includes receiving, from the first author, acceptance of the first suggestion. In an example, receiving the acceptance includes receiving an edit from the first author that matches the first suggestion. The matching can be verbatim or having an amount of similarity that passes a threshold. Following operation 2808, the flow of the method 2800 can move to operation 2810.

Operation 2810 includes modifying a region of the content based on the first suggestion.

In some examples, following operation 2810, the flow of the method 2800 can move to operation 2812. Although shown as occurring after operation 2810, operations 2812-2820 need not actually occur temporally later. For instance, the second suggestion and associated operations can occur temporally before the first suggestion is made.

Operation 2812 includes receiving second edits to content from the first author. Where the first author is a human, the second edits can be manual edits. Following operation 2812, the flow of the method 2800 can move to operation 2814.

Operation 2814 includes determining, with the second author, a second suggestion based on the second manual edits. Following operation 2814, the flow of the method 2800 can move to operation 2816.

Operation 2816 includes providing the second suggestion. In an example, the providing is performed in a same or similar way as the first suggestion was provided. Following operation 2816, the flow of the method 2800 can move to operation 2818.

Operation 2818 includes receiving, from the first author, a rejection of the second suggestion. In an example, receiving the rejection includes receiving user input that rejects the suggestion. In an example, receiving the rejection includes receiving an edit from the first author that does not match the second suggestion. In an example, responsive to receiving the rejection, the content editor ceases providing the second suggestion. Following operation 2818, the flow of the method 2800 can move to operation 2820.

Operation 2820 includes retaining suggestion data regarding the first suggestion and the second suggestion even after receiving the rejection of the second suggestion. The suggestion data can include the first suggestion and the second suggestion (e.g., the actual content of the suggestion). In some examples, the suggestion data includes statistical data regarding the first suggestion and the second suggestion without including the first suggestion and the second suggestion (e.g., without including the actual content of the suggestions). The statistical data can include, for example, an indication of an amount of suggestions accepted versus rejected (e.g., an acceptance rate, a rejection rate, a number of suggestions accepted, a number of suggestions accepted relative to those rejection, an amount of suggestions relative to an amount of the content). Following operation 2820, the flow of the method 2800 can move to operation 2822.

Operation 2822 includes determining authorship of the region modified by the first suggestion of the second author based on the suggestion data. For instance, this can include determining that the first author or the second author has authorship of the region. In some examples, determining the authorship of the region includes determining that both the first author and the second author authored the region. In some examples, the different authors can have different kinds of authorship. In an example, the second author can have content authorship (e.g., the second author wrote the content) and the first author has selection and arrangement authorship (e.g., the first author selected and arranged the content of the region or a higher-level region that includes the region).

In some examples, the method 2800 further includes applying an authorship token to the region based on the determined authorship.

In some examples, the method 2800 further includes receiving user input to at least partially remove authorship by the first author and modifying the content responsive to the user input. Modifying the content includes applying the second suggestion to the content. For instance, the actual second suggestion can be stored and then applied. Modifying the content includes: generating an ersatz second suggestion based on the suggestion data; and applying the ersatz second suggestion to the content. For instance, the second suggestion that was actually made may not have been saved but the information about it that was saved (e.g., a size of the suggestion, a type of the suggestion, a location of the suggestion, a context of the suggestion, other information, or combinations thereof). That stored information can be used to create an imitation second suggestion (e.g., using the second author) that may not be completely accurate but sufficient to remove at least some of the authorship of the first author from the content (e.g., to remove selection and arrangement authorship of the first author). Thus, the ersatz second suggestion can be different from the actual second suggestion but based on statistical data regarding the second suggestion.

In some examples, the method 2800 includes determining a significance of the first suggestion. Determining the authorship of the region modified by the first suggestion can be based on the significance.

Authorship in Discussions

Techniques described herein can be used to attribute authorship even outside of the traditional authorship context. For instance, techniques herein can be used to ascribe authorship or credit (also including inventorship) to ideas presented during a meeting. An artificial intelligence bot or service may listen to a meeting, make a transcript, and summarize the meeting. The techniques provided herein to determine authorship (e.g., significance, origin, etc.) can be applicable in this context as well. For instance, the meeting's transcript can be analyzed, ideas within the transcript can be identified and tied to the person in the meeting that made such a suggestion. Further, additions to those ideas can be tracked within the meeting based on the significance analysis above or using other techniques. Thus, the flow of ideas in a meeting and how different "authors" contributed to them can be analyzed and detrained. A report can be created providing credit to the authors of the ideas.

In some example implementations, aspects described above in relation to FIGS. 7A and 7B can be applied here.

For instance, the content and conversation history can be a transcript or other account of a discussion among humans (e.g., rather than a human and a chatbot). The same or similar techniques can be used to identify concepts that arose out of the account and who is the author (or who should be credited) for those concepts. Likewise, aspects described in this section can be applied elsewhere herein including with respect to FIGS. 7A and 7B.

Visualization can be applied to contributions in meetings to show the origin of concepts in the meeting. A graph data structure having nodes can be created showing how a germ of an idea is provided and then expanded on and by whom. The system can classify different participants based on their collaboration style. For instance, one person may tend to originate ideas. Another person may tend to expand on ideas. A further person may tend to shoot-down ideas (e.g., relatively little development of an idea after that person comments on it). Such a discussion can facilitate selection and arrangement of content and can demonstrate human inventorship (e.g., for providing as part of a patent application).

FIG. 29 illustrates an example method 2900 for allocating tokens with respect to a discussion. In an example, the method 2900 begins with operation 2902.

Operation 2902 includes hosting a discussion with a team collaboration application. The discussion can have a plurality of participants. In an example, each respective participant connects to the hosted discussion using a respective team collaboration application running on a respective computer. Example team collaboration applications include applications such as TEAMS by MICROSOFT, ZOOM by ZOOM VIDEO COMMUNICATIONS, GOOGLE HANGOUTS by GOOGLE, SLACK by SLACK TECHNOLOGIES, DISCORD by DISCORD, and JITSI by 8×8. An artificial intelligence meeting assistant is present in the discussion. Example traditional artificial intelligence meeting assistants include OTTER.AI and meeting AI features of GPT-4o by OPENAI. Artificial intelligence meeting assistants can be modified to include features described herein to improve their ability to function. Following operation 2902, the flow of the method can move to operation 2904. One or more subsequent operations can be performed by or with the assistance of the artificial intelligence meeting assistant or an associated process.

Operation 2904 includes creating an account of the discussion among a plurality of participants including a first participant and a second participant. In an example, the account is a transcript of the discussion. The discussion can be a meeting occurring over a videotelephony feature of the team collaboration application. In some examples, the account can include not only a transcript but also screenshots or a video of visual content provided during the meeting. In some examples, a presentation (e.g., a POWERPOINT presentation) that is given during the discussion can be used in the authorship or credit determination process described in this section. Following operation 2904, the flow of the method 2900 can move to operation 2906.

Operation 2906 can include determining that a first portion of the account satisfies a threshold of significance with respect to one or more prior portions of the account of the discussion. The first portion of the account can be a phrase, sentence, line, or monologue. In some examples, the first portion is a concept that is explicitly stated or inferred or summarized based on what was stated. The first portion can have or be associated with one or more first speaker tokens. A speaker token can be a token that indicates who spoke that portion of the account. For instance, where the account is a transcript, the speaker token may be text that identifies who is speaking. For the Gettysburg address, the speaker token may be "LINCOLN:" and the account may be "LINCOLN: Four score and seven years ago . . . ". Speaker tokens can take any of a variety of forms, including those described elsewhere in the context of authorship tokens (albeit modi-fied to reflect a speaker). In an example, the significance is determined based on a distance in an embedding space. For instance, how far concepts or words that a person speaks are from what someone else spoke when represented in the embedding space.

In an example, this operation 2906 can include determin-ing that the first portion satisfies a threshold of significance includes determining that the first portion has more than a predetermined threshold number of characters or words different from the prior portion or determining that the first portion has more than a predetermined threshold percentage of characters or words different from the prior portion. Determining that the first portion satisfies a threshold of significance can include calculating a significance score and determining that the significance score satisfies a predeter-mined threshold.

In an example, the prior portion is determined by selecting each previous portion of the discussion in the account, and operation 2906 can be repeated for each respective previous portion. Following operation 2906, the flow of the method 2900 can move to operation 2908.

Operation 2908 includes, responsive to determining that the first portion of the account satisfies the threshold of significance, applying a first authorship token to the first portion that credits the first participant with contributing the portion of the account. Following operation 2908, the flow of the method 2900 can move to operation 2910.

Operation 2910 includes determining that the second portion of the account having second speaker token indicat-ing that the second portion was spoken by a second partici-pant fails to satisfy the threshold of significance with respect to one or more prior portions of the account of the discus-sion, including the first portion. Following operation 2910, the flow of the method 2900 can move to operation 2912.

Operation 2912 includes responsive to determining that the portion of the account fails to satisfy the threshold of significance, applying a second authorship token to the second portion that credits a participant other than the second participant with contributing the second portion of the account of the discussion. Following operation 2912, the flow of the method can move to operation 2914.

Operation 2914 includes storing the account with the first and second speaker tokens and the first and second author-ship tokens. Following operation 2914, the flow of the method 2900 can move to operation 2916.

Operation 2916 includes receiving, over a user interface, a concept. Following operation 2916, the flow of the method 2900 can move to operation 2918.

Operation 2918 includes determining, using the stored account, one or more of the participants that contributed to the concept based on authorship tokens.

In an example, the method 2900 can further include generating a graph data structure having a concept node representing the concept and a plurality of additional nodes upstream or downstream of the concept node and represent-ing influences on the concept by different participants to the discussion. A visual representation of the graph data struc-ture can be provided, such as to improve the ability of the computing performing the method to interact with a user.

In an example, the method 2900 can further include determining a collaboration style of the first participant based on authorship tokens and speaker tokens associated with the first participant. Such a determination can be based on the authorship tokens occurs during the discussion. In an example, the method 2900 further includes generating a representation of a flow of ideas in the discussion and how the participants contributed to the idea.

Figure 30:
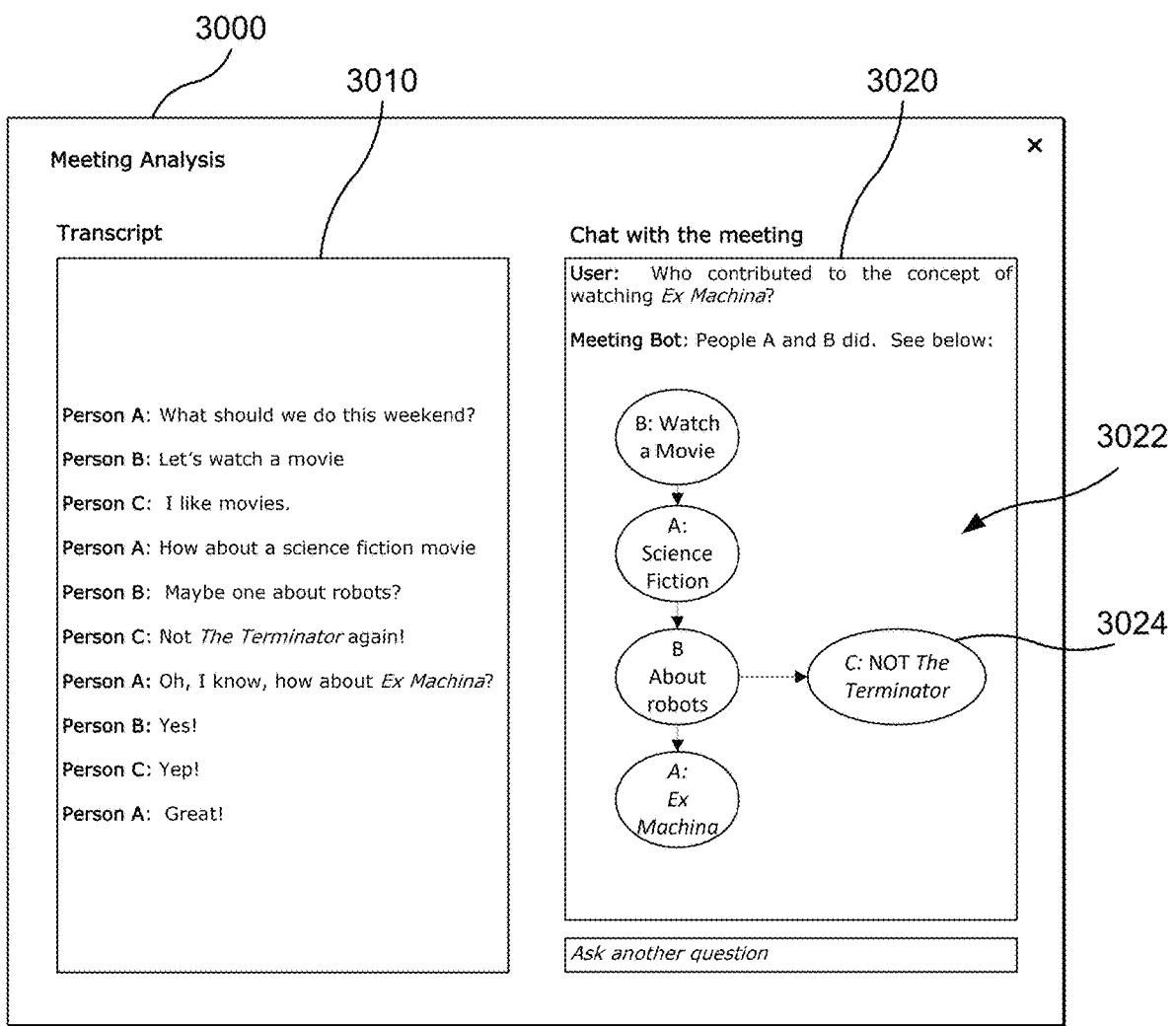
FIG. 30 illustrates an example user interface for meeting analysis.

FIG. 30 illustrates an example user interface 3000 for meeting analysis. The user interface includes a transcript 3010 of a meeting between three people. The user interface 3000 further includes a chat function element 3020 by which a user can interact with a chat bot to understand more about the meeting. As illustrated, the user asked which participant contributed to a particular concept. The chat bot provides an answer (e.g., based at least in part on the method 2900) that includes a graph data structure 3022 having nodes 3024 that describe which participant contributed to which aspect of concept.

Attestation

In some instances, it may be desirable to apply tokens, in addition to or instead of authorship tokens, that indicate a person responsible for content of a section. In addition or instead, an organization may prohibit artificially authored content unless a human personally takes responsibility for the content (e.g., that the human personally reviewed the artificial content). Thus, there may be a token that attests to such responsibility.

In some instances, there can be attestation that a portion of the content really does have human authorship notwith-standing a concurrent or prior indication of artificial author-ship. For instance, the user may believe that the artificial authorship was incorrectly applied.

In an example, there is a method that includes determining that an artificial intelligence authored an edit to content; determining that the edit satisfies a threshold of significance; providing an artificial authorship token in association with the region, the human authorship token having a predeter-mined form indicating that a human rather than an artificial intelligence is the author of the region of content; receiving an attestation from a user; and applying an attestation token to the region.

The method can further include, responsive to receiving the attestation, replacing the artificial authorship token with a human authorship token. The attestation can indicate that, notwithstanding the artificial authorship of the region, a human authored the region. The attestation can indicate that, notwithstanding the artificial authorship of the region, a human has responsibility for the region. For example, that the human personally reviewed the region and vouches for it, stands behind it, or otherwise has responsibility for it. The attestation token can specifically identify the human. The attestation token can, in some implementations, replace the authorship token.

In an example, there is a computer-implemented method comprising: opening a file with a content editor, wherein during creating the file, determining that artificial authorship of content of the file is prohibited; responsive to the deter-mining, disabling a first set of artificial intelligence features of the content editor; and applying a human authorship token indicating that content of the file is authored by a human rather than an artificial intelligence. Opening the file can include creating the file. The method can include, enabling a second set of artificial intelligence features of the content editor. The human authorship token can indicate that artifi-cial authorship of content in the file is prohibited. The method can further include saving the file in a manner that resists unsupported content editors editing the file while preserving the human authorship token. The method can further include prohibiting saving of the file if the file contains any artificial authorship token.

Event Tracking

In some examples, events (and statistics regarding such events) during content creation are tracked and use to determine, establish, or evidence authorship. Events can take any of a variety of forms and can include events like keystrokes, mouse movements, screen taps, navigation between apps, copying-and-pasting, audio events, visual events, unit tests, executions, errors, locations visited (e.g., websites or other applications), artificial intelligence prompts used, computing resources consumed (e.g., CPU, GPU, networking, or other resources), other events, or combinations thereof. Further, aspects of such events can be determined, including event metadata (e.g., time stamps associated with events). In an example, a typing speed is tracked during content creation, and it is determined whether the typing speed is appropriate for the amount of content generated in a given amount of time. In addition or instead, it can be determined whether the typing speed is appropriate or typical for the purported user. In some examples, at a predetermined frequency (e.g., every n minutes) or in response to a predetermined event, content that was entered (or characteristics thereof) is written to a blockchain or another auditable record, so authorship can be validated.

Figure 31:
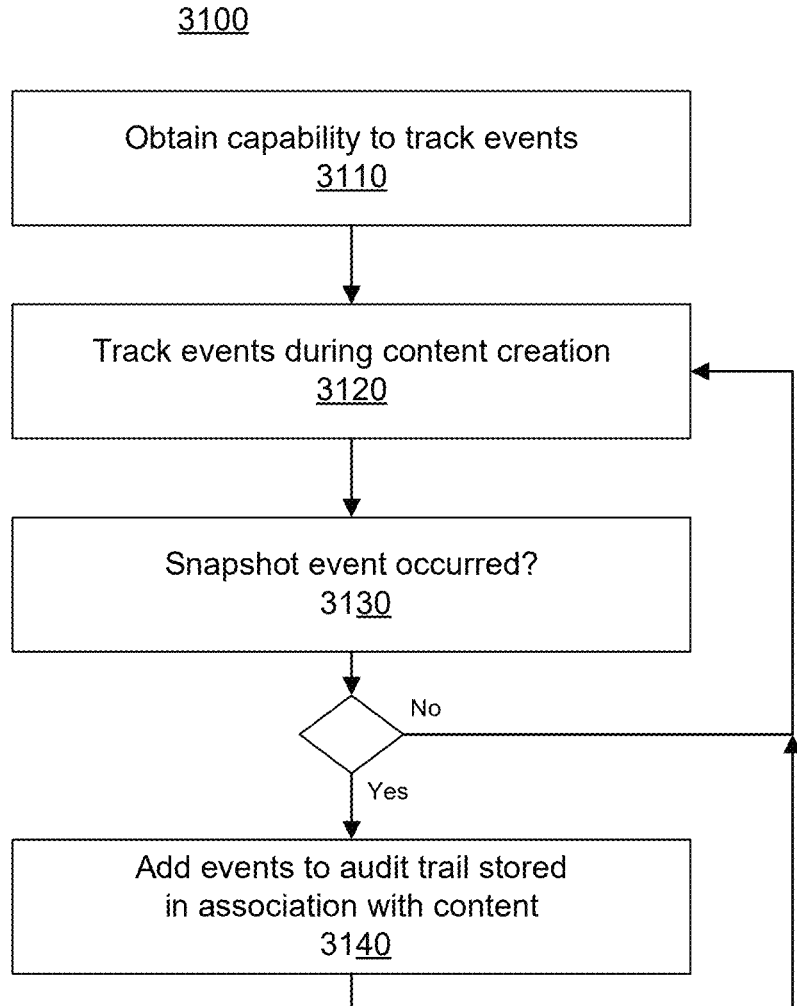
FIG. 31 illustrates an example method related to the tracking of events associated with the editing of content in a content editor to form an audit trail for the content.

FIG. 31 illustrates an example method 3100. The method 3100 is related to the tracking of events associated with the editing of content in a content editor to form an audit trail for the content. The audit trail can be used to apply authorship tokens, as evidence to support existing authorship tokens, to convert temporary authorship tokens, or for other purposes. The method 3100 can begin with operation 3110.

Operation 3110 includes obtaining a capability to track events. For example, this can include requesting the ability from an operating system, browser, user, or another to track events associated with the creation of content. This can include or result in the operating system or an application obtaining permission from a user for such capability if that permission had not yet been obtained. Following operation 3110, the flow of the method 3100 can move to operation 3120.

Operation 3120 includes tracking events during content creation, including those described above. Tracking the events can include detecting the occurrence of an event, determining characteristics of the event (e.g., not just whether a keystroke occurred, but which key was pressed at which time in which application and for how long) and storing such information in memory (e.g., transitory or non-transitory memory). Such information can be obtained in any of a variety of ways depending on the content editor and the device on which it runs. Many operating systems and applications (e.g., web browsers) provide APIs or other systems for monitoring such events. The permission obtained in operation 3110 can be used to obtain the event information.

Operation 3130 includes determining whether a snapshot event occurred. A snapshot event can be an event that, when its occurrence is detected, causes data is added to an audit trail based on the tracked events. The snapshot event can take any of a variety of forms, such as saving, uploading, detecting a change in focus, detecting a change to a different region, detecting that the edit reaches a level of significance, detecting that a timer has expired, detecting a code action (e.g., executing or compiling code), other snapshot events, or combinations thereof.

If the snapshot event has not occurred, then the flow of the method 3100 can return to operation 3120. If the snapshot event has occurred, then the flow of the method 3100 can move to operation 3140.

Operation 3140 includes adding the tracked events to an audit trail stored in association with the content. In an example, the audit trail is a data structure configured to store information about events during editing of the content. In some examples, the audit trail is configured to resist tampering, such as by being constructed using a blockchain data structure or a Merkle tree. The audit trail can be stored in a same file as the content or in a file associated with the file storing the content.

In some examples, the audit trail is stored in a way to facilitate later playback by the author or a reviewer of the content. In some examples, the reviewer can replay content, events, snapshots of events, other delineations of content, or combinations thereof.

Post Hoc Analysis

While many examples herein are focused on applying authorship tokens during the creation of content, authorship of the content can be determined after the content has already been generated. In some examples, an analyzer analyzes content to determine whether the content complies with authorship requirements. For instance, there may be an organizational or personal policy to have every region of content labeled with an authorship token. For some content, there may be gaps where authorship is unknown or not sufficiently known. In some instances, post hoc determinations of authorship can be applied to those regions. In other examples, post hoc determinations can be applied to content notwithstanding existing authorship tokens (e.g., to assess the reliability or accuracy of such tokens). In some examples, an artificial intelligence is trained to determine authorship or to evaluate applied authorship tokens.

Post Hoc Analysis: Mock Content

In some examples, content can be analyzed after an editing session that produced the content. In an example, content was produced during an editing session at a first time and the content is reviewed during a review session at a second time, where the second time is after the first time. In some examples, the second time is at least an hour, day, week, month, or another period of time after the first time. The content can be created as part of an edit session by a first set of one or more human or artificial users, and the review session can be performed by a second set of one or more human or artificial users different from the first. In addition or instead, the review session can be performed as part of an automated software process.

FIG. 32 illustrates an example method α00 for estimating authorship of initial content 3202. The method 3200 begins with operation 3210.

Operation 3210 includes receiving the initial content 3202. The initial content 3202 can be received over any of a variety of channels and using any of a variety of techniques. In some examples, after the initial content is received, a data store (e.g., the Internet or a private data repository of an organization) is searched to determine whether sufficiently similar content exists there. In some instances, it is feasible to store all content generated by an artificial author of an individual or an organization in a datastore. Later, to determine whether content has artificial authorship or human authorship, the initial content can be compared with the content in the datastore. A sufficiently similar piece of content in the data store can be compared and the difference between them can be identified as having human authorship. If so, an authorship token corresponding to that source is applied so long as the information is sufficiently unique. If not or instead, following operation 3210, the flow of the method 3200 can move to operation 3220.

Operation 3220 includes generating a prompt 3222 based on the initial content 3202. In an example, this includes providing the initial content 3202 as input into an artificial intelligence (e.g., a large language model) trained or prompted to produce a prompt 3222 based on the initial content 3202. For instance, the initial content 3202 may be an academic paper about a given topic and the resulting prompt 3222 can be "write content in the style of an academic paper on the given topic". In some examples, the system prompt for an AI is updated such that content produced by the AI automatically includes a header and footer indicating that it is AI generated or otherwise already includes one or more authorship tokens.

In an example, the prompt 3222 is generated by first extracting features, key words, themes, or other characteristics of the content 3202. A template can be used to put such characteristics into a prompt 3222. The prompt 3222 can include an outline or process for generating content.

In some examples, the prompt 3222 is not configured to regenerate the initial content 3202 directly. Rather, the prompt 3222 can be selected, generated, or otherwise configured to represent or mimic what a user that wanted to use AI to generate content would have provided as a prompt to the AI.

Following operation 3220, the flow of the method 3200 can move to operation 3230.

Operation 3230 includes selecting a set of generators. Each generator of the set of generators can be an artificial intelligence that, given an input prompt, produces an output based on the prompt. In some examples, the operation 3230 includes selecting generators based on the, type of the content 3202. For instance, where the content 3202 is text content, generators of text content can be selected and other generators can be excluded (e.g., image, video, or audio generators). In some instances, the content may be the product of multiple generators (e.g., audio content may be produced by a text generator to produce a script and an audio generator to produce audio content based on the script).

In some examples, the set of generators is selected based on the content 3202, such as characteristics of the content 3202 and whether a generator is more or less likely to be able to generate output similar to the content 3202. In addition or instead, the set of generators is selected in part based on the prompt 3222. In some examples, an artificial intelligence is trained and used to select one or more of the generators.

In some examples, the pool of possible generators from which the set is selected is expanded as new generators become available. In some examples, the pool of generators includes variations of generators. For instance, there may be multiple different versions of a same generator but having different temperature settings, system prompts, or other settings.

In some examples, the generators can be selected based a likelihood that the generator was used to produce the content. For instance, the selection can exclude generators (or versions of generators) that were not available or not widely available at the time the content was produced (or believed to have been produced). The selection can exclude generators that would have consumed more than a threshold amount of compute resources.

Following operation 3230, the flow of the method 3200 can move to operation 3240.

Operation 3240 includes, for each respective generator of the set of selected generators, generating new content 3242 with the respective generator using the prompt 3222. For instance, the prompt 3222 can be provided as input to the respective generator and new content 3242 can be produced as the output of the respective generator. Following operation 3240, the flow of the method 3200 can move to operation 3250.

Operation 3250 includes comparing the new content 3242 with the initial content 3202. This can be performed using any of a variety of comparison techniques, such as comparing a distance between the content in embedding space. Techniques such as edit distance (e.g., Hamming distance, Levenshtein distance, other techniques, or combinations thereof) can be used.

Operation 3260 includes estimating the authorship of the initial content using the comparison. For instance, if the comparison indicates that at least one of the new content 3242 is sufficiently similar to the initial content 3202, then it can be estimated that the initial content 3202 has AI authorship. Otherwise, it can be determined that the initial content 3202 is human authored. In some examples, the estimated authorship can be used in applying an authorship to the initial content 3202. In some examples, the authorship tokens applied can include an indication that they are generated based on a post hoc analysis rather than having been generated at the time the content was generated.

In some examples, the authorship can be determined based on a set of new content 3242 produced by multiple different generators. For instance, if the initial content 3202 is sufficiently similar to one generator and sufficiently different from the rest of the multiple different generators, then it can be determined that the one generator was used to produce the initial content 3202. But if the initial content 3202 is sufficient similar to multiple generators, then it may be determined that each of the multiple generators is equally responsible for the initial content 3202 or that the initial content 3202 is sufficiently generic that it either lacks artificial authorship or that it has default authorship (e.g., human or artificial authorship depending on relevant preferences).

Where implementations involve personal or corporate data, that data can be stored in a manner consistent with relevant laws and with a defined privacy policy. In certain circumstances, the data can be decentralized, anonymized, or fuzzed to reduce the amount of accurate private data that is stored or accessible at a particular computer. The data can be stored in accordance with a classification system that reflects the level of sensitivity of the data and that encourages human or computer handlers to treat the data with a commensurate level of care.

Where implementations involve machine learning, machine learning can be used according to a defined machine learning policy. The policy can encourage training of a machine learning model with a diverse set of training data. Further, the policy can encourage testing for and correcting undesirable bias embodied in the machine learning model. The machine learning model can further be aligned such that the machine learning model tends to produce output consistent with a predetermined morality. Where machine learning models are used in relation to a process that makes decisions affecting individuals, the machine learning model can be configured to be explainable such that the reasons behind the decision can be known or determinable. The machine learning model can be trained or configured to avoid making decisions based on protected characteristics.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims. While various factors are described as weighing in favor of or against certain findings of authorship, a person of skill in the art will recognize that the various factors and weightings described herein can be applied in any of a variety of ways (and with any of a variety of different weightings themselves) to achieve a desired outcome.

What is claimed is:

1. A method comprising:
obtaining event tracking capability regarding a device;
during an editing session in which a user is editing content using a content editor running at least in part on the device:
tracking events associated with the device;
detecting an occurrence of a snapshot event;
responsive to detecting the occurrence of the snapshot event, adding data to an audit trail associated with the content, the data being regarding the events; and
after the editing session, using one or both of the events and the audit trail to ensure that an authorship token is associated with the content, wherein the authorship token includes a first form indicating that a portion of the content has human rather than artificial authorship or a second form indicating that the portion of the content has artificial rather than human authorship.

2. The method of claim 1, wherein obtaining event tracking capability regarding the device includes:
determining that permission has not yet been obtained; and
obtaining permission from the user for the event tracking capability.

3. The method of claim 1, wherein tracking the events associated with the device include:
detecting occurrence of an event;
determining characteristics of the event; and
storing information about the event in memory of the device.

4. The method of claim 1, wherein tracking the events includes using one or more application programming interfaces of an operating system of the device or the content editor to perform tracking.

5. The method of claim 1, wherein the snapshot event is an event selected from a group consisting of: a save event, an upload event, a timer expiration event, a code execution event, and a code compilation event.

6. The method of claim 1, wherein the audit trail is configured to resist tampering.

7. The method of claim 6, wherein the audit trail is configured to resist tampering by being stored as part of a blockchain data structure or a Merkle tree data structure.

8. The method of claim 1, further comprising replaying events based on the audit trail.

9. The method of claim 1, further comprising:
sending a communication to a server or calling an application programming interface associated with a server regarding an edit, an event, or at least one authorship token.

10. The method of claim 1, wherein the events include at least one event associated with the content editor and at least one event that is not associated with the content editor.

11. A system comprising:
one or more processors; and
memory storing instructions that, when executed by the one or more processors, cause the system to perform operations comprising:
obtaining event tracking capability regarding a device;
during an editing session in which a user is editing content using a content editor running at least in part on the device:
tracking events associated with the device;
detecting an occurrence of a snapshot event; and
responsive to detecting the occurrence of the snapshot event, adding data to an audit trail associated with the content, the data being regarding the events; and
after the editing session, using one or both of the events and the audit trail to ensure that an authorship token is associated with the content, wherein the authorship token includes a first form indicating that a portion of the content has human rather than artificial authorship or a second form indicating that the portion of the content has artificial rather than human authorship.

12. The system of claim 11, wherein the memory includes random-access memory, read only memory, cache memory, registers, portable memory, mass storage devices, hard drives, solid state drives, or combinations thereof.

13. The system of claim 11, wherein the one or more processors include at least one of: central processing units, graphics processing units, coprocessors, tensor processing units, artificial intelligence accelerators, microcontrollers, microprocessors, application-specific integrated circuits, or field programmable gate arrays.

14. The system of claim 11, wherein the audit trail is stored in a blockchain data structure.

15. The system of claim 11, wherein the operations further comprise replaying events based on the audit trail.

16. A non-transitory computer-readable storage medium storing instructions that, when executed by one or more processors, cause the one or more processors to perform operations comprising:
obtaining event tracking capability regarding a device;
during an editing session in which a user is editing content using a content editor running at least in part on the device:
tracking events associated with the device;
detecting an occurrence of a snapshot event; and
responsive to detecting the occurrence of the snapshot event, adding data to an audit trail associated with the content, the data being regarding the events; and
after the editing session, using one or both of the events and the audit trail to ensure that an authorship token is associated with the content, wherein the authorship token includes a first form indicating that a portion of the content has human rather than artificial authorship or a second form indicating that the portion of the content has artificial rather than human authorship.

17. The non-transitory computer-readable storage medium of claim 16, wherein the snapshot event comprises at least one of: a save event, an upload event, a timer expiration event, a code execution event, or a code compilation event.

18. The non-transitory computer-readable storage medium of claim 16, wherein the operations further comprise sending a communication to a server or calling an application programming interface associated with a server regarding an edit, an event, or at least one authorship token.

19. The non-transitory computer-readable storage medium of claim 16, wherein the operations further comprise storing the audit trail in a distributed ledger.

20. The non-transitory computer-readable storage medium of claim 16, wherein tracking the events includes using one or more application programming interfaces of an operating system of the device or the content editor to perform tracking.

\* \* \* \* \*